US011590751B2

United States Patent
Hirano et al.

(10) Patent No.: US 11,590,751 B2
(45) Date of Patent: *Feb. 28, 2023

(54) LITHOGRAPHIC PRINTING PLATE PRECURSOR, METHOD FOR PRODUCING LITHOGRAPHIC PRINTING PLATE, POLYMER PARTICLE, AND COMPOSITION

(71) Applicant: FUJIFILM Corporation, Tokyo (JP)

(72) Inventors: Shuji Hirano, Shizuoka (JP); Atsuyasu Nozaki, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 70 days.

This patent is subject to a terminal disclaimer.

(21) Appl. No.: 16/695,206

(22) Filed: Nov. 26, 2019

(65) Prior Publication Data

US 2020/0094542 A1 Mar. 26, 2020

Related U.S. Application Data

(63) Continuation of application No. PCT/JP2018/017814, filed on May 8, 2018.

(30) Foreign Application Priority Data

May 31, 2017 (JP) .............................. JP2017-108002
Oct. 31, 2017 (JP) .............................. JP2017-210126

(51) Int. Cl.
B41C 1/10 (2006.01)

(52) U.S. Cl.
CPC .......... *B41C 1/1025* (2013.01); *B41C 1/1016* (2013.01); *B41C 2201/02* (2013.01); *B41C 2201/14* (2013.01); *B41C 2210/08* (2013.01); *B41C 2210/20* (2013.01); *B41C 2210/24* (2013.01)

(58) Field of Classification Search
CPC .................................................. B41C 1/1025
See application file for complete search history.

(56) References Cited

U.S. PATENT DOCUMENTS

| | | | |
|---|---|---|---|
| 6,582,882 | B2 | 6/2003 | Pappas et al. |
| 8,603,729 | B2 | 12/2013 | Suzuki et al. |
| 9,535,323 | B2 | 1/2017 | Takanashi |
| 10,048,588 | B2 | 8/2018 | Takanashi |
| 10,166,755 | B2 | 1/2019 | Wariishi |
| 10,241,400 | B2 | 3/2019 | Mizuno et al. |
| 2003/0104307 | A1* | 6/2003 | Shimazu ............... B41C 1/1016 430/156 |
| 2004/0175652 | A1 | 9/2004 | Sanada et al. |
| 2006/0199097 | A1* | 9/2006 | Oda ...................... B41C 1/1016 430/270.1 |
| 2008/0171286 | A1* | 7/2008 | Nguyen ............... C09D 133/14 430/270.1 |
| 2008/0229955 | A1 | 9/2008 | Yu |
| 2008/0233516 | A1 | 9/2008 | Iwai et al. |
| 2011/0053085 | A1 | 3/2011 | Huang et al. |
| 2012/0202152 | A1* | 8/2012 | Sonokawa ............ G03F 7/0388 430/273.1 |
| 2016/0339730 | A1 | 11/2016 | Wariishi et al. |
| 2016/0361914 | A1* | 12/2016 | Wariishi ................ B41C 1/1075 |
| 2017/0123315 | A1* | 5/2017 | Mizuno ................ B41M 5/3333 |
| 2018/0354290 | A1 | 12/2018 | Wariishi et al. |
| 2018/0356730 | A1* | 12/2018 | Inasaki .................... G03F 7/168 |
| 2019/0344556 | A1* | 11/2019 | Wariishi .................. G03F 7/322 |

FOREIGN PATENT DOCUMENTS

| | | |
|---|---|---|
| CN | 1705570 | 12/2005 |
| CN | 102442049 | 5/2012 |
| CN | 103068583 | 4/2013 |
| CN | 104684735 | 6/2015 |
| CN | 105960335 | 9/2016 |
| CN | 106715139 | 5/2017 |
| EP | 1674928 | 6/2006 |
| EP | 2236291 | 10/2010 |
| EP | 2363748 | 9/2011 |
| EP | 2610067 | 7/2013 |
| EP | 2660068 | 11/2013 |
| JP | 2003025750 | 7/2001 |
| JP | 2003025750 A * | 1/2003 |
| JP | 2004126047 | 4/2004 |
| JP | 2004525420 | 8/2004 |
| JP | 2006181838 | 7/2006 |
| JP | 2008230207 | 10/2008 |
| JP | 2010501650 | 1/2010 |
| JP | 2011161872 | 8/2011 |
| JP | 2012071590 | 4/2012 |
| JP | 2013503365 | 1/2013 |
| JP | 2015178581 | 10/2015 |
| WO | 2016027886 | 2/2016 |

OTHER PUBLICATIONS

English Machine Translation of JP-2003025750-A (Year: 2021).*
Office Action of Japan Counterpart Application, with English translation thereof, dated Dec. 22, 2020, pp. 1-6.
"Search Report of Europe Counterpart Application", dated May 18, 2020, pp. 1-8.
"International Search Report (Form PCT/ISA/210) of PCTIJP2018/017814", dated Jul. 24, 2018, with English translation thereof, pp. 1-5.
"Written Opinion of the International Searching Authority (Form PCT/ISA/237) of PCT/JP2018/017814", dated Jul. 24, 2018, with English translation thereof, pp. 1-19.
"Office Action of China Counterpart Application", dated Oct. 26, 2020, with English translation thereof, pp. 1-16.

(Continued)

*Primary Examiner* — Chanceity N Robinson
(74) *Attorney, Agent, or Firm* — JCIPRNET

(57) ABSTRACT

A lithographic printing plate precursor has an image-recording layer on a hydrophilic support, wherein the image-recording layer includes a polymer particle including an addition polymerization resin having a hydrophilic structure and a crosslinking structure. A method for producing a lithographic printing plate uses the lithographic printing plate precursor. A polymer particle includes an addition polymerization resin having a hydrophilic structure and a crosslinking structure. A composition includes the polymer particle.

16 Claims, No Drawings

(56) References Cited

OTHER PUBLICATIONS

"Office Action of China Counterpart Application" with English translation thereof, dated Jun. 10, 2021, p. 1-p. 15.
"Office Action of Europe Counterpart Application", dated May 4, 2022, pp. 1-6.

* cited by examiner

LITHOGRAPHIC PRINTING PLATE PRECURSOR, METHOD FOR PRODUCING LITHOGRAPHIC PRINTING PLATE, POLYMER PARTICLE, AND COMPOSITION

CROSS-REFERENCE TO RELATED APPLICATIONS

This application is a Continuation of International Application No. PCT/JP2018/017814 filed on May 8, 2018, which claims priority to Japanese Patent Application No. 2017-108002 filed on May 31, 2017 and Japanese Patent Application No. 2017-210126 filed on Oct. 31, 2017. The entire contents of these applications are incorporated herein by reference.

BACKGROUND OF THE INVENTION

1. Field of the Invention

The present disclosure relates to a lithographic printing plate precursor, a method for producing a lithographic printing plate, a polymer particle, and a composition.

2. Description of the Related Art

Generally, a lithographic printing plate consists of a lipophilic image area that receives ink in a printing process and a hydrophilic non-image area that receives dampening water. Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink is caused on the surface of the lithographic printing plate, the ink is absorbed only in the image area, and then the ink is transferred to a body to be printed such as paper, thereby carrying out printing.

In order to produce this lithographic printing plate, in the related art, a lithographic printing plate precursor (PS plate) formed by providing a lipophilic photosensitive resin layer (image-recording layer) on a hydrophilic support has been broadly used. Generally, a plate is made using a method in which a lithographic printing plate precursor is exposed to light through an original drawing such as a lith film, a portion which is to be an image area of the image-recording layer is left, the other unnecessary portion of the image-recording layer is dissolved and removed using an alkaline developer or an organic solvent, and a hydrophilic surface of a support is exposed, thereby forming a non-image area and a lithographic printing plate is obtained.

In addition, in response to the intensifying interest in the global environment, an environmental issue of waste liquid generated by wet processes such as a development process has gathered more attention.

Regarding the above-described environmental issue, an attempt is made to simplify development or plate production or remove processes. As one of simple production methods, a method called "on-machine development" is being carried out. That is, in the method, after being exposed, a lithographic printing plate precursor is immediately mounted in a printer without being developed as in the related art, and an unnecessary portion of the image-recording layer is removed in an initial phase of an ordinary printing step.

As lithographic printing plate precursors of the related art, lithographic printing plate precursors described in JP2003-025750A and JP2004-525420A are exemplified.

JP2003-025750A describes an image-forming material having an image-forming layer containing at least one kind of thermally fusible polymer particle on a support, in which the polymer particle is an active methylene group-containing polymer latex.

JP2004-525420A describes an image-forming element including a base body; and a thermosensitive image-forming composition that coats a surface of the base body, in which the thermosensitive image-forming composition contains a hydrophobic polymer backbone and a graft copolymer having a plurality of pendant groups represented by Formula

(in the formula, Q is a bifunctional linking group; W is selected from the group consisting of a hydrophilic segment and a hydrophobic segment; Y is selected from the group consisting of a hydrophilic segment and a hydrophobic segment, here, in a case in which W is a hydrophilic segment, Y is selected from the group consisting of a hydrophilic segment and a hydrophobic segment, and, furthermore, in a case in which W is hydrophobic, the Y is a hydrophilic segment).

SUMMARY OF THE INVENTION

As lithographic printing plates, there is a demand for lithographic printing plates being excellent in terms of the number of printable plates (hereinafter, also referred to as "printing resistance").

Particularly, in recent years, as ink for printing, there is a case in which ink that cures by irradiation with ultraviolet (UV) rays (also referred to as "ultraviolet-curable ink") is used.

The ultraviolet-curable ink has the following advantages. The ultraviolet-curable ink can be instantly dried and is thus highly productive, generally contains a small content of a solvent or no solvent and thus easily reduces environmental contamination, and is capable of forming an image without being dried by heat or by being dried by heat for a short period of time and is thus applicable to a broad range of printing subjects.

Therefore, lithographic printing plates capable of providing lithographic printing plates having excellent printing resistance in the case of using the ultraviolet-curable ink are considered to be extremely useful in terms of industries.

The present inventors carried out intensive studies and consequently found that, regarding the lithographic printing plate precursor of JP2003-025750A or JP2004-525420A, there is a problem in that, particularly in the case of using the ultraviolet-curable ink as ink, the printing resistance of a lithographic printing plate to be obtained is not sufficient.

An object that an embodiment of the present invention attempts to attain is to provide a lithographic printing plate precursor from which a lithographic printing plate having excellent printing resistance can be obtained even in the case of using an ultraviolet-curable ink.

In addition, an object that another embodiment of the present invention attempts to attain is to provide a method for producing a lithographic printing plate having excellent printing resistance even in the case of using an ultraviolet-curable ink.

An object that still another embodiment of the present invention attempts to attain is to provide a new polymer particle and a composition including the polymer particle.

Means for achieving the above-described objects includes the following aspects.

<1> A lithographic printing plate precursor comprising: an image-recording layer on a hydrophilic support, in which the image-recording layer includes a polymer particle including an addition polymerization-type resin having a hydrophilic structure and a crosslinking structure.

<2> The lithographic printing plate precursor according to <1>, in which the addition polymerization-type resin has an ionic group or an acid radical as the hydrophilic structure.

<3> The lithographic printing plate precursor according to <1> or <2>, in which the addition polymerization-type resin has a sulfonate group or a sulfonic acid group as the hydrophilic structure.

<4> The lithographic printing plate precursor according to any one of <1> to <3>, in which the addition polymerization-type resin has a polyalkylene oxide structure as the hydrophilic structure.

<5> The lithographic printing plate precursor according to any one of <1> to <4>, in which the addition polymerization-type resin has a group represented by Formula Z as a group having the hydrophilic structure.

$$-Q-W-Y \qquad \text{Formula Z}$$

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure; here, any of W and Y has a hydrophilic structure.

<6> The lithographic printing plate precursor according to any one of <1> to <5>, in which the crosslinking structure includes at least one constituent unit selected from the group consisting of constituent units represented by BR-1 to BR-16.

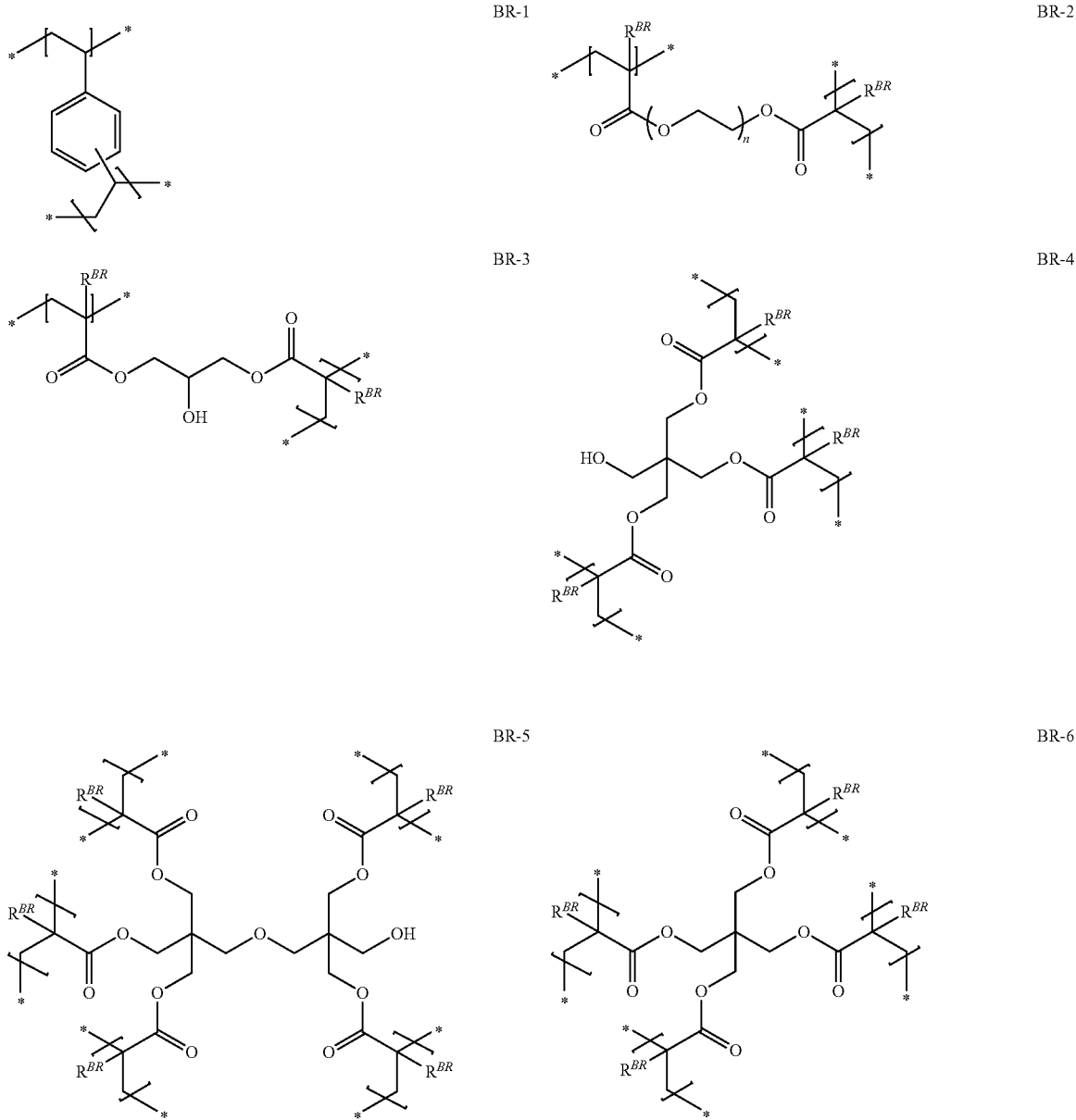

-continued
BR-7
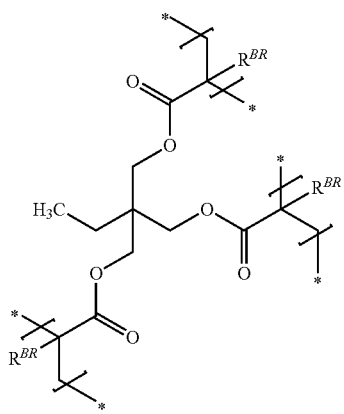
BR-8
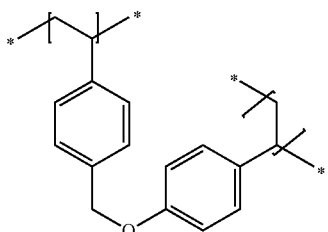
BR-9
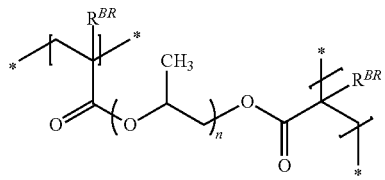
BR-10
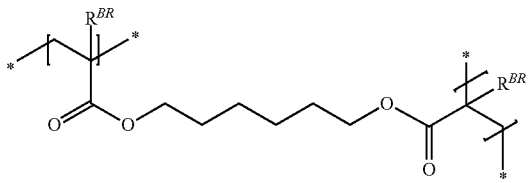
BR-11
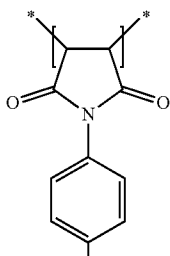
BR-12
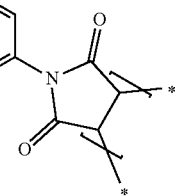
BR-13
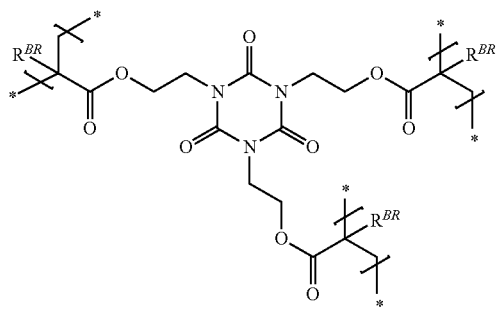

-continued
BR-14
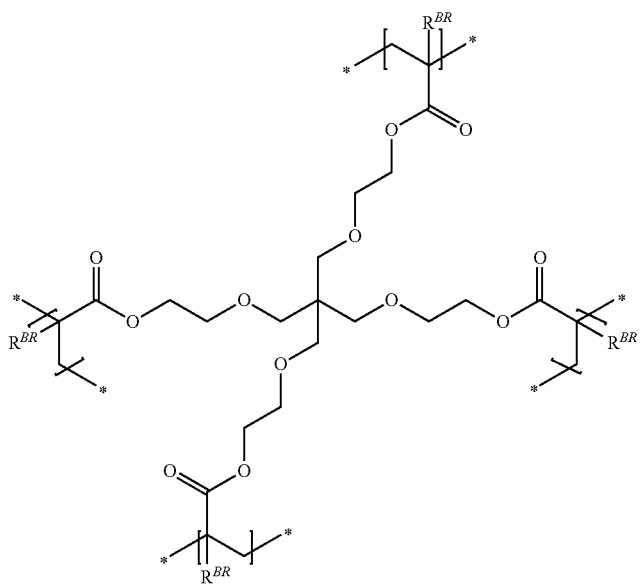
BR-15
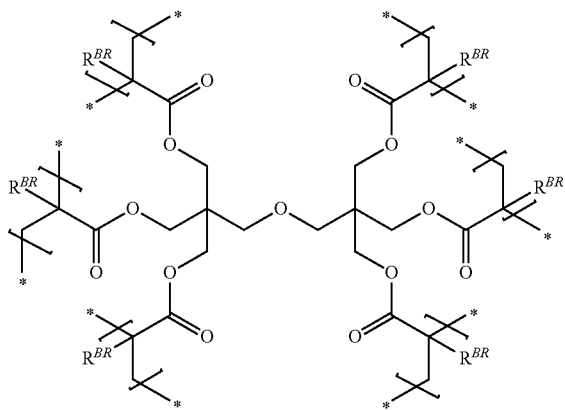
BR-16
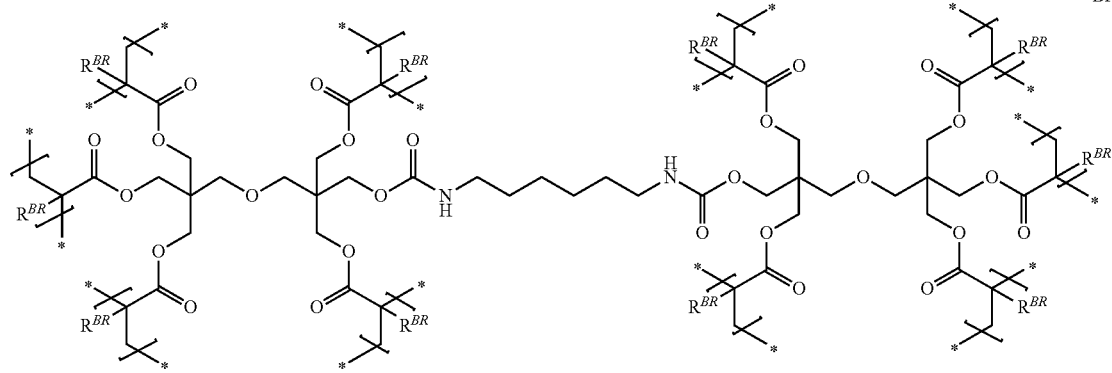

In the structure, $R^{BR}$ each independently represent a hydrogen atom or a methyl group, and n represents an integer of 1 to 20.

<7> The lithographic printing plate precursor according to any one of <1> to <6>, in which the image-recording layer further includes an infrared absorber, a polymerization initiator, and a polymerizable compound.

<8> The lithographic printing plate precursor according to any one of <1> to <7>, in which the image-recording layer further includes a binder polymer.

<9> The lithographic printing plate precursor according to any one of <1> to <8>, further comprising: a protective layer on the image-recording layer.

<10> The lithographic printing plate precursor according to <9>, in which the protective layer includes an inorganic lamellar compound.

<11> The lithographic printing plate precursor according to any one of <1> to <10>, in which a non-exposed portion of the image-recording layer can be removed by at least any of dampening water or printing ink.

<12> A method for producing a lithographic printing plate comprising:

an exposure step of exposing the lithographic printing plate precursor according to any one of <1> to <11> in an image shape and forming an exposed portion and a non-exposed portion; and an on-machine development step of removing the non-exposed portion by supplying at least one of printing ink or dampening water.

<13> A polymer particle comprising: an addition polymerization-type resin having a hydrophilic structure and a crosslinking structure.

<14> The polymer particle according to <13>, in which the addition polymerization-type resin has an ionic group or an acid radical as the hydrophilic structure.

<15> The polymer particle according to <13> or <14>, in which the addition polymerization-type resin has a sulfonate group or a sulfonic acid group as the hydrophilic structure.

<16> The polymer particle according to any one of <13> to <15>, in which the addition polymerization-type resin has a polyalkylene oxide structure as the hydrophilic structure.

<17> The polymer particle according to any one of <13> to <16>, in which the addition polymerization-type resin has a group represented by Formula Z as a group having the hydrophilic structure.

-Q-W—Y            Formula Z

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure; here, any of W and Y has a hydrophilic structure.

<18> The polymer particle according to any one of <13> to <17>, in which the crosslinking structure includes at least one constituent unit selected from the group consisting of constituent units represented by BR-1 to BR-16.

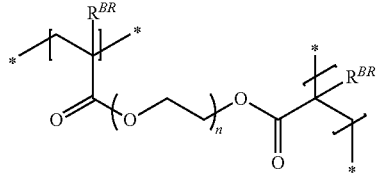

BR-1

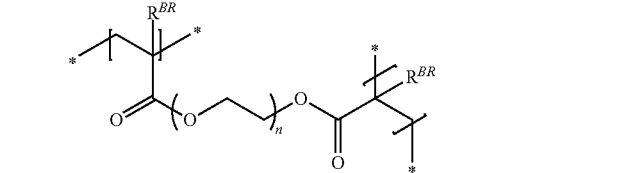

BR-2

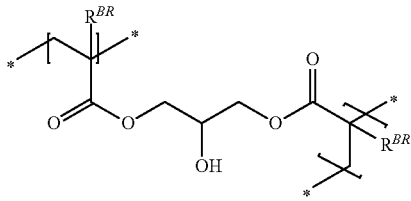

BR-3

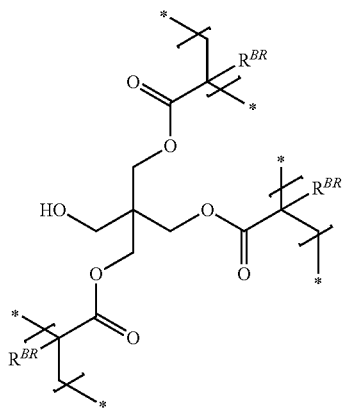

BR-4

-continued
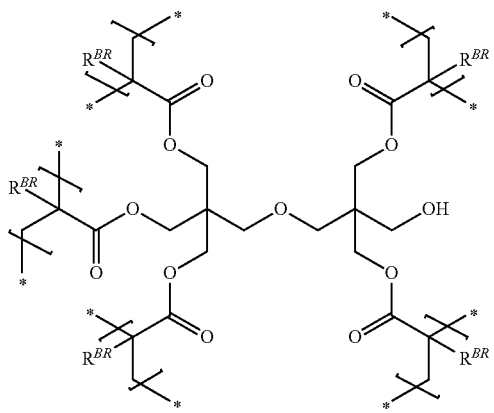
BR-5
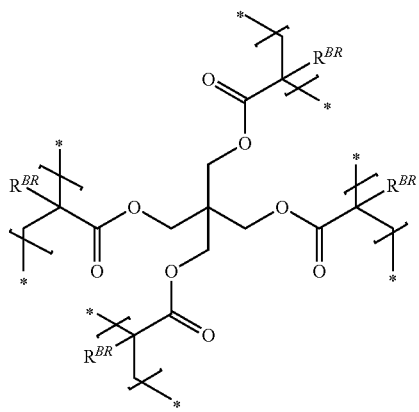
BR-6
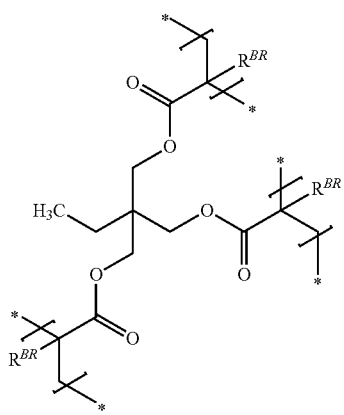
BR-7
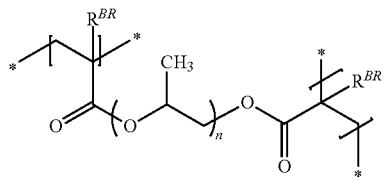
BR-8

BR-13
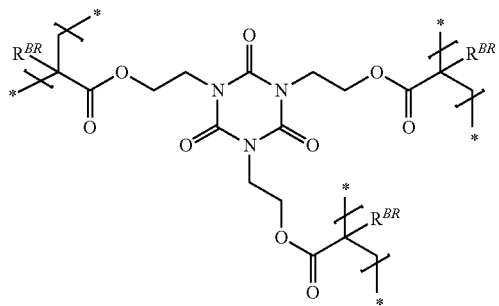
BR-14
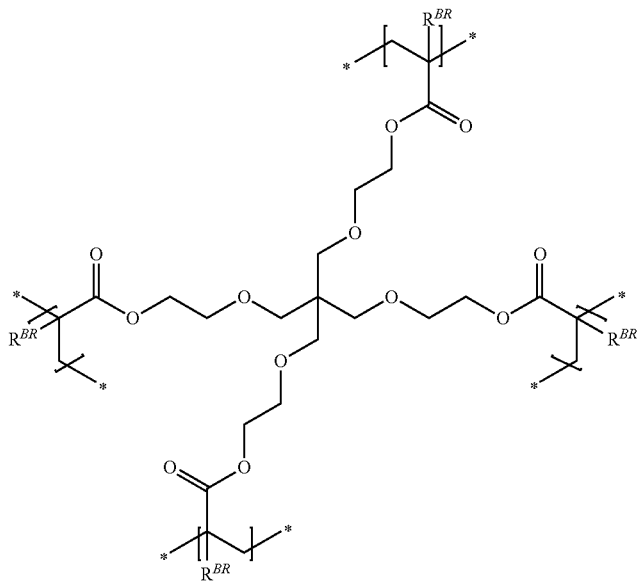
BR-15
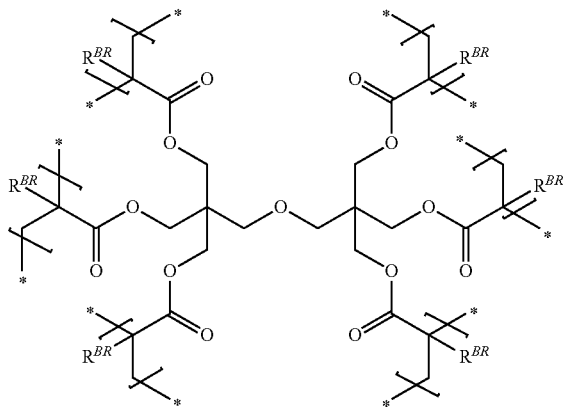

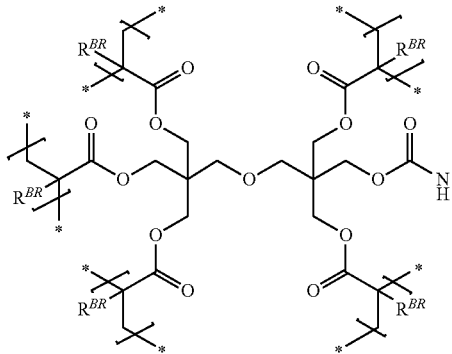 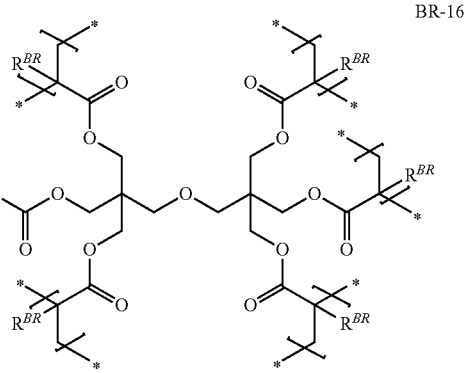

BR-16

In the structure, $R^{BR}$ each independently represent a hydrogen atom or a methyl group, and n represents an integer of 1 to 20.

<19> A composition comprising: the polymer particle according to any one of <13> to <18>.

<20> The composition according to <19>, further comprising: an infrared absorber; a polymerization initiator; and a polymerizable compound.

<21> A method for producing a lithographic printing plate comprising:

an exposure step of exposing the lithographic printing plate precursor according to any one of <1> to <11> in an image shape and forming an exposed portion and a non-exposed portion; and a development step of removing the non-exposed portion by supplying a developer having a pH of 2 or higher and 11 or lower.

According to the embodiment of the present invention, it is possible to provide a lithographic printing plate precursor from which a lithographic printing plate having excellent printing resistance can be obtained even in the case of using an ultraviolet-curable ink.

In addition, according to the another embodiment of the present invention, it is possible to provide a method for producing a lithographic printing plate having excellent printing resistance even in the case of using an ultraviolet-curable ink.

According to the still another embodiment of the present invention, it is possible to provide a new polymer particle and a resin composition including the polymer particle.

DESCRIPTION OF THE PREFERRED EMBODIMENTS

Hereinafter, the contents of the present disclosure will be described in detail. Constituent requirements mentioned below will be described on the basis of typical embodiments of the present disclosure, but the present disclosure is not limited to such embodiments.

Meanwhile, in the present specification, a numerical range expressed using "to" includes numerical values described before and after "to" as the lower limit value and the upper limit value.

In addition, in the present specification, a group (atomic group) that is not expressed whether the group is substituted or not substituted refers to both a group not having a substituent and a group having a substituent. For example, an "alkyl group" refers not only to an alkyl group not having a substituent (unsubstituted alkyl group) but also to an alkyl group having a substituent (substituted alkyl group).

In the present specification, "(meth)acryl" is an expression used with a concept of including both acryl and methacryl, and "(meth)acryloyl" is an expression used with a concept of including both acryloyl and methacryloyl.

In addition, the term "step" in the present specification refers not only to an independent step but also a step that cannot be clearly differentiated from other steps as long as the intended purpose of the step is achieved. In addition, in the present disclosure, "% by mass" and "% by weight" have the same meaning, and "parts by mass" and "parts by weight" have the same meaning.

Furthermore, in the present disclosure, a combination of two or more preferred aspects is a more preferred aspect.

In addition, unless particularly otherwise described, the weight-average molecular weight (Mw) and the number average molecular weight (Mn) in the present disclosure refer to a molecular weight that is detected using a gel permeation chromatography (GPC) analyzer in which columns of TSKgel GMHxL, TSKgel G4000HxL, and TSKgel G2000HxL (all are trade names manufactured by Tosoh Corporation) are used, solvent tetrahydrofuran (THF), and a differential refractometer and is converted using polystyrene as a standard substance.

In the present specification, the term "lithographic printing plate precursor" refers not only to a lithographic printing plate precursor but also to a key plate precursor. In addition, the term "lithographic printing plate" refers not only to a lithographic printing plate produced by carrying out operations such as exposure and development as necessary on the lithographic printing plate precursor but also to a key plate. In the case of the key plate precursor, the operations such as exposure and development are not necessarily required. Meanwhile, the key plate refers to a lithographic printing plate precursor intended to be attached to a plate cylinder that is not used in a case in which monochromatic or dichromatic printing is carried out on a part of paper during, for example, color newspaper printing.

In addition, in the present specification, "*" in a chemical structural formula represents a bonding position with other structures.

Hereinafter, the present disclosure will be described in detail.

(Lithographic Printing Plate Precursor)

A lithographic printing plate precursor according to an embodiment of the present disclosure has an image-recording layer on a hydrophilic support, the image-recording layer includes a polymer particle including an addition polymerization-type resin having a hydrophilic structure and a crosslinking structure.

In addition, the lithographic printing plate precursor according to the embodiment of the present disclosure can be preferably used as an on-machine development-type lithographic printing plate precursor.

As a result of intensive studies, the present inventors found that, in a case in which the above-described constitution is provided, it is possible to provide a lithographic printing plate precursor from which a lithographic printing plate having printing resistance (hereinafter, also referred to as UV printing resistance) that is excellent even in the case of using an ultraviolet-curable ink can be obtained.

A detailed mechanism for the obtainment of the above-described effect is not clear, but is assumed as described below.

It is considered that the polymer particle including an addition polymerization-type resin having a crosslinking structure increases the hardness of the polymer particle and the addition polymerization-type resin having a hydrophilic structure improves the dispersibility of the polymer particle, facilitates the dispersion of the polymer particle in an almost uniform state in the image-recording layer, improves the strength of the entire image-recording layer, and improves printing resistance even in the case of using ultraviolet-curable ink that is more likely to deteriorate plates than other inks.

In addition, it is considered that the polymer particle that is used in the present disclosure has a hydrophilic structure, whereby the affinity to ink or dampening water improves and it is easy to obtain a lithographic printing plate precursor that is excellent in terms of on-machine developability and an on-machine development scum suppression property.

<Image-Recording Layer>

The lithographic printing plate precursor of the embodiment of the present disclosure has an image-recording layer including the polymer particle.

The image-recording layer that is used in the present disclosure is preferably a negative-type image-recording layer.

From the viewpoint of printing resistance and photosensitivity, the image-recording layer in the present disclosure is preferably any aspect of a first aspect and a second aspect described below.

The first aspect contains the polymer particle, an infrared absorber, a polymerization initiator, and a polymerizable compound.

The second aspect contains the polymer particle, an infrared absorber, and a hydrophobic thermoplastic polymer particle.

From the viewpoint of printing resistance, particularly UV printing resistance, the image-recording layer that is used in the present disclosure preferably further contains a binder polymer in the first aspect.

In addition, from the viewpoint of on-machine developability, the image-recording layer that is used in the present disclosure may further contain a hydrophobic thermoplastic polymer particle in the first aspect.

From the viewpoint of on-machine developability, in the lithographic printing plate precursor of the embodiment of the present disclosure, a non-exposed portion of the image-recording layer preferably can be removed by at least any of dampening water or printing ink.

Hereinafter, individual components that are included in the image-recording layer will be described in detail.

—Polymer Particle—

The image-recording layer in the lithographic printing plate precursor according to the embodiment of the present disclosure includes a polymer particle including an addition polymerization-type resin having a hydrophilic structure and a crosslinking structure.

From the viewpoint of UV printing resistance and on-machine developability, the polymer particle preferably includes 80% by mass or more of the addition polymerization-type resin, more preferably includes 90% by mass or more of the addition polymerization-type resin, still more preferably includes 95% by mass or more of the addition polymerization-type resin, and is particularly preferably a particle consisting of the addition polymerization-type resin.

From the viewpoint of UV printing resistance and production feasibility, the addition polymerization-type resin is preferably a resin obtained by polymerizing an ethylenically unsaturated compound and more preferably a resin obtained by copolymerizing a polyfunctional ethylenically unsaturated compound and a monofunctional ethylenically unsaturated compound.

The addition polymerization-type resin may have only one kind of the hydrophilic structure and only one kind of the crosslinking structure or may have two or more kinds of any one or both of the hydrophilic structure and the crosslinking structure.

~Hydrophilic Structure~

The addition polymerization-type resin has at least a hydrophilic structure.

From the viewpoint of UV printing resistance, on-machine developability, an on-machine development scum suppression property, and the dispersion stability of particles, particularly, the dispersion stability in water, the addition polymerization-type resin preferably has, as the hydrophilic structure, an ionic group or an acid radical and more preferably has an ionic group.

In addition, from the viewpoint of UV printing resistance, on-machine developability, an on-machine development scum suppression property, and the dispersion stability of particles, particularly, the dispersion stability in water, the addition polymerization-type resin more preferably has, as the hydrophilic structure, a sulfonate group (a salt of sulfonic acid group) or a sulfonic acid group.

From the viewpoint of UV printing resistance, on-machine developability, an on-machine development scum suppression property, and the dispersion stability of particles, particularly, the dispersion stability in an organic solvent, the addition polymerization-type resin preferably has, as the hydrophilic structure, a polyalkylene oxide structure or a polyester structure and more preferably has a polyalkylene oxide structure.

Furthermore, from the viewpoint of UV printing resistance, on-machine developability, an on-machine development scum suppression property, and the dispersion stability of particles, the addition polymerization-type resin particularly preferably has, as the hydrophilic structure, an ionic group or an acid radical and a polyalkylene oxide structure.

From the viewpoint of on-machine developability, an on-machine development scum suppression property, and the dispersion stability of particles, as the acid radical, a sulfonate group, a carboxylate group, a phosphate group, or a sulfuric acid monoester group are preferably exemplified, a sulfonate group or a carboxylate group is more preferably exemplified, and a sulfonate group is particularly preferably exemplified.

From the viewpoint of UV printing resistance, on-machine developability, an on-machine development scum suppression property, and the dispersion stability of particles, as the ionic group, a group generating an anion by disassociating a counterion (anionic group) is preferred, a salt of an acid radical is more preferably exemplified, a sulfonate group, a carboxylate group, or a sulfonic acid monoester salt group is still more preferably exemplified, and a sulfonate group is particularly preferably exemplified.

A counter cation in the salt of the acid radical may be an inorganic cation or an organic cation, but is preferably an inorganic cation. In addition, the counter cation may be not only a monovalent cation but also a polyvalent cation, but is preferably a monovalent cation.

As the inorganic cation, an alkali metal ion or an alkali earth metal ion is more preferred, an alkali metal ion is more preferred, and a lithium ion, a sodium ion, or a potassium ion is particularly preferred.

As the organic cation, a quaternary ammonium cation, a cation obtained by alkylating a nitrogen atom in an aromatic nitrogen-containing heterocycle, and the like are exemplified.

As the quaternary ammonium cation, a tetramethylammonium cation, a tetraethylammonium cation, and a dimethylbenzylammonium cation are exemplified, and, as the cation obtained by alkylating a nitrogen atom in an aromatic nitrogen-containing heterocycle, a pyridinium cation is exemplified.

Among these, the counter cation is preferably an alkali metal ion or a quaternary ammonium cation and particularly preferably an alkali metal ion.

From the viewpoint of UV printing resistance, on-machine developability, an on-machine development scum suppression property, and the dispersion stability of particles, the addition polymerization-type resin preferably has a constituent unit represented by Formula A-1 or Formula A-2.

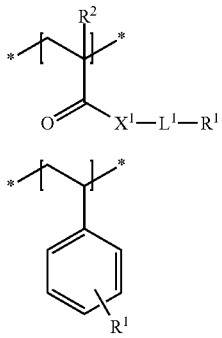

In Formula A-1 and Formula A-2, $X^1$ represents O or $NR^3$, $L^1$ represents a divalent linking group having 1 to 20 carbon atoms, $R^1$ represents an ionic group or an acid radical, $R^2$ represents a hydrogen atom or a methyl group, and $R^3$ represents a hydrogen atom, an alkyl group, or an aryl group.

$X^1$ is preferably O.

$L^1$ is preferably a divalent linking group having 2 to 10 carbon atoms, more preferably a divalent linking group having 2 to 8 carbon atoms, still more preferably an alkylene group having 2 to 8 carbon atoms, and particularly preferably an alkylene group having 2 to 5 carbon atoms.

The divalent linking group is preferably an alkylene group or a group obtained by bonding one or more alkylene groups and one or more of at least one kind of structure selected from the group consisting of an ether bond and an ester bond, and more preferably an alkylene group.

$R^3$ is preferably a hydrogen atom, an alkyl group having 1 to 4 carbon atoms, or a phenyl group and more preferably a hydrogen atom.

From the viewpoint of the dispersion stability of particles, particularly, the dispersion stability of an organic solvent, the polyalkylene oxide structure is preferably a polyethylene oxide structure, a polypropylene oxide structure, or a poly (ethylene oxide/propylene oxide) structure.

From the viewpoint of the dispersion stability of particles, particularly, the dispersion stability of an organic solvent, the number of the alkylene oxide structures in the polyalkylene oxide structure is preferably 2 or more, more preferably 5 or more, still more preferably 5 to 200, and particularly preferably 8 to 150.

The polyester structure is not particularly limited, but a ring-opening polymer chain of a lactone and a polycondensation chain of hydroxycarboxylic acid are preferably exemplified.

From the viewpoint of the dispersion stability of particles, particularly, the dispersion stability of an organic solvent, the number of hydroxycarboxylic acid structures (lactone structures) in the polyester structure is preferably 2 or more, more preferably 2 to 20, still more preferably 2 to 10, and particularly preferably 4 to 10.

From the viewpoint of UV printing resistance, on-machine developability, an on-machine development scum suppression property, and the dispersion stability of particles, the addition polymerization-type resin preferably has a constituent unit represented by Formula A-3 or Formula A-4 and more preferably has a constituent unit represented by Formula A-3.

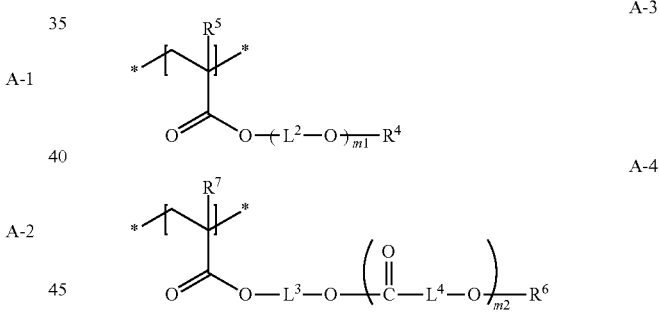

In Formula A-3 and Formula A-4, $L^2$ represents an ethylene group or a propylene group, $L^3$ represents an alkylene group having 2 to 10 carbon atoms, $L^4$ represents an alkylene group having 1 to 10 carbon atoms, $R^4$ and $R^6$ each independently represent a hydrogen atom, an alkyl group, or an aryl group, $R^5$ and $R^7$ each independently represent a hydrogen atom or a methyl group, m1 represents an integer of 2 to 200, and m2 represents an integer of 2 to 20.

$L^2$ is preferably an ethylene group or a 1,2-propylene group.

$L^3$ is preferably an alkylene group having 2 to 8 carbon atoms, more preferably an alkylene group having 2 to 4 carbon atoms, and still more preferably an ethylene group.

$L^4$ is preferably an alkylene group having 2 to 8 carbon atoms, more preferably an alkylene group having 3 to 8 carbon atoms, and still more preferably an alkylene group having 4 to 6 carbon atoms.

$R^4$ and $R^6$ each are independently preferably a hydrogen atom, an alkyl group having 1 to 4 carbon atoms, or a phenyl group, more preferably a hydrogen atom or an alkyl group having 1 to 4 carbon atoms, and still more preferably a hydrogen atom or a methyl group.

m1 is preferably an integer of 5 to 200 and more preferably an integer of 8 to 150.

m2 is preferably an integer of 2 to 10 and more preferably an integer of 4 to 10.

From the viewpoint of UV printing resistance, on-machine developability, an on-machine development scum suppression property, and the dispersion stability of particles, the addition polymerization-type resin particularly preferably has the constituent unit represented by Formula A-1 or Formula A-2 and the constituent unit represented by Formula A-3 or Formula A-4 and most preferably has the constituent unit represented by Formula A-1 or Formula A-2 and the constituent unit represented by Formula A-3.

From the viewpoint of on-machine developability, an on-machine development scum suppression property, and the dispersion stability of particles, the addition polymerization-type resin preferably has, as a group having the hydrophilic structure, a group represented by Formula Z.

$$-Q-W-Y \quad \text{Formula Z}$$

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure; here, any of W and Y has a hydrophilic structure.

Q is preferably a divalent linking group having 1 to 20 carbon atoms and more preferably a divalent linking group having 1 to 10 carbon atoms.

In addition, Q is preferably an alkylene group, an arylene group, an ester bond, an amide bond, or a group obtained by combining two or more groups or bonds described above and more preferably a phenylene group, an ester bond, or an amide bond.

The divalent group having a hydrophilic structure as W is preferably a polyalkyleneoxy group or a group having —$CH_2CH_2NR^W$— bonding to one terminal of a polyalkyleneoxy group. Meanwhile, $R^W$ represents a hydrogen atom or an alkyl group.

The divalent group having a hydrophobic structure as W is preferably —$R^{WA}$—, —O—$R^{WA}$—O—, —$R^W$N—$R^{WA}$—$NR^W$—, —OOC—$R^{WA}$—O—, or —OOC—$R^{WA}$—O—. Meanwhile, $R^{WA}$ each respectively represents a linear chain having 6 to 120 carbon atoms, a branched or cyclic alkylene group, a haloalkylene group having 6 to 120 carbon atoms, an arylene group having 6 to 120 carbon atoms, an alkarylene group (a divalent group obtained by removing one hydrogen atom from an alkylaryl group) having 6 to 120 carbon atoms, or an aralkylene group having 6 to 120 carbon atoms.

The monovalent group having a hydrophilic structure as Y is preferably OH, COOH, a polyalkyleneoxy group having a hydrogen atom or an alkyl group at one terminal, or a group having —$CH_2CH_2N(R^W)$— bonding to the other terminal of the polyalkyleneoxy group having a hydrogen atom or an alkyl group at one terminal.

The monovalent group having a hydrophobic structure as Y is preferably a linear, branched, or cyclic alkyl group having 6 to 120 carbon atoms, a haloalkyl group having 6 to 120 carbon atoms, an aryl group having 6 to 120 carbon atoms, an alkaryl group (an alkylaryl group) having 6 to 120 carbon atoms, an aralkyl group having 6 to 120 carbon atoms, $OR^{WB}$, $COOR^{WB}$, or $OOCR^{WB}$. Meanwhile, $R^{WB}$ represents an alkyl group having 6 to 20 carbon atoms.

From the viewpoint of on-machine developability, an on-machine development scum suppression property, and the dispersion stability of particles, the content of a constituent unit having a hydrophilic structure in the addition polymerization-type resin is preferably 1% by mass to 50% by mass, more preferably 5% by mass to 40% by mass, and particularly preferably 10% by mass to 30% by mass of the total mass of the addition polymer-type resin.

In addition, in a case in which the hydrophilic structure is an ionic group, from the viewpoint of on-machine developability, an on-machine development scum suppression property, and the dispersion stability of particles, the content of a constituent unit having an ionic group in the addition polymerization-type resin is preferably 1% by mass to 30% by mass, more preferably 2% by mass to 20% by mass, and particularly preferably 4% by mass to 10% by mass of the total mass of the addition polymerization-type resin.

~Crosslinking Structure~

The addition polymerization-type resin has at least a crosslinking structure.

The crosslinking structure is not particularly limited, but is preferably a constituent unit formed by the polymerization of a polyfunctional ethylenically unsaturated compound.

From the viewpoint of UV printing resistance and on-machine developability, the number of functional groups in the polyfunctional ethylenically unsaturated compound is preferably 2 to 15, more preferably 3 to 10, still more preferably 4 to 10, and particularly preferably 5 to 10.

In addition, in the case of expressing the above description in a different manner, from the viewpoint of UV printing resistance and on-machine developability, the crosslinking structure is preferably a difunctional to quinquedecafunctional branched unit, more preferably a trifunctional to decafunctional branched unit, still more preferably a tetrafunctional to decafunctional branched unit, and particularly preferably a pentafunctional to decafunctional branched unit.

Meanwhile, the branched unit refers to a constituent unit having a branch point (crosslinking structure).

The number of carbon atoms in the branched unit is not particularly limited, but is preferably 8 to 100 and more preferably 8 to 70.

In addition, from the viewpoint of UV printing resistance, on-machine developability, and the strength of particles, the crosslinking structure preferably includes at least one constituent unit selected from the group consisting of constituent units represented by BR-1 to BR-16, more preferably includes at least one constituent unit selected from the group consisting of constituent units represented by BR-1 to BR-10 or BR-13 to BR-16, still more preferably includes at least one constituent unit selected from the group consisting of constituent units represented by BR-1 to BR-7 or BR-13 to BR-16, and particularly preferably includes the constituent unit represented by BR-1.

23
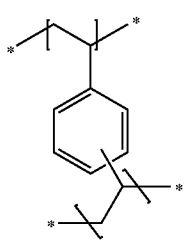
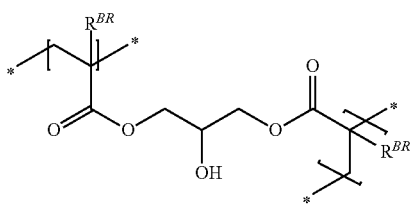
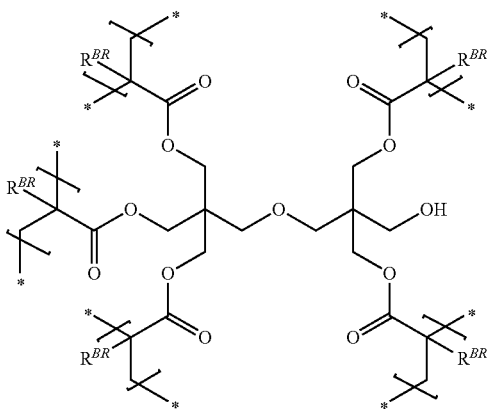
BR-5
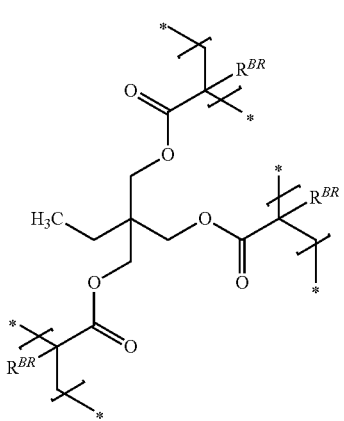
BR-7
24
BR-1 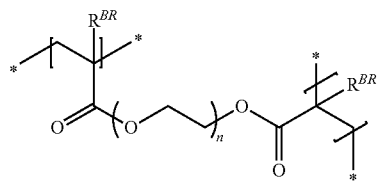 BR-2
BR-3 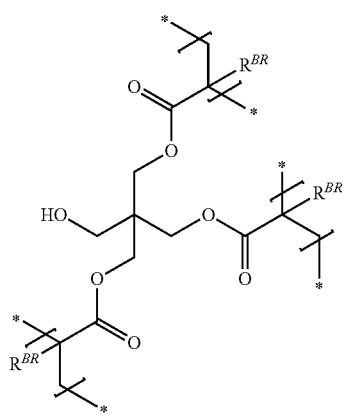 BR-4
BR-6 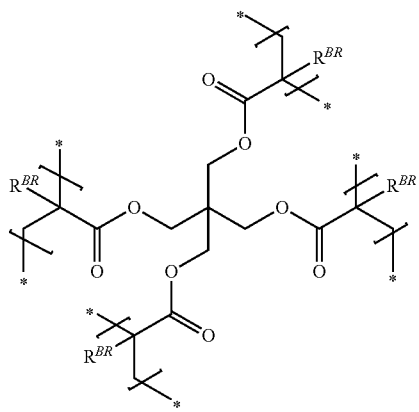
BR-8 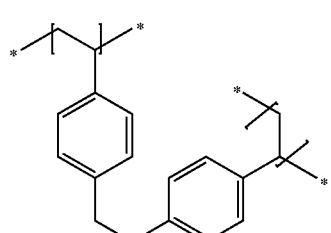
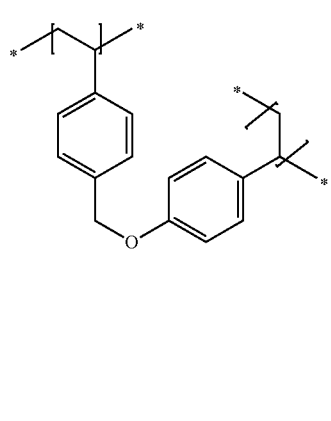

-continued
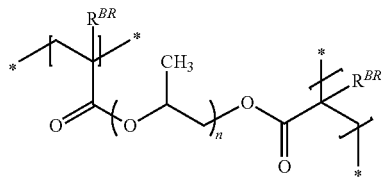
BR-9
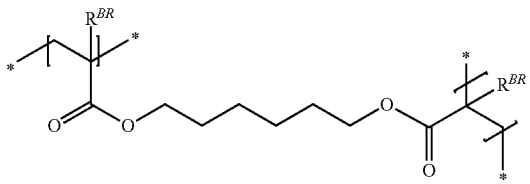
BR-10
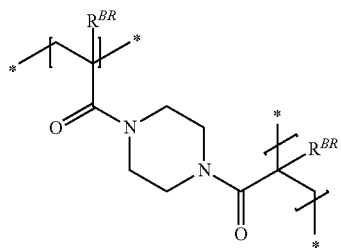
BR-11
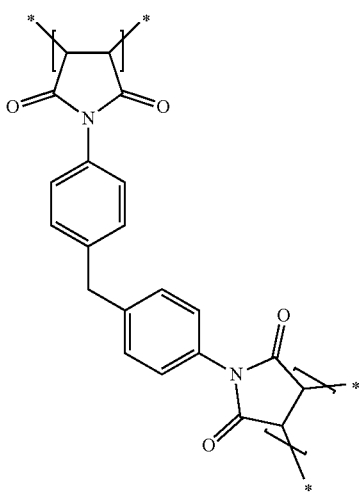
BR-12
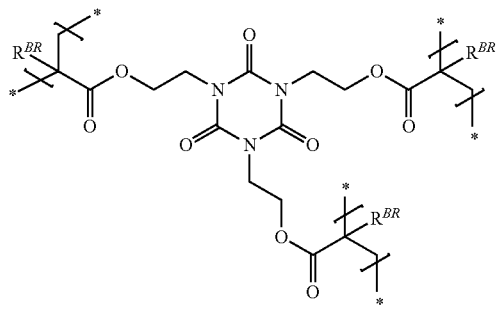
BR-13
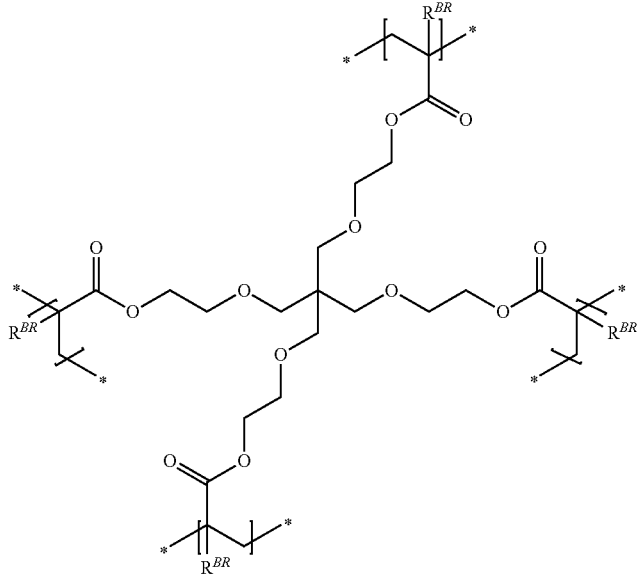
BR-14

-continued

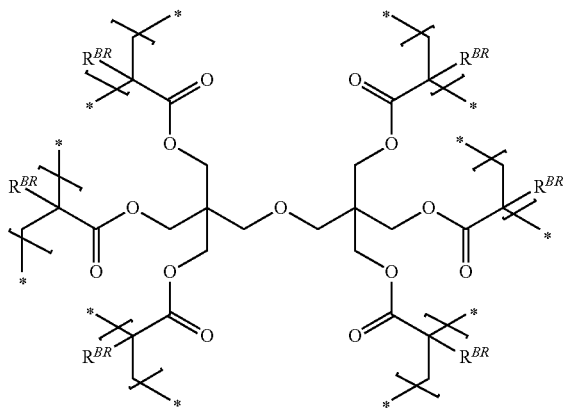

BR-15

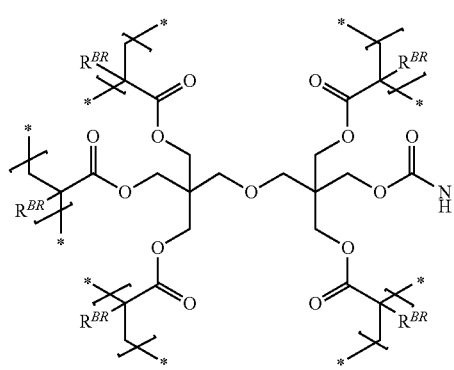

BR-16

In the structure, $R^{BR}$ each independently represent a hydrogen atom or a methyl group, and n represents an integer of 1 to 20.

From the viewpoint of UV printing resistance and on-machine developability, the content of a constituent unit having a crosslinking structure in the addition polymerization-type resin is preferably 1% by mass to 50% by mass, more preferably 5% by mass to 45% by mass, still more preferably 10% by mass to 40% by mass, and particularly preferably 10% by mass to 35% by mass of the total mass of the addition polymer-type resin.

The addition polymerization-type resin may have a constituent unit other than the constituent unit having a hydrophilic structure and the constituent unit having a crosslinking structure (additional constituent unit).

As a compound forming the additional constituent unit, monofunctional ethylenically unsaturated compounds such as a styrene compound, a (meth)acrylate compound, a (meth)acrylonitrile compound, a (meth)acrylamide compound, a vinyl halide compound, a vinyl ester compound, a vinyl ether compound, and an α-olefin compound are preferably exemplified.

Specifically, for example, styrene, methyl methacrylate, acrylonitrile, methacrylonitrile, N,N-dimethylacrylamide, 2-hydroxyethyl acrylate, 2,3-dihydroxypropyl methacrylate, 2-ethylhexyl methacrylate, acryloyl morpholine, diacetone acrylamide, N-isopropylacrylamide, cyclohexyl methacrylate, acryloxymethyl ethylene carbonate, p-t-butylstyrene, methacrylamide, and the like are more preferably exemplified.

Among these, the addition polymerization-type resin still more preferably has at least one constituent unit selected from the group consisting of a constituent unit consisting of acrylonitrile, a constituent unit consisting of methyl methacrylate, and a constituent unit consisting of styrene and particularly preferably has a constituent unit consisting of acrylonitrile.

Meanwhile, the constituent unit consisting of acrylonitrile is a constituent unit represented by X-1, the constituent unit consisting of methyl methacrylate is a constituent unit represented by X-2, and the constituent unit consisting of styrene is a constituent unit represented by X-3.

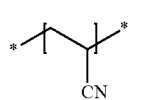

X-1

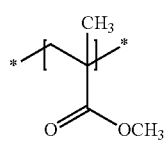

X-2

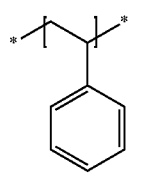

X-3

The addition polymerization-type resin may have one additional constituent unit, may have two or more additional constituent units, or may not have any additional constituent unit.

From the viewpoint of UV printing resistance and on-machine developability, the content of the additional constituent unit in the addition polymerization-type resin is preferably 10% by mass to 90% by mass, more preferably 20% by mass to 85% by mass, still more preferably 40% by mass to 80% by mass, and particularly preferably 50% by mass to 75% by mass of the total mass of the addition polymer-type resin.

Regarding the molecular weight of the addition polymerization-type resin, the mass average molecular weight (Mw) as a polystyrene equivalent value by a GPC method is preferably 2,000 or more, more preferably 5,000 or more, and still more preferably 10,000 to 20,000,000.

From the viewpoint of improvement in UV printing resistance, the volume-average particle diameter of the polymer particle is preferably 50 nm to 1,000 nm and more preferably 80 nm to 600 nm.

The volume-average particle diameter of the polymer particle is a value measured using a laser diffraction/scattering-type particle size distribution analyzer LA-920 (manufactured by Horiba Ltd.).

In the present disclosure, as the polymer particle that is preferably used, G-1 to G-21 are exemplified. Meanwhile, average particle diameters below are volume-average particle diameters, the contents (suffixes on the lower right side of parentheses) of individual constituent units are mass ratios, and a suffix on the lower right side of a parenthesis of the polyalkyleneoxy structure or a polyhydroxycarboxylate structure represents the number of times of repetition, and * represents a bonding position with other structures.

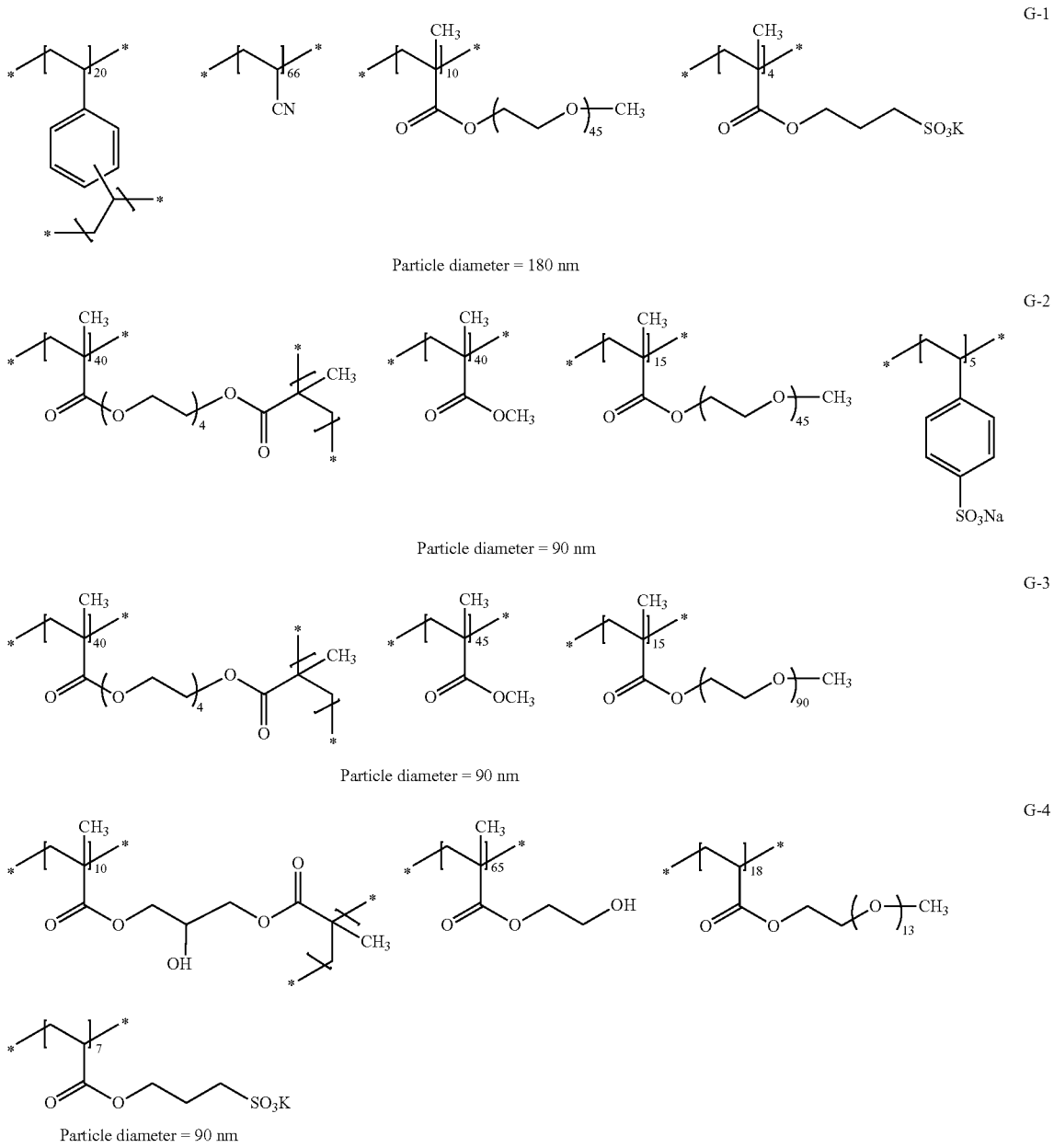

-continued
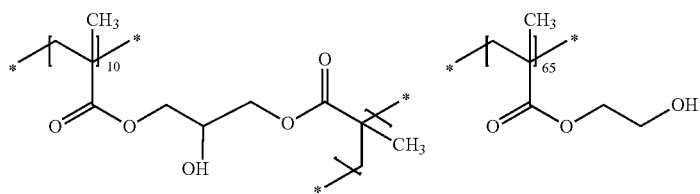
G-5
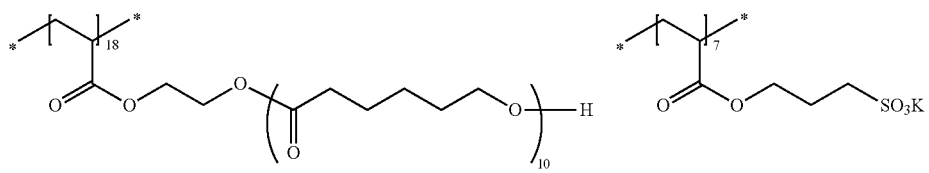
Particle diameter = 90 nm
G-6
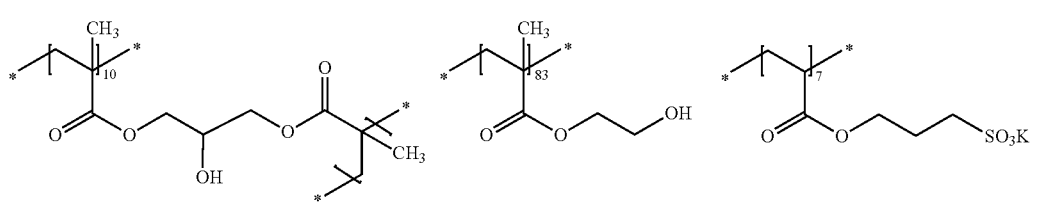
Particle diameter = 150 nm
G-7
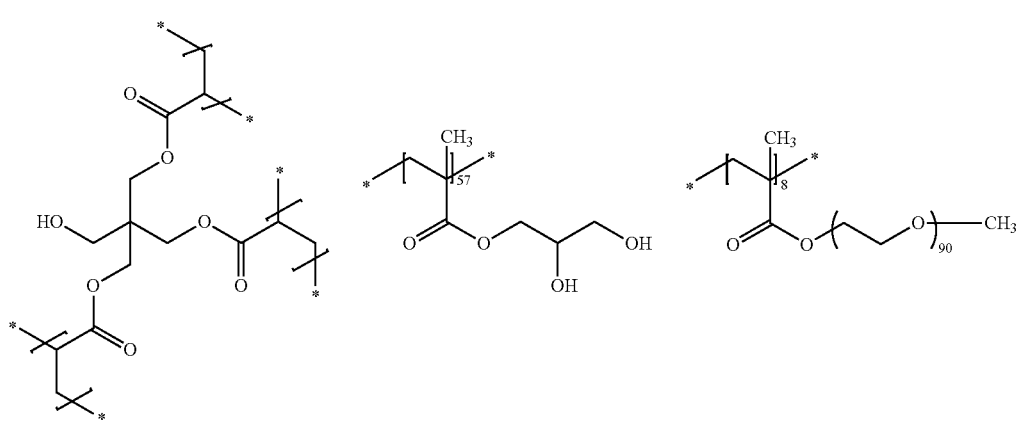
Particle diameter = 260 nm
G-8
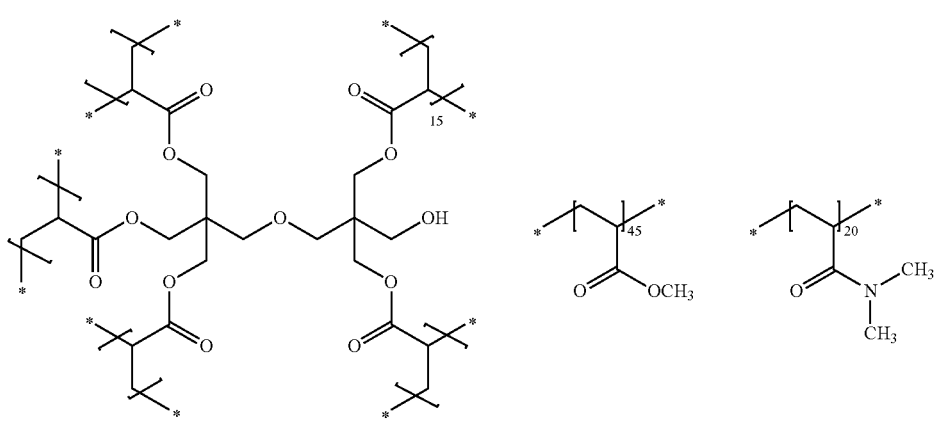

-continued
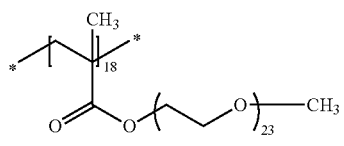
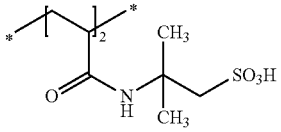
Particle diameter = 220 nm
G-9
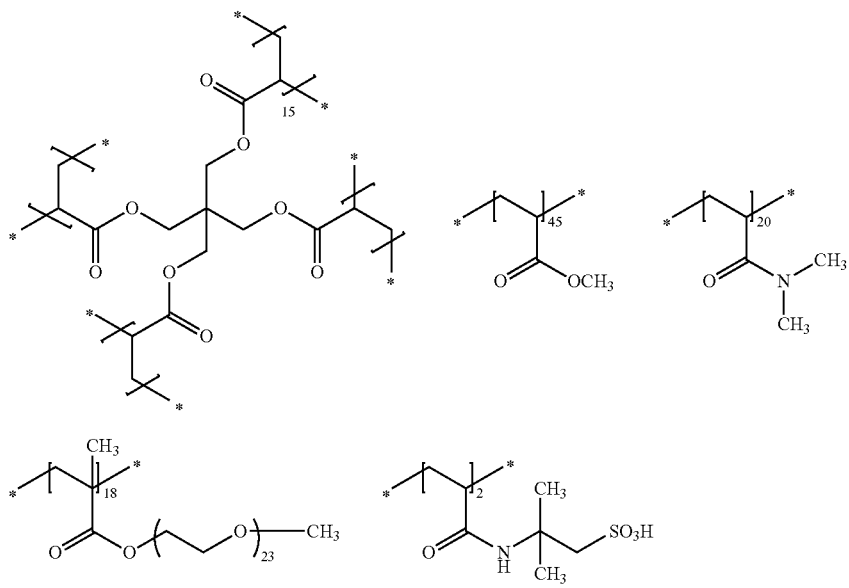
Particle diameter = 220 nm
G-10
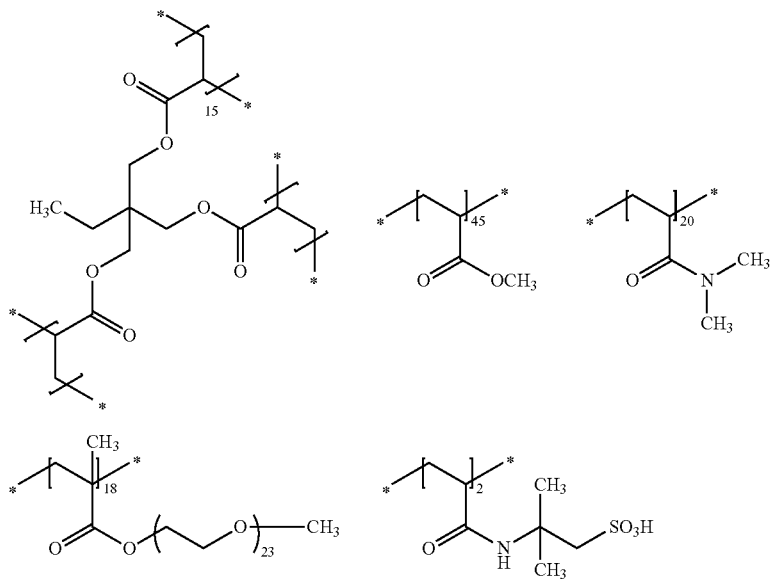
Particle diameter = 220 nm
G-11
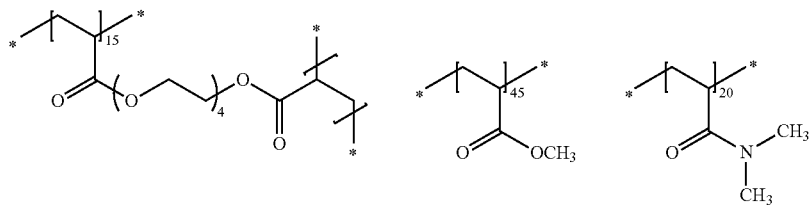

-continued
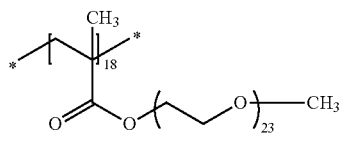 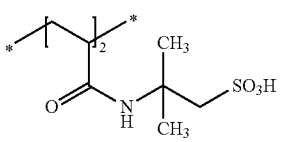
Particle diameter = 220 nm
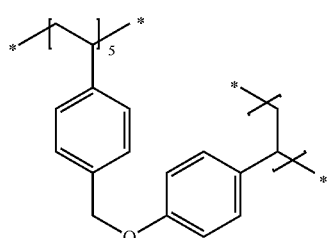 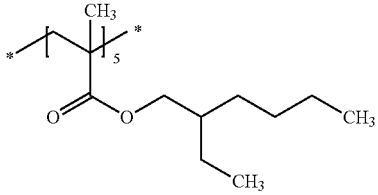 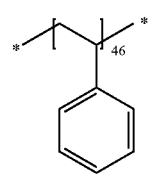
G-12
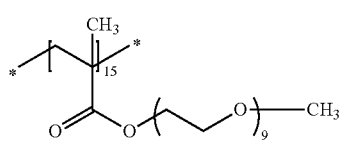 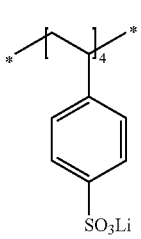
Particle diameter = 180 nm
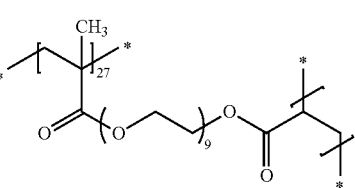 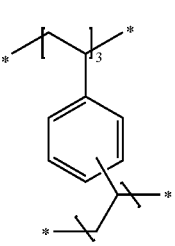 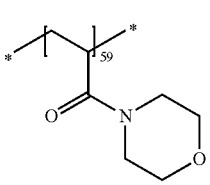 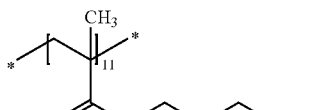
G-13
Particle diameter = 130 nm
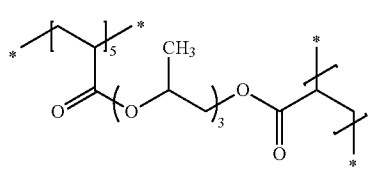 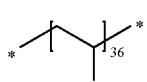 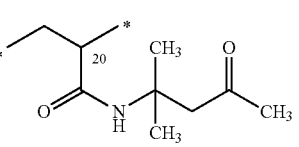
G-14
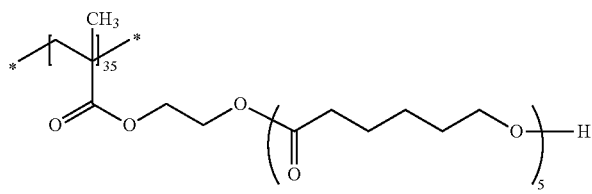 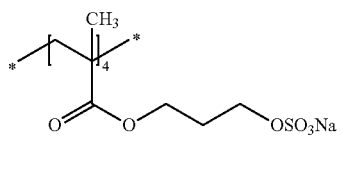
Particle diameter = 100 nm
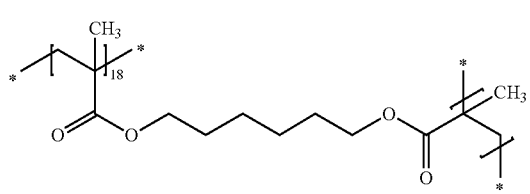 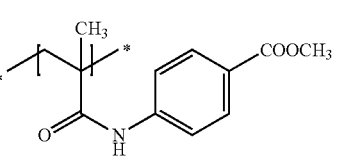
G-15

-continued
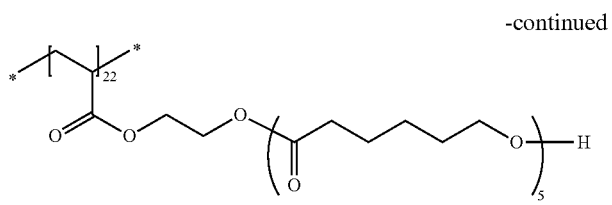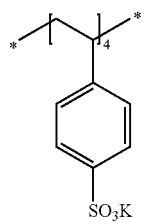
Particle diameter = 80 nm
G-16
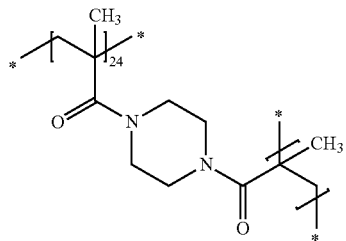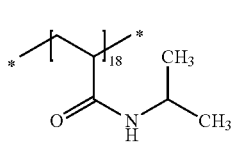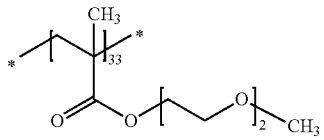
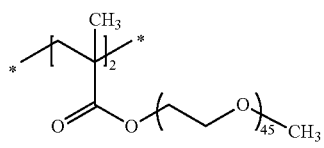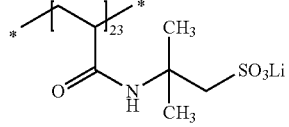
Particle diameter =120 nm
G-17
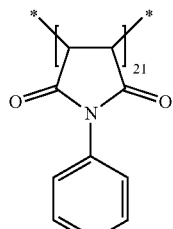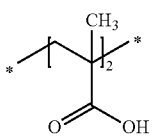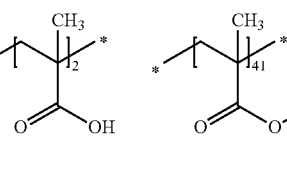
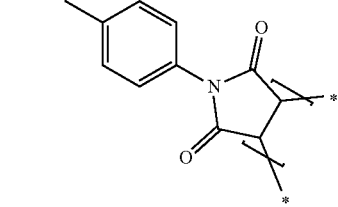
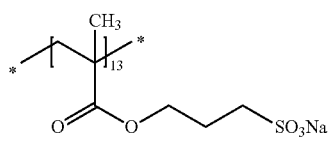
Particle diameter = 250 nm -continued
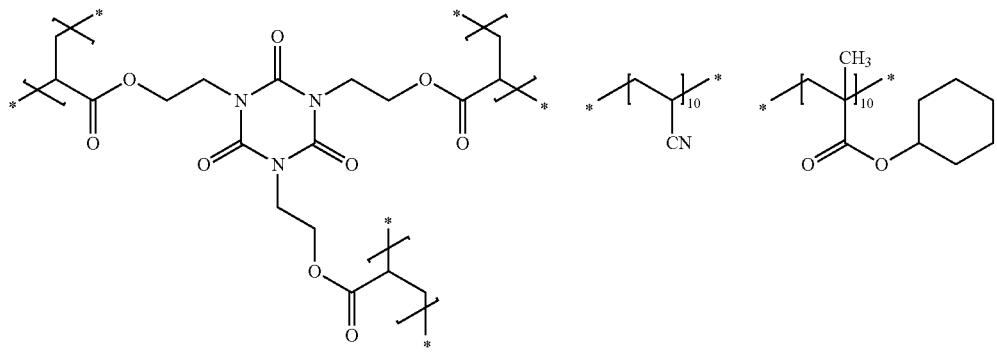
G-18
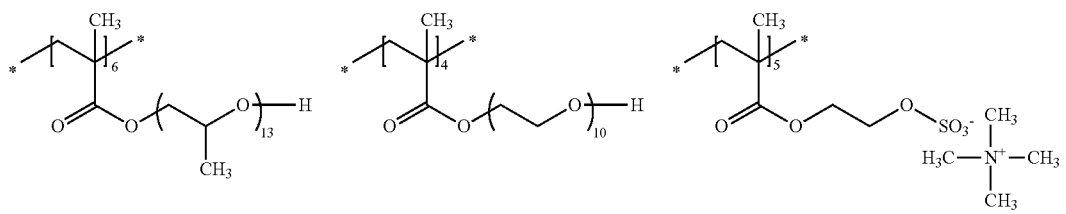
Particle diameter = 510 nm
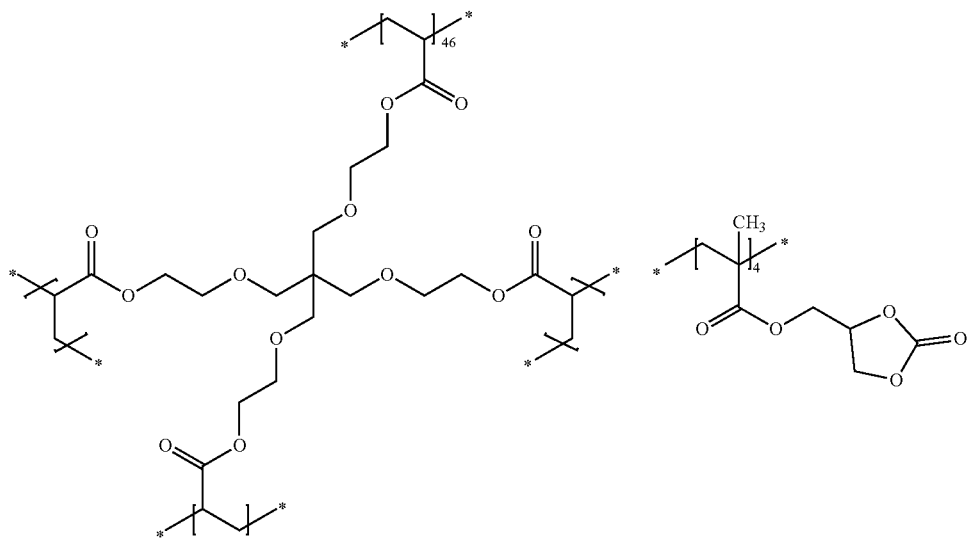
G-19
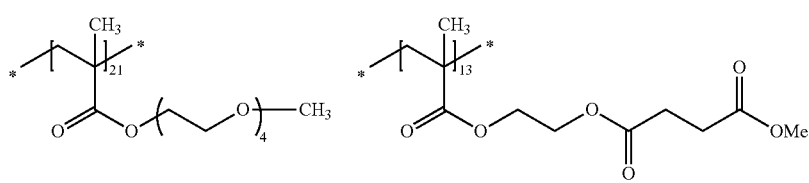
Particle diameter = 160 nm -continued

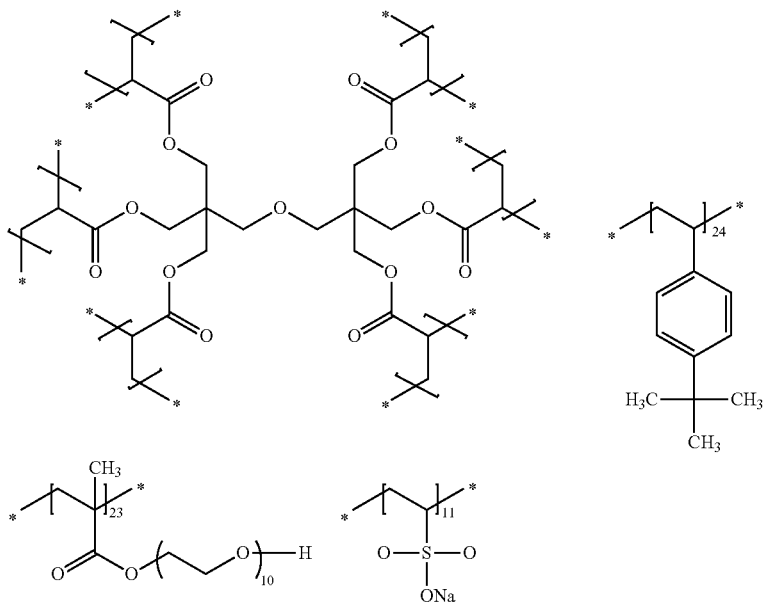

G-20

Particle diameter = 430 nm

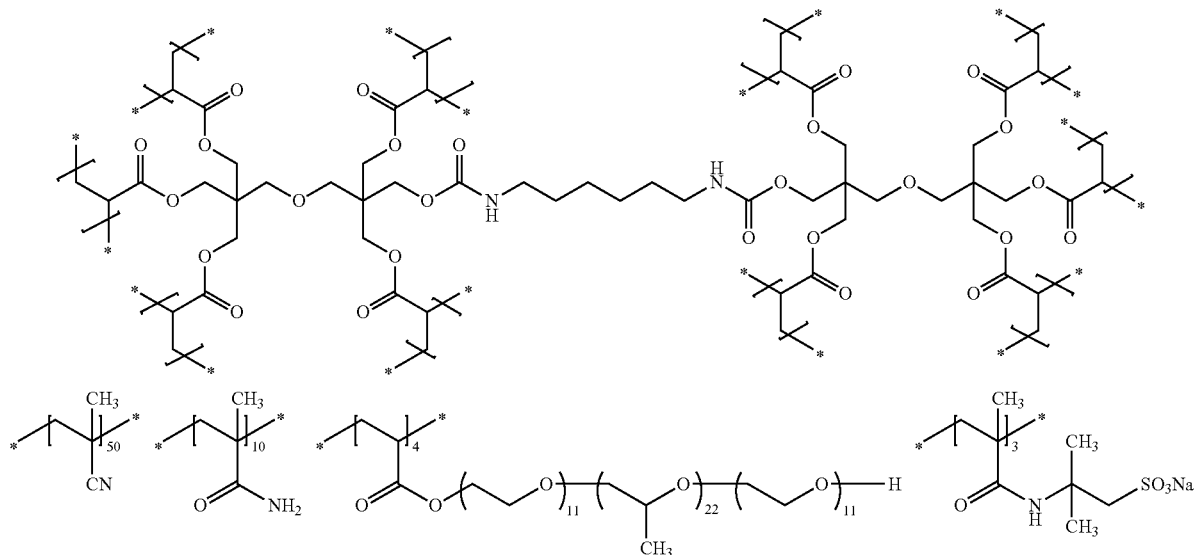

G-21

Particle diameter = 320 nm

From the viewpoint of UV printing resistance and on-machine developability, the content of the polymer particle in the image-recording layer of the lithographic printing plate precursor of the embodiment of the present disclosure is preferably 10% by mass to 90% by mass, more preferably 20% by mass to 80% by mass, still more preferably 30% by mass to 70% by mass, and particularly preferably 35% by mass to 65% by mass of the total mass of the image-recording layer.

—Infrared Absorber—

The image-recording layer preferably includes an infrared absorber.

The infrared absorber has a function of converting absorbed infrared rays to heat and a function of migrating electrons and/or migrating energy to a polymerization initiator described below by being excited by infrared rays. The infrared absorber that is used in the present disclosure is preferably a dye having the maximum absorption at a wavelength of 750 nm to 1,400 nm.

As the dye, it is possible to use a commercially available dye and a well-known dye described in publications, for example, "Dye Handbooks" (edited by the Society of Synthetic Organic Chemistry, Japan and published on 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Among these dyes, as preferred dyes, a cyanine colorant, a squarylium colorant, a pyrylium salt, a nickel thiolate complex, and an indolenine cyanine colorant are exemplified. Furthermore, a cyanine colorant or an indolenine cyanine colorant is more preferably exemplified. Between these, a cyanine colorant is particularly preferred.

Specific examples of the cyanine colorant include a compound described in Paragraphs 0017 to 0019 of JP2001-133969A, a compound described in Paragraphs 0016 to 0021 of JP2002-023360A and Paragraphs 0012 to 0037 of JP2002-040638A, preferably a compound described in Paragraphs 0034 to 0041 of JP2002-278057A and Paragraphs 0080 to 0086 of JP2008-195018A, particularly preferably a compound described in Paragraphs 0035 to 0043 of JP2007-090850A, and a compound described in Paragraphs 0105 to 0113 of JP2012-206495A.

In addition, it is also possible to preferably use a compound described in Paragraphs 0008 and 0009 of JP1993-005005A (JP-H05-005005A) and Paragraphs 0022 to 0025 of JP2001-222101A.

As the pigment, a compound described in Paragraphs 0072 to 0076 of JP2008-195018A is preferred.

The infrared absorber may be used singly or two or more infrared absorbers may be jointly used. In addition, a pigment and a dye may be jointly used as the infrared absorber.

The content of an infrared-absorber in the image-recording layer is preferably 0.1% by mass to 10.0% by mass and more preferably 0.5% by mass to 5.0% by mass of the total mass of the image-recording layer.

—Polymerization Initiator—

The image-recording layer that is used in the present disclosure preferably contains a polymerization initiator and more preferably contains a polymerization initiator and a polymerizable compound.

The polymerization initiator is a compound that initiates and accelerates the polymerization of a polymerizable compound. As the polymerization initiator, it is possible to use a well-known thermopolymerization initiator, a compound having a bond with a small bond dissociation energy, a photopolymerization initiator, or the like. Specifically, radical polymerization initiators described in Paragraphs 0092 to 0106 of JP2014-104631 A can be used.

Among polymerization initiators, as a preferred compound, an onium salt is exemplified. Particularly, an iodonium salt and a sulfonium salt are particularly preferably exemplified. Specific preferred compounds among the respective salts are the same as the compounds described in Paragraphs 0104 to 0106 of JP2014-104631A.

The content of the polymerization initiator is preferably 0.1% by mass to 50% by mass, more preferably 0.5% by mass to 30% by mass, and particularly preferably 0.8% by mass to 20% by mass of the total mass of the image-recording layer. In a case in which the content of the polymerization initiator is in the above-described range, a more favorable sensitivity and a more favorable resistance of a non-image area to contamination during printing can be obtained.

—Polymerizable Compound—

The image-recording layer used in the present disclosure preferably contains a polymerizable compound.

The polymerizable compound that is used in the image-recording layer may be, for example, a radical polymerizable compound or a cationic polymerizable compound, but is preferably an addition polymerizable compound having at least one ethylenically unsaturated bond (ethylenically unsaturated compound). The ethylenically unsaturated compound is preferably a compound having at least one terminal ethylenically unsaturated bond and more preferably a compound having two or more terminal ethylenically unsaturated bonds. The polymerizable compound may have a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, and maleic acid), esters thereof, and amides thereof. Esters of unsaturated carboxylic acids and polyvalent amine compounds and amides of unsaturated carboxylic acids and polyhydric alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reactants between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These compounds are described in JP2006-508380A, JP2002-287344A, JP2008-256850A, JP2001-342222A, JP1997-179296A (JP-H09-179296A), JP 1997-179297A (JP-H09-179297A), JP1997-179298A (JP-H09-179298A), JP2004-294935A, JP2006-243493A, JP2002-275129A, JP2003-064130A, JP2003-280187A, JP1998-333321A (JP-H10-333321A), and the like.

As specific examples of monomers of esters of polyhydric alcohol compounds and unsaturated carboxylic acids, examples of acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like. Examples of methacrylic acid esters include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylene bisacrylamide, xylene bismethacrylamide, and the like.

In addition, urethane-based addition polymerizable compounds produced using an addition reaction between an isocyanate and a hydroxy group are also preferred, and specific examples thereof include vinyl urethane compounds having two or more polymerizable vinyl groups in one molecule obtained by adding vinyl monomers having a hydroxy group represented by Formula (M) to a polyisocyanate compound having two or more isocyanate groups in one molecule which is described in, for example, JP1973-041708B (JP-S48-041708B).

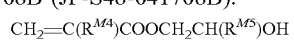  (M)

In Formula (M), $R^{M4}$ and $R^{M5}$ each independently represent a hydrogen atom or a methyl group.

In addition, urethane acrylates described in JP1976-037193A (JP-S51-037193A), JP1990-032293B (JP-H02-032293B), JP1990-016765B (JP-H02-016765B), JP2003-344997A, and JP2006-065210A, urethane compounds having ethylene oxide-based skeletons described in JP1983-049860B (JP-S58-049860B), JP1981-017654B (JP-S56-017654B), JP1987-039417B (JP-S62-039417B), JP1987-039418B (JP-S62-039418B), JP2000-250211A, and JP2007-094138A, and urethane compounds having hydrophilic groups described in U.S. Pat. No. 7,153,632B, JP1996-505958A (JP-H08-505958A), JP2007-293221A, and JP2007-293223A are also preferred.

The content of the polymerizable compound is preferably in a range of 5% by mass to 75% by mass, more preferably in a range of 10% by mass to 70% by mass, and particularly preferably in a range of 15% by mass to 60% by mass of the total mass of the image-recording layer.

—Binder Polymer—

The image-recording layer that is used in the present disclosure preferably contains a binder polymer. The binder polymer is preferably a (meth)acrylic resin, a polyvinyl acetal resin, or a polyurethane resin. In the present specification, "(meth)acrylic" indicates "acrylic" and "methacrylic".

Among these, as the binder polymer, it is possible to preferably use well-known binder polymers that can be used in the image-recording layer in the lithographic printing plate precursor. As an example, a binder polymer that is used for an on-machine development-type lithographic printing plate precursor (hereinafter, also referred to as the binder polymer for on-machine development) will be described in detail.

As the binder polymer for on-machine development, a binder polymer having an alkylene oxide chain is preferred. The binder polymer having an alkylene oxide chain may have a poly(alkylene oxide) portion in a main chain or in a side chain. In addition, the binder polymer may be a graft polymer having poly(alkylene oxide) in a side chain or a block copolymer of a block constituted of a poly(alkylene oxide)-containing repeating unit and a block constituted of an (alkylene oxide)-non-containing repeating unit.

In the case of having a poly(alkylene oxide) portion in the main chain, the binder polymer is preferably a polyurethane resin. As a polymer in the main chain in a case in which the binder polymer has a poly(alkylene oxide) portion in the side chain, a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber are exemplified, and, particularly, a (meth)acrylic resin is preferred.

The alkylene oxide is preferably alkylene oxide having 2 to 6 carbon atoms and particularly preferably ethylene oxide or propylene oxide.

The number of times of repetition of the alkylene oxide in the poly(alkylene oxide) portion is preferably 2 to 120, more preferably 2 to 70, and still more preferably 2 to 50.

In a case in which the number of times of repetition of the alkylene oxide is 120 or less, neither the printing resistance against wear nor the printing resistance against the ink-receiving property degrades, which is preferable.

The poly(alkylene oxide) portion is preferably contained in a form of the structure represented by Formula (AO) as the side chain of the binder polymer and more preferably contained in a form of the structure represented by Formula (AO) as the side chain of the (meth)acrylic resin.

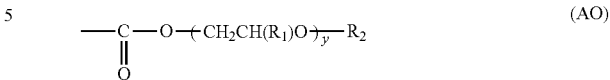

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms, and, a methyl group, an ethyl group, an n-propyl group, an isopropyl group, an n-butyl group, a sec-butyl group, an isobutyl group, a tert-butyl group, an n-pentyl group, an isopentyl group, neopentyl group, an n-hexyl group, an isohexyl group, a 1,1-dimethylbutyl group, a 2,2-dimethylbutyl group, a cyclopentyl group, and a cyclohexyl group are exemplified.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

The binder polymer may have a crosslinking property in order to improve the membrane hardness of an image area. In order to provide a crosslinking property to the polymer, a crosslinking functional group such as an ethylenically unsaturated bond may be introduced to a main chain or a side chain of a polymer. The crosslinking functional group may be introduced by copolymerization or may be introduced by a polymer reaction.

Examples of a polymer having an ethylenically unsaturated bond in the main chain of the molecule include poly-1,4-butadiene, poly-1,4-isoprene, and the like.

Examples of a polymer having an ethylenically unsaturated bond in the side chain of the molecule include polymers that are an ester or an amide of acrylic acid or methacrylic acid and in which a residue (R in —COOR or —CONHR) of the ester or the amide is a polymer having an ethylenically unsaturated bond.

Examples of the residue (the R) having an ethylenically unsaturated bond can include —$(CH_2)_n$$CR^{14}$=$CR^{24}$$R^{34}$, —$(CH_2O)_n$$CH_2$$CR^{14}$=$CR^{24}$$R^{34}$, —$(CH_2CH_2O)_n$$CH_2$$CR^{14}$=$CR^{24}$$R^{34}$, —$(CH_2)_n$NH—CO—O—$CH_2$$CR^{14}$=$CR^{24}$$R^{34}$, —$(CH_2)_n$—O—CO—$CR^{14}$=$CR^{24}$$R^{34}$, and —$(CH_2CH_2O)_2$—X (in the formulae, $R^{41}$ to $R^{43}$ each independently represent a hydrogen atom, a halogen atom, an alkyl group having 1 to 20 carbon atoms, an aryl group, an alkoxy group, or an aryloxy group, and $R^{41}$ and $R^{42}$ or $R^{43}$ may be bonded to each other to form a ring. n represents an integer of 1 to 10. X represents a dicyclopentadienyl residue.).

Specific examples of an ester residue include —$CH_2CH$=$CH_2$, —$CH_2CH_2O$—$CH_2CH$=$CH_2$, —$CH_2C(CH_3)$=$CH_2$, —$CH_2CH$=$CH$—$C_6H_5$, —$CH_2CH_2$OCOCH=CH—$C_6H_5$, —$CH_2CH_2$—NHCOO—$CH_2$CH=$CH_2$, and —$CH_2CH_2O$—X (in the formula, X represents a dicyclopentadienyl residue.).

Specific examples of an amide residue include —$CH_2CH$=$CH_2$, —$CH_2CH_2$—Y (in the formula, Y represents a cyclohexene residue.), and —$CH_2CH_2$—OCO—CH=$CH_2$.

The binder polymer having a crosslinking property is cured as follows: for example, a free radical (a polymerization initiation radical or a growth radical in a polymerization process of a polymerizable compound) is added to the crosslinking functional group, addition polymerization occurs between polymers directly or through the polymerization chain of the polymerizable compound, and a crosslink is formed between the polymer molecules, whereby the polymer is cured. Alternatively, an atom in the polymer (for example, a hydrogen atom on a carbon atom adjacent to the crosslinking functional group) is pulled off by a free radical, polymer radicals are generated, and the polymer radicals are bonded to each other, whereby a crosslink is formed between the polymer molecules, and the polymer is cured.

The content of the crosslinking group in the binder polymer (the content of an unsaturated double bond that is radical polymerizable by iodimetry) is preferably 0.1 mmol to 10.0 mmol, more preferably 1.0 mmol to 7.0 mmol, and still more preferably 2.0 mmol to 5.5 mmol per gram of the binder polymer from the viewpoint of a favorable sensitivity and a favorable storage stability.

Hereinafter, specific examples 1 to 11 of the binder polymer for on-machine development will be illustrated, but the present disclosure is not limited thereto. In the following exemplary compounds, numerical values described together with individual repeating units (numerical values described together with main chain repeating units) represent the molar percentages of the above-described repeating units. Numerical values described together with side chain repeating units represent the number of times of repetition of the above-described repeating portions. In addition, Me represents a methyl group, Et represents an ethyl group, and Ph represents a phenyl group.

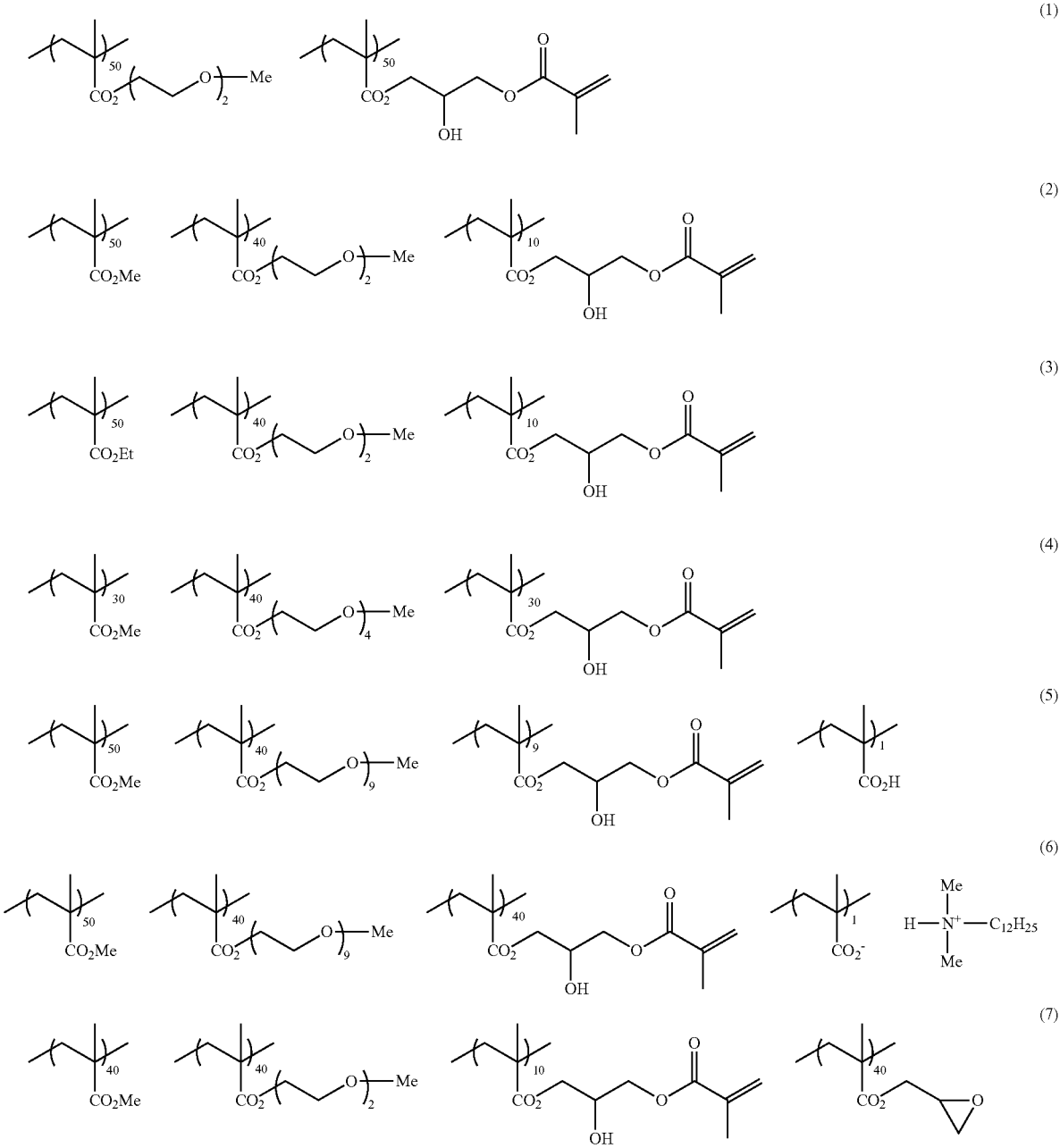

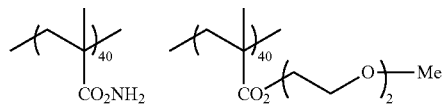
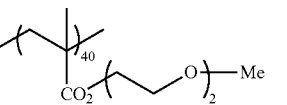
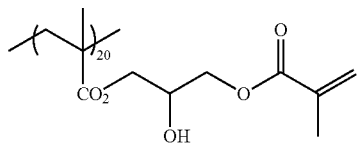

(8)

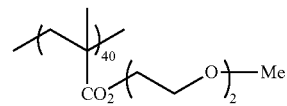
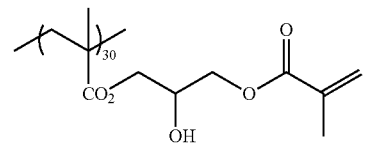

(9)

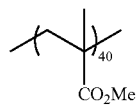
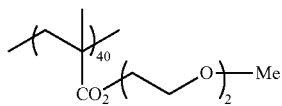
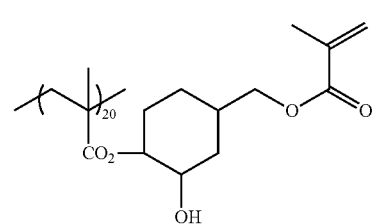

(10)

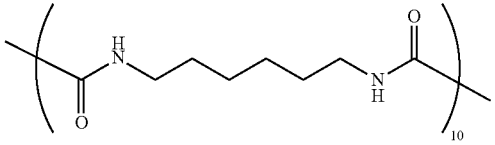

(11)

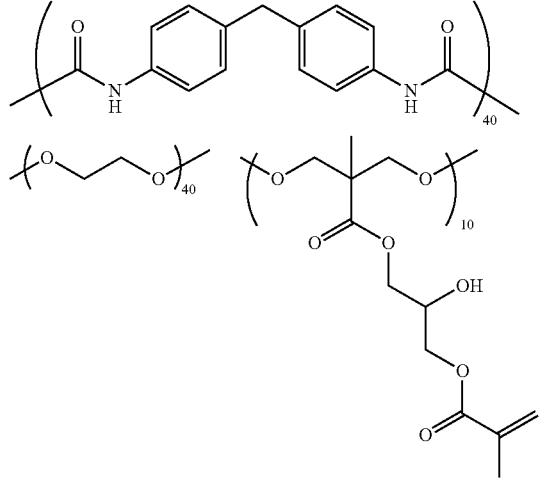

Regarding the molecular weight of the binder polymer, the weight-average molecular weight (Mw) as a polystyrene equivalent value by a GPC method is preferably 2,000 or more, more preferably 5,000 or more, and still more preferably 10,000 to 300,000.

If necessary, it is possible to jointly use a hydrophilic polymer such as polyacrylic acid or polyvinyl alcohol described in JP2008-195018A. In addition, it is also possible to jointly use a lipophilic polymer and a hydrophilic polymer.

The binder polymer may be present as a polymer that functions as a binder of the respective components or may be present in a particle shape in the image-recording layer. In a case in which the binder polymer is present in a particle shape, the average primary particle diameter is preferably 10 nm to 1,000 nm, more preferably 20 nm to 300 nm, and still more preferably 30 nm to 120 nm.

Meanwhile, a compound corresponding to the polymer particle is regarded not to correspond to the binder polymer.

In the image-recording layer that is used in the present disclosure, the binder polymer may be used singly or two or more binder polymers may be jointly used.

The binder polymer can be added to the image-recording layer in a random amount. The content of the binder polymer can be appropriately selected depending on the application or the like of the image-recording layer, but is preferably 1% by mass to 90% by mass and more preferably 5% by mass to 80% by mass of the total mass of the image-recording layer.

—Radical Production Aid—

The image-recording layer that is used in the present disclosure may contain a radical production aid. The radical production aid contributes to the improvement of the printing resistance of lithographic printing plates. Examples of the radical production aid include five kinds of radical production aids described below.

(i) Alkyl or arylate complexes: It is considered that carbon-hetero bonds are oxidatively cleaved and active radicals are generated. Specific examples thereof include borate compounds and the like.

(ii) Amino acetate compounds: It is considered that C—X bonds on carbon adjacent to nitrogen are cleaved due to oxidation and active radicals are generated. X is preferably a hydrogen atom, a carboxy group, a trimethylsilyl group, or a benzyl group. Specific examples thereof include N-phenylglycines (which may have a substituent in a phenyl group.), N-phenyl iminodiacetic acids (which may have a substituent in a phenyl group.), and the like.

(iii) Sulfur-containing compounds: The above-described amino acetate compounds in which a nitrogen atom is substituted with a sulfur atom are capable of generating active radicals by means of the same action. Specific examples thereof include phenylthioacetic acids (which may have a substituent in a phenyl group.) and the like.

(iv) Tin-containing compounds: The above-described amino acetate compounds in which a nitrogen atom is substituted with a tin atom are capable of generating active radicals by means of the same action.

(v) Sulfinates: Active radicals can be generated by means of oxidation. Specific examples thereof include sodium aryl sulfinate and the like.

Among these radical production aids, the image-recording layer preferably contains a borate compound. The borate compound is preferably a tetraaryl borate compound or a monoalkyltriaryl borate compound, more preferably a tetraaryl borate compound from the viewpoint of the stability of the compound and a potential difference described below, and particularly preferably a tetraaryl borate compound having one or more aryl groups having an electron-attracting group from the viewpoint of the potential difference described below.

The electron-attracting group is preferably a group having a positive Hammett σ value and more preferably a group having a Hammett σ value of 0 to 1.2. Hammett σ values (a σp value and a σm value) are described in detail in Hansch, C.; Leo, A.; Taft, R. W., Chem. Rev., 1991, 91, 165-195.

The electron-attracting group is preferably a halogen atom, a trifluoromethyl group, or a cyano group and more preferably a fluorine atom, a chlorine atom, a trifluoromethyl group, or a cyano group.

A counter cation in the borate compound is preferably an alkali metal ion or a tetraalkyl ammonium ion and more preferably a sodium ion, a potassium ion, or a tetrabutylammonium ion.

Specific examples of the borate compound include compounds illustrated below. Here, $X_c^+$ represents a monovalent cation and is preferably an alkali metal ion or a tetraalkyl ammonium ion and more preferably an alkali metal ion or a tetrabutylammonium ion. In addition, Bu represents an n-butyl group.

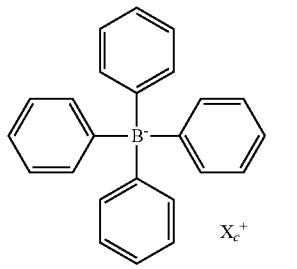

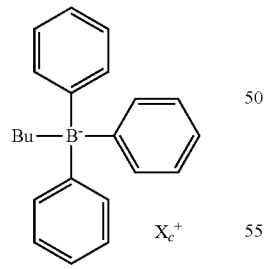

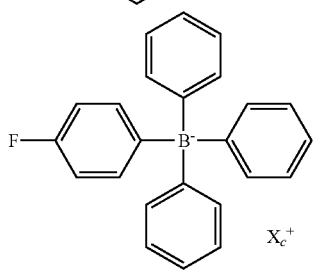

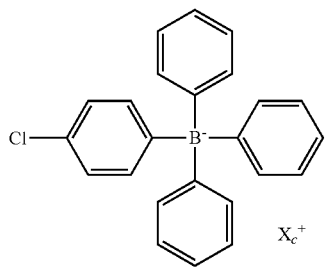

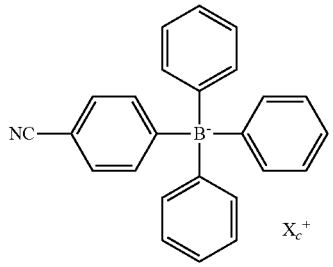

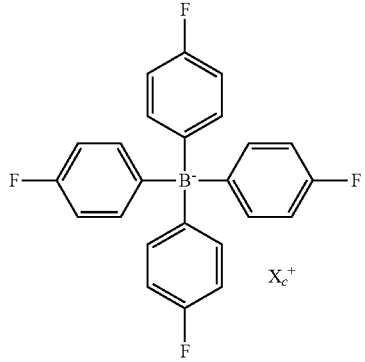

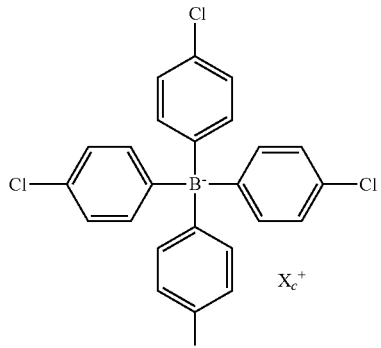

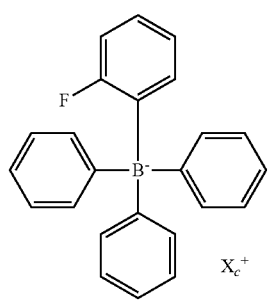

53
-continued
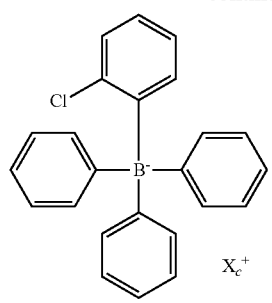
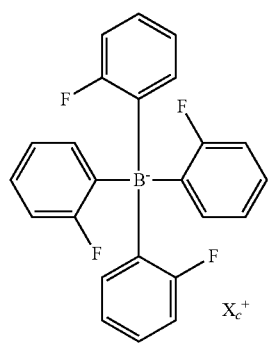
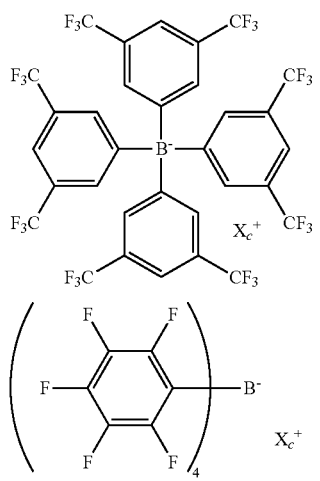
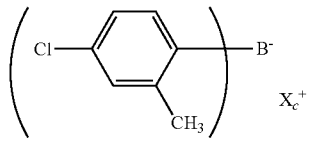
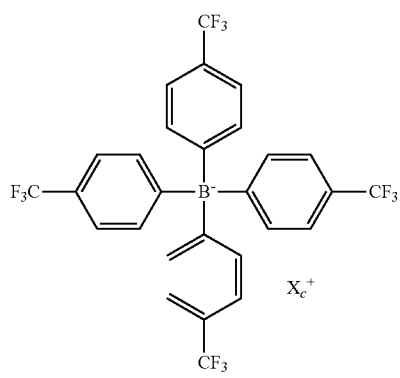
54
-continued
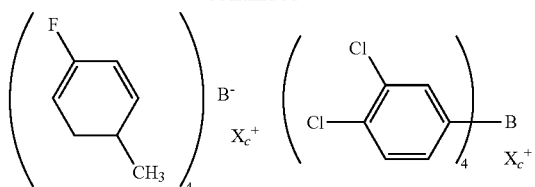
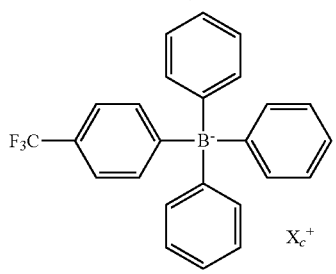
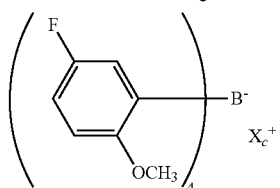
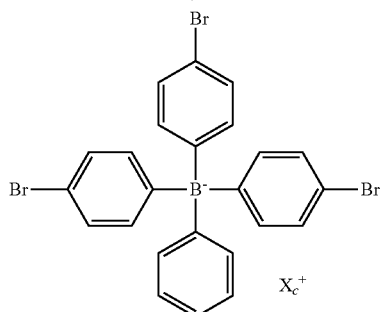
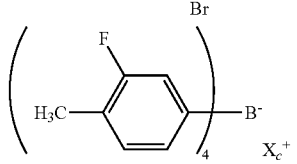
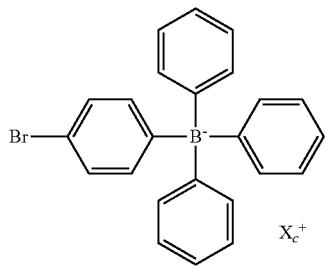
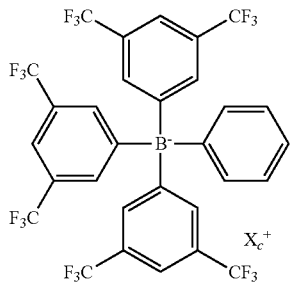

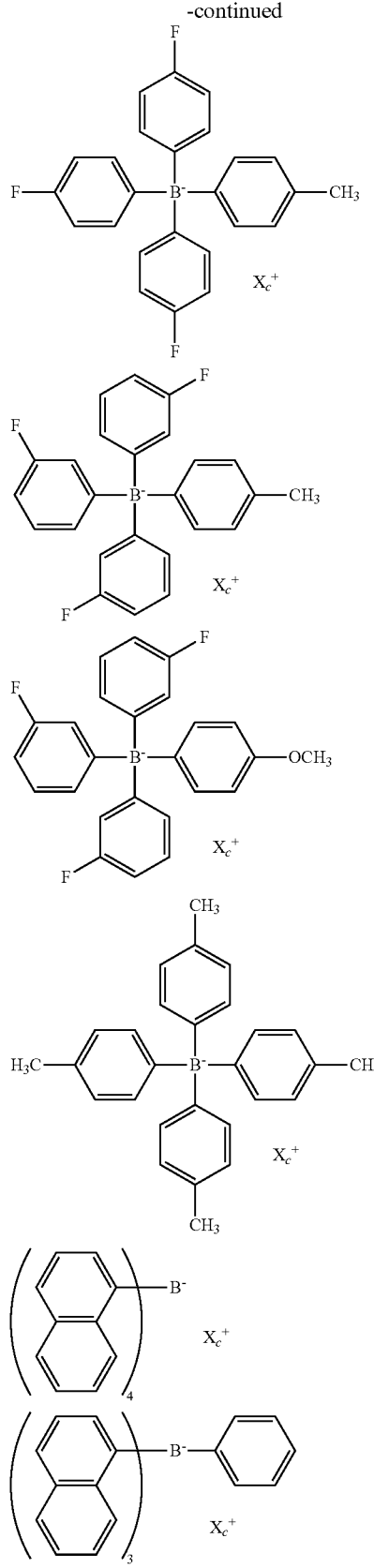

Only one radical production aid may be added or two or more radical production aids may be jointly used.

The content of the radical production aid is preferably 0.01% by mass to 30% by mass, more preferably 0.05% by mass to 25% by mass, and still more preferably 0.1% by mass to 20% by mass of the total mass of the image-recording layer.

—Chain Transfer Agent—

The image-recording layer that is used in the present disclosure may contain a chain transfer agent. The chain transfer agent contributes to the improvement of the printing resistance in lithographic printing plates.

The chain transfer agent is preferably a thiol compound, more preferably a thiol having 7 or more carbon atoms from the viewpoint of the boiling point (difficulty of being volatilized), and still more preferably a compound having a mercapto group on an aromatic ring (aromatic thiol compound). The thiol compound is preferably a monofunctional thiol compound.

Specific examples of the chain transfer agent include the following compounds.

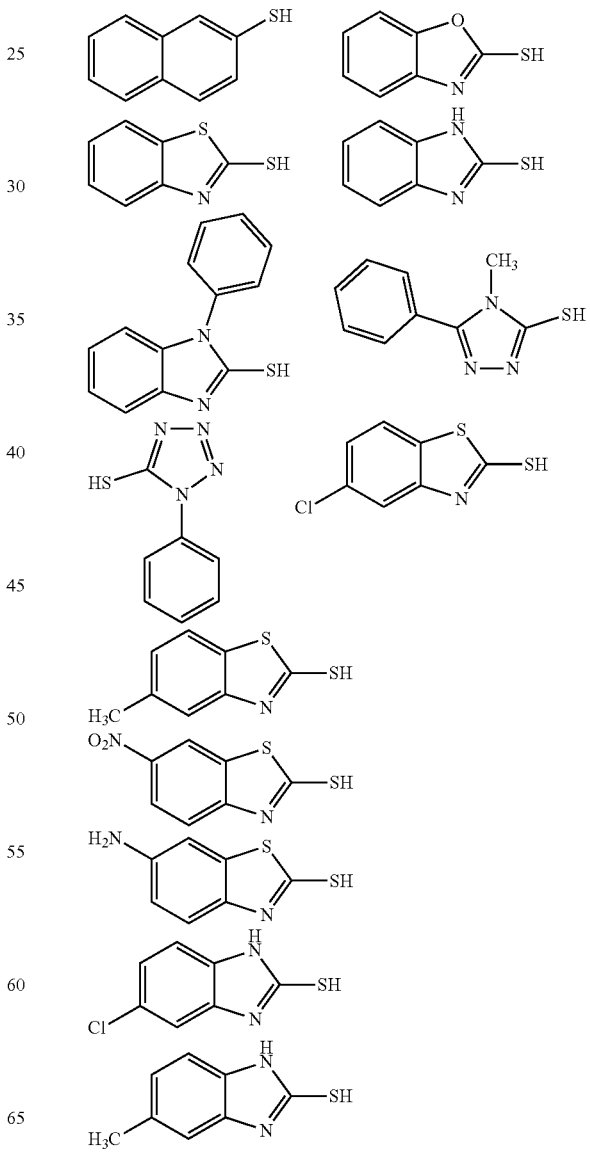

Only one chain transfer agent may be added or two or more chain transfer agents may be jointly used.

The content of the chain transfer agent is preferably 0.01% by mass to 50% by mass, more preferably 0.05% by mass to 40% by mass, and still more preferably 0.1% by mass to 30% by mass of the total mass of the image-recording layer.

—Additional Polymer Particle—

In order to improve the on-machine developability of the lithographic printing plate precursor, the image-recording layer may contain an additional polymer particle. The additional polymer particle is preferably a polymer particle capable of converting the image-recording layer to be hydrophobic in the case of being irradiated with heat. A polymer particle corresponding to the above-described polymer particle is regarded not to correspond to the other polymer particle. The additional polymer particle is preferably at least one selected from a hydrophobic thermoplastic polymer particle, a thermally reactive polymer particle, a polymer particle having a polymerizable group, a microcapsule including a hydrophobic compound, or a micro gel (cross-linking polymer particle). Among these, a polymer particle having a polymerizable group and a micro gel are preferred.

As the hydrophobic thermoplastic polymer particle, hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), EP931647B, and the like are preferably exemplified.

Specific examples of a polymer constituting the hydrophobic thermoplastic polymer particle include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and polymethyl methacrylate. The average particle diameter of the hydrophobic thermoplastic polymer particle is preferably in a range of 0.01 µm to 2.0 µm.

Examples of the thermally reactive polymer particle include a polymer particle having a thermally reactive group. The polymer particle having a thermally reactive group forms a hydrophobilized region through crosslinking by a thermal reaction and a change in a functional group at this time.

The thermally reactive group in the polymer particle having a thermally reactive group may be a functional group that causes any reactions as long as chemical bonds are formed, but is preferably a polymerizable group. Preferred examples thereof include ethylenically unsaturated groups that cause radical polymerization reactions (for example, acryloyl groups, methacryloyl groups, vinyl groups, allyl groups, and the like), cationic polymerizable groups (for example, vinyl groups, vinyloxy groups, epoxy groups, oxetanyl groups, and the like), isocyanato groups that cause addition reactions or blocked bodies thereof, epoxy groups, vinyloxy groups, functional groups having active hydrogen atoms that are reaction partners thereof (for example, amino groups, hydroxy groups, carboxy groups, and the like), carboxy groups that cause condensation reactions, hydroxy groups or amino groups that are reaction partners, acid anhydrides that cause ring-opening addition reactions, amino groups or hydroxy groups which are reaction partners, and the like.

Examples of the microcapsules include microcapsules including all or part of the constituent components of the image-recording layer as described in JP2001-277740A and JP2001-277742A. The constituent components of the image-recording layer can also be added outside the microcapsules. A preferred aspect of the image-recording layer including the microcapsules is an image-recording layer including hydrophobic constituent components in the microcapsules and including hydrophilic constituent components outside the microcapsules.

Micro gels (crosslinking polymer particles) are capable of containing some of the constituent components of the image-recording layer at least one of in the inside or on the surface thereof. Particularly, an aspect of micro capsules that have radical polymerizable groups on the surfaces and thus turn into reactive micro gels is preferred from the viewpoint of image-forming sensitivity or printing resistance.

In order to put the constituent components of the image-recording layer into microcapsules or micro gels, well-known methods can be used.

The average particle diameter of the microcapsules or the micro gels is preferably in a range of 0.01 m to 3.0 µm, more preferably in a range of 0.05 µm to 2.0 µm, and particularly preferably in a range of 0.10 µm to 1.0 µm. Within this range, favorable resolution and temporal stability can be obtained.

The content of the polymer particle is preferably 5% by mass to 90% by mass of the total mass of the image-recording layer.

—Low-Molecular-Weight Hydrophilic Compound—

In order to improve the on-machine developability while suppressing the degradation of printing resistance, the image-recording layer may contain a low-molecular-weight hydrophilic compound. The low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

As the low-molecular-weight hydrophilic compound, at least one selected from polyols, organic sulfates, organic sulfonates, or betaines is preferably contained.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers of polyethylene oxides. The number of ethylene oxide units is preferably in a range of 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is in a range of 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic properties or membrane hardness of the image areas degrade, and it is possible to favorably maintain the ink-receiving properties and printing resistance of the image-recording layer.

The content of the low-molecular-weight hydrophilic compound is preferably in a range of 0.5% by mass to 20% by mass, more preferably in a range of 1% by mass to 15% by mass, and still more preferably in a range of 2% by mass to 10% by mass of the total mass of the image-recording layer. In a case in which the content is in this range, favorable on-machine developability and favorable printing resistance can be obtained.

The low-molecular-weight hydrophilic compound may be used singly or two or more low-molecular-weight hydrophilic compounds may be used in a mixture form.

—Sensitization Agent—

In order to improve the ink-absorbing property, the image-recording layer may contain a sensitization agent such as a phosphonium compound, a nitrogen-containing low-molecular-weight compound, or an ammonium group-containing polymer. Particularly, in a case in which an inorganic lamellar compound is contained in the protective layer, these compounds function as surface coating agents for the inorganic lamellar compound and are capable of suppressing the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a phosphonium compound include phosphonium compounds described in JP2006-297907A and JP2007-050660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in Paragraphs 0021 to 0037 of JP2008-284858A and Paragraphs 0030 to 0057 of JP2009-090645A, and the like.

The ammonium group-containing polymer needs to have an ammonium group in the structure, and polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably in a range of 5 to 120, more preferably in a range of 10 to 110, and particularly preferably in a range of 15 to 100. In a case in which the reducing specific viscosity is converted to the weight-average molecular weight (Mw), the weight-average molecular weight is preferably in a range of 10,000 to 150,000, more preferably in a range of 17,000 to 140,000, and particularly preferably in a range of 20,000 to 130,000.

Hereinafter, specific examples of the ammonium group-containing polymer will be described.

(1) 2-(Trimethylammonio)ethyl methacrylate=p-toluenesulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methyl sulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably in a range of 0.01% by mass to 30.0% by mass, more preferably in a range of 0.1% by mass to 15.0% by mass, and still more preferably in a range of 1% by mass to 10% by mass of the total mass of the image-recording layer.

—Acid Color Developing Agent—

The image-recording layer that is used in the present disclosure preferably includes an acid color developing agent.

The "acid color developing agent" that is used in the present disclosure refers to a compound having a property of developing color by being heated in a state of receiving an electron-receiving compound (for example, a proton such as an acid). The acid color developing agent is particularly preferably a colorless compound which has a partial skeleton such as lactone, lactam, sultone, spiropyran, an ester, or an amide and in which the partial skeleton rapidly ring-opens or cleavages in the case of coming into contact with the electron-receiving compound.

Examples of the above-described acid color developing agent include phthalides such as 3,3-bis(4-dimethylaminophenyl)-6-dimethylaminophthalide (referred to as "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazole-3-yl)-6-dimethylaminophthalide, 3,3-bis(2-phenylindol-3-yl)-6-dimethylaminophthalide, 3-(4-dimethylaminophenyl)-3-(1-methylpyrrole-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-bis(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachlorophthalide, 3,3-bis[1-(4-pyrrolidinophenyl)-1-(4-methoxyphenyl)ethylene-2-yl]-4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl)ethylene-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, fluoranthenes such as 4,4-bis-dimethylaminobenzhydryl benzyl ether, N-halophenyl-leucoauramine, N-2,4,5-trichlorophenyl leucoauramine, rhodamine-B-anilinolactam, rhodamine-(4-nitroanilino) lactam, rhodamine-B-(4-chloroanilino) lactam, 3,7-bis(diethylamino)-10-benzoylphenoxazine, benzoyl leuco methylene blue, 4-nitrobenzoylmethylene blue, 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluorane, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluorane, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-ethylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-ethylamino-6-methyl-7-anilinofluoran, 3-N-(3'-ethoxypropyl)-N-methylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluran, 3-diethylamino-6-methyl-7-(3'-methylphenylamino)fluoran, 3-diethylamino-6-methyl-7-(2',6'-methylphenylamino)fluoran, 3-di-n-butylamino-6-methyl-7-(2',6'-methylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)] amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, additionally, 2'-anilino-6'-(N-ethyl-N-isopentyl)amino-3'-methylspiro[isobenzofuran-1 (3H), 9'-(9H) xanthene]-3-one, 2'-anilino-6'-(N-ethyl-N-(4-methylphenyl))amino-3'-methylspiro [isobenzofuran-1 (3H), 9'-(9H) xanthene]-3-one, 3'-N,N-dibenzylamino-6'-N,N-diethylaminospiro[isobenzofuran-1 (3H), 9'-(9H) xanthene]-3-one, 2'-(N-methyl-N-phenyl)amino-6'-(N-ethyl-N-(4-methylphenyl))aminospiro[isobenzofuran-1 (3H), 9'-(9H) xanthene]-3-one, and the like.

Among these, the acid color developing agent that is used in the present disclosure is preferably at least one compound selected from the group consisting of a spiropyran compound, a spirooxazine compound, a spirolactone compound, or a spirolactam compound.

The hue of the colorant after color development is preferably green, blue, or black from the viewpoint of visibility.

As the acid color developing agent, it is also possible to use commercially available products, and examples thereof include ETAC, RED 500, RED 520, CVL, S-205, BLACK 305, BLACK 400, BLACK 100, BLACK 500, H-7001, GREEN 300, NIRBLACK 78, BLUE 220, H-3035, BLUE 203, ATP, H-1046, H-2114 (all manufactured by Fukui Yamada Chemical Co., Ltd.), ORANGE-DCF, Vermilion-DCF, PINK-DCF, RED-DCF, BLMB, CVL, GREEN-DCF, TH-107 (all manufactured by Hodogaya Chemical Co., Ltd.), ODB, ODB-2, ODB-4, ODB-250, ODB-Black XV, Blue-63, Blue-502, GN-169, GN-2, Green-118, Red-40, Red-8 (all manufactured by Yamamoto Chemicals Inc.), crystal violet lactone (manufactured by Tokyo Chemical Industry Co., Ltd.), and the like. Among these commercially available products, ETAC, S-205, BLACK 305, BLACK 400, BLACK 100, BLACK 500, H-7001, GREEN 300, NIRBLACK 78, H-3035, ATP, H-1046, H-2114, GREEN-DCF, Blue-63, GN-169, and crystal violet lactone are preferred since the visible light absorbance of films to be formed is favorable.

These acid color developing agents may be used singly, or two or more components can also be used in combination.

—Coloring Agent—

The image-recording layer in the lithographic printing plate precursor of the embodiment of the present disclosure may contain a dye having a high absorption in the visible light range as a coloring agent of images. Specific examples thereof include OIL YELLOW #101, OIL YELLOW #103, OIL PINK #312, OIL GREEN BG, OIL BLUE BOS, OIL BLUE #603, OIL BLACK BY, OIL BLACK BS, OIL BLACK T-505 (all manufactured by Orient Chemical Industries, Ltd.), VICTORIA PURE BLUE, CRYSTAL VIOLET (CI42555), METHYL VIOLET (CI42535), ETHYL VIOLET, ETHYL VIOLET 6HNAPS, RHODAMINE B (CI145170B), MALACHITE GREEN (CI42000), METHYLENE BLUE (CI52015), and dyes described in JP1987-293247A (JP-S62-293247A). In addition, pigments such as phthalocyanine-based pigment, azo-based pigments, carbon black, and titanium oxide can also be preferably used. The image-recording layer preferably contains a coloring agent since it becomes easy to differentiate an image area and a non-image area after the formation of an image in the case of containing the coloring agent.

The amount of the coloring agent added is preferably 0.005% by mass to 10% by mass of the total mass of the image-recording layer.

—Other Components—

To the image-recording layer, it is possible to add, as other components, a surfactant, a polymerization inhibitor, a higher-fatty acid derivative, a plasticizer, inorganic particles, an inorganic lamellar compound, or the like. Specifically, the composition may contain individual components described in Paragraphs 0114 to 0159 of JP2008-284817A.

—Formation of Image-Recording Layer—

The image-recording layer in the lithographic printing plate precursor according to the embodiment of the present disclosure can be formed by, for example, as described in Paragraphs 0142 and 0143 of JP2008-195018A, preparing a coating fluid by dispersing or dissolving the respective necessary components described above in a well-known solvent, applying the coating fluid onto a support using a well-known method such as bar coater coating, and drying the coating fluid. The coating amount (solid content) of the image-recording layer applied after application and drying varies depending on applications; however, is preferably 0.3 g/m$^2$ to 3.0 g/m$^2$. Within this range, a favorable sensitivity and favorable membrane characteristics of the image-recording layer can be obtained.

<Hydrophilic Support>

The hydrophilic support in the lithographic printing plate precursor according to the embodiment of the present disclosure (hereinafter, also simply referred to as "support".) can be appropriately selected from well-known hydrophilic supports for a lithographic printing plate precursor and used. The hydrophilic support is preferably an aluminum plate which has been roughened using a well-known method and anodized.

On the aluminum plate, as necessary, enlargement processes or sealing processes of micropores in anodized films described in JP2001-253181A and JP2001-322365A, surface hydrophilization processes using alkali metal silicate as described in the specifications of U.S. Pat. Nos. 2,714,066A, 3,181,461A, 3,280,734A, and 3,902,734A, and surface hydrophilization processes using polyvinyl phosphate or the like as described in the specifications of U.S. Pat. Nos. 3,276,868A, 4,153,461A, and 4,689,272A may be appropriately selected and carried out.

In the support, the center line average roughness is preferably in a range of 0.10 μm to 1.2 μm.

The support may have, as necessary, a backcoat layer including an organic polymer compound described in JP1993-045885A (JP-H05-045885A) or an alkoxy compound of silicon described in JP1994-035174A (JP-H06-035174A) on the surface opposite to the image-recording layer.

<Undercoat Layer>

The lithographic printing plate precursor according to the embodiment of the disclosure preferably has an undercoat layer (in some cases, referred to as the interlayer) between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, —$PO_3H_2$, —$OPO_3H_2$, —$CONHSO_2$—, —SO$_2$NHSO$_2$—, —COCH$_2$COCH$_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having the polar substituents and opposite charges of the above-described polar substituents and ethylenically unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenically unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenically unsaturated bond groups in the polymer that is used in the undercoat layer is preferably in a range of 0.1 mmol to 10.0 mmol and more preferably in a range of 0.2 mmol to 5.5 mmol per gram of the polymer.

The weight-average molecular weight (Mw) of the polymer that is used in the undercoat layer is preferably 5,000 or higher and more preferably in a range of 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably in a range of 0.1 mg/m$^2$ to 100 mg/m$^2$ and more preferably in a range of 1 mg/m$^2$ to 30 mg/m$^2$.

<Protective Layer>

The lithographic printing plate precursor according to the embodiment of the disclosure preferably has a protective layer (in some cases, also referred to as the overcoat layer) on the image-recording layer. The protective layer has a function of suppressing image formation-inhibiting reactions caused by the shielding of oxygen and additionally has a function of preventing the generation of damage in the image-recording layer and abrasion prevention during exposure using high-illuminance lasers.

Protective layers having the above-described characteristics are described in, for example, the specification of U.S. Pat. No. 3,458,311A and JP1980-049729B (JP-S55-049729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance oxygen-shielding properties. The inorganic lamellar compounds refer to particles having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: A(B, C)$_{2-5}$D$_4$O$_{10}$(OH, F, O)$_2$ [here, A is any of K, Na, or Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite KMg$_3$(AlSi$_3$O$_{10}$)F$_2$, potassium tetrasilic mica KMg$_{2.5}$(Si$_4$O$_{10}$)F$_2$, and, Na tetrasilylic mica NaMg$_{2.5}$(Si$_4$O$_{10}$)F$_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

Among the above-described mica compounds, fluorine-based swelling mica is particularly useful. That is, swelling synthetic mica has a laminate structure consisting of unit crystal lattice layers having a thickness in a range of approximately 10 Å to 15 Å (IA is equal to 0.1 nm), and metal atoms in lattices are more actively substituted than in any other clay minerals. As a result, positive charges are deficient in the lattice layers, and positive ions such as Li$^+$, Na$^+$, Ca$^{2+}$, and Mg$^{2+}$ are adsorbed between the layers in order to compensate for the deficiency. Positive ions interposed between the layers are referred to as exchangeable positive ions and are exchangeable with various positive ions. Particularly, in a case in which the positive ions between the layers are Li$^+$ and Na$^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably in a range of 0.3 µm to 20 µm, more preferably in a range of 0.5 µm to 10 µm, and particularly preferably in a range of 1 µm to 5 µm. The average thickness of the particles is preferably 0.1 µm or smaller, more preferably 0.05 µm or smaller, and particularly preferably 0.01 µm or smaller. Specifically, for example, in the case of swelling synthetic mica which is a typical compound, a preferred aspect has a thickness in a range of approximately 1 nm to 50 nm and a surface size (long diameter) in a range of approximately 1 µm to 20 µm.

The content of the inorganic lamellar compound is preferably in a range of 0% by mass to 60% by mass and more preferably in a range of 3% by mass to 50% by mass of the total solid content of the protective layer. Even in a case in which multiple kinds of inorganic lamellar compounds are jointly used, the total amount of the inorganic lamellar compounds is preferably the above-described content. Within the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and inorganic particles for controlling sliding properties on the surface. In addition, the sensitization agent described in the section of the image-recording layer may be added to the protective layer.

The protective layer is formed using a well-known coating method. The coating amount of the protective layer (solid content) is preferably in a range of 0.01 $g/m^2$ to 10 $g/m^2$, more preferably in a range of 0.02 $g/m^2$ to 3 $g/m^2$, and particularly preferably in a range of 0.02 $g/m^2$ to 1 $g/m^2$.

(Method for Producing Lithographic Printing Plate)

A lithographic printing plate can be produced by exposing the lithographic printing plate precursor of the embodiment of the present disclosure in an image shape to carry out a development process.

An embodiment of a method for producing a lithographic printing plate according to an embodiment of the present disclosure includes an exposure step of exposing the lithographic printing plate precursor according to the embodiment of the present disclosure in an image shape and forming an exposed portion and a non-exposed portion and an on-machine development step of removing the non-exposed portion by supplying at least one of printing ink or dampening water in this order.

In addition, another embodiment of the method for producing a lithographic printing plate according to the embodiment of the present disclosure includes an exposure step of exposing the lithographic printing plate precursor according to the embodiment of the present disclosure in an image shape and forming an exposed portion and a non-exposed portion and a development step of removing the non-exposed portion by supplying a developer having pH of 2 or higher and 11 or lower in this order.

Hereinafter, regarding the method for producing a lithographic printing plate according to the embodiment of the present disclosure and a lithographic printing method according to an embodiment of the present disclosure, preferred aspects of the respective steps will be sequentially described. Meanwhile, the lithographic printing plate precursor of the embodiment of the present disclosure can also be developed using a developer.

<Exposure Step>

The method for producing a lithographic printing plate according to the embodiment of the present disclosure preferably includes an exposure step of exposing the lithographic printing plate precursor according to the embodiment of the present disclosure in an image shape and forming an exposed portion and a non-exposed portion. The lithographic printing plate precursor according to the embodiment of the present disclosure is preferably exposed in an image shape by laser exposure through a transparent original image having a linear image, a halftone dot image, or the like or by laser light exposure according to digital data.

As the wavelength of a light source, a range of 750 nm to 1,400 nm is preferably used. The light source having a wavelength in a range of 750 nm to 1,400 nm is preferably a solid-state laser or a semiconductor laser that radiates infrared rays. Regarding an infrared laser, the output is preferably 100 mW or more, the exposure time per pixel is preferably 20 microseconds or shorter, and the irradiation energy amount is preferably 10 $mJ/cm^2$ to 300 $mJ/cm^2$. In addition, in order to shorten the exposure time, a multibeam laser device is preferably used. The exposure mechanism may be any one of an in-plane drum method, an external surface drum method, a flat head method, or the like.

The image exposure can be carried out using a platesetter or the like and an ordinary method. In the case of on-machine development, image exposure may be carried out on a printer after the lithographic printing plate precursor is mounted on the printer.

<On-Machine Development Step and Development Step>

The method for producing a lithographic printing plate according to the embodiment of the present disclosure preferably includes an on-machine development step of removing the non-exposed portion by supplying at least one of printing ink or dampening water in this order.

In addition, the method for producing a lithographic printing plate according to the embodiment of the present disclosure may be carried out using a development method using a developer (developer treatment method).

For example, for the method for producing a lithographic printing plate according to the embodiment of the present disclosure, a development step of removing the non-exposed portion by supplying a developer having pH of 2 or higher and 11 or lower is exemplified.

Hereinafter, the on-machine development method will be described.

—On-Machine Development Method—

In the on-machine development method, a lithographic printing plate is preferably produced by supplying oil-based ink and an aqueous component to the lithographic printing plate precursor exposed in an image shape on a printer and removing an image-forming layer in a non-image area.

That is, in a case in which the lithographic printing plate precursor is exposed in an image shape and then mounted as it is in a printer without carrying out any development process or the lithographic printing plate precursor is mounted in a printer, then, exposed in an image shape on a printer, and subsequently supplied with oil-based ink and an aqueous component to carry out printing, in an initial stage in the middle of printing, a non-cured image-forming layer in a non-image area is dissolved or dispersed by any or both of the supplied oil-based ink and aqueous component so as to be removed, and the hydrophilic surface is exposed in the removed portion. On the other hand, in an exposed portion, an image-forming layer cured by exposure forms an oil-based ink-receiving portion having a lipophilic surface. Any of the oil-based ink or the aqueous component may be supplied to the surface of the plate in the beginning; however, from the viewpoint of preventing the aqueous component from being contaminated by a component of the image-forming layer from which the aqueous component is removed, the oil-based ink is preferably supplied in the beginning. In the above-described manner, the lithographic printing plate precursor is on-machine-developed on the printer and is used as it is for printing a number of pieces of paper. As the oil-based ink and the aqueous component, ordinary printing ink and ordinary dampening water for lithographic printing are preferably used.

—Developer Process Method—

The lithographic printing plate precursor according to the embodiment of the present disclosure can be used to produce lithographic printing plates by means of a development process in which a developer is used by appropriately selecting the binder polymer and the like which are the constituent components of the image-recording layer. Examples of the development process in which a developer is used include an aspect in which a developer having a pH of 2 to 11 which may contain at least one compound selected from the group consisting of a surfactant and a water-soluble polymer compound is used (also referred to as simple development process).

In a case in which a water-soluble polymer compound is added to the developer as necessary, it is possible to carry out development and the gum liquid process step at the same time. Therefore, the post water washing step is not particularly necessary, and it is possible to carry out the drying step after carrying out development and the gum liquid process in a single step using a single liquid. Therefore, the development process in which a developer is used is preferably a method for producing a lithographic printing plate including a step of developing the image-exposed lithographic printing plate precursor using a developer having a pH of 2 to 11. After the development process, it is preferable to remove the excess developer using a squeeze roller and then dry the lithographic printing plate precursor.

That is, in the development step of the method for producing a lithographic printing plate according to the embodiment of the present disclosure, it is preferable to carry out the development process and the gum liquid process in a single step using a single liquid.

Carrying out the development process and the gum liquid process in a single step using a single liquid means that the development process and the gum liquid process are not carried out as separate steps, but the development process and the gum liquid process are carried out in a single step using a single liquid.

The development process can be preferably carried out using means for supplying the developer and an automatic development processor comprising a rubbing member. The rubbing member is particularly preferably an automatic development processor in which a rotary brush roll is used.

The number of the rotary brush rolls is preferably two or more. Furthermore, the automatic development processor preferably comprises, after the development process means, means for removing an excess developer such as a squeeze roller or drying means such as a hot air device. In addition, the automatic development processor may comprise, before the development process means, preheating means for heating the image-exposed lithographic printing plate precursor.

A process in the above-described automatic development processor has an advantage that there is no need for coping with development scum derived from the protective layer/an image-recording layer that is generated in the case of so-called on-machine development process.

In the development step, in the case of a manual process, as a development process method, for example, a method in which an aqueous solution is soaked into a sponge or an absorbent cotton, the lithographic printing plate precursor is processed while rubbing the entire surface of the plate with the sponge or the absorbent cotton, and, after the end of the process, the lithographic printing plate precursor is dried is preferably exemplified. In the case of an immersion process, for example, a method in which the lithographic printing plate precursor is immersed in a pad or a deep tank filled with an aqueous solution and stirred for approximately 60 seconds and then dried while being rubbed with an absorbent cotton, a sponge, or the like is preferably exemplified.

In the development process, a device having a simplified structure and a simplified step is preferably used.

In the alkali development process, the protective layer is removed by the prior water washing step, next, development is carried out using an alkaline developer having a high pH, after that, an alkali is removed in the post water washing step, a gum process is carried out in a gum-pulling step, and the lithographic printing plate precursor is dried in the drying step.

In the simple development process, it is possible to carry out development and gum pulling at the same time using a single liquid. Therefore, it becomes possible not to provide the post water washing step and the gum process step, and it is preferable to carry out development and gum pulling (gum liquid process) using a single liquid and then carry out the drying step as necessary.

Furthermore, it is preferable to carry out the removal of the protective layer, development, and gum pulling at the same time using a single liquid without carrying out the prior water washing step. In addition, it is preferable to, after development and gum pulling, remove the excess developer using a squeeze roller and then dry the lithographic printing plate precursor.

In the development step, a method in which the lithographic printing plate precursor is immersed in the developer once or a method in which the lithographic printing plate precursor is immersed in the developer twice or more may be used. Among these, a method in which the lithographic printing plate precursor is immersed in the developer once or twice is preferred.

For the immersion, the exposed lithographic printing plate precursor may be immersed in a developer tank filled with the developer or the developer may be blown onto the plate surface of the exposed lithographic printing plate precursor by means of spraying or the like.

Meanwhile, even in the case of immersing the lithographic printing plate precursor in the developer twice or more, a case in which the lithographic printing plate precursor is immersed twice or more in the same developer or a developer and another developer (tired liquid) in which the components of the image-recording layer are dissolved or dispersed due to the development process is regarded as the development process using a single liquid (single liquid process).

In the development process, a rubbing member is preferably used, and, in a development bath for removing the non-image area of the image-recording layer, the rubbing member such as a brush is preferably installed.

The development process can be carried out according to an ordinary method at a temperature of preferably 0° C. to 60° C. and more preferably 15° C. to 40° C. by, for example, immersing the exposed lithographic printing plate precursor in the developer and rubbing the lithographic printing plate precursor with a brush or drawing a process liquid prepared in an external tank using a pump, blowing the process liquid to the lithographic printing plate precursor from a spray nozzle, and rubbing the lithographic printing plate precursor with a brush. This development process can be continuously carried out a plurality of times. For example, after a developer prepared in an external tank is drawn using a pump and blown to the lithographic printing plate precursor from a spray nozzle, and the lithographic printing plate precursor is rubbed with a brush, again, it is possible to blow the developer from the spray nozzle and rub the lithographic printing plate precursor with the brush. In the case of carrying out the development process using an automatic developing machine, the developer becomes more tired due to an increase in the process amount, and thus it is preferable to restore the process capability using a supplementary liquid or a fresh developer.

In the development process, it is also possible to use a gum coater or an automatic developing machine that has been known in the related art for presensitized plates (PS plates) and computer to plates (CTP). In the case of using an automatic developing machine, for example, it is possible to apply any method of a method in which a developer prepared in a development tank or a developer prepared in an external tank is drawn using a pump and blown to a lithographic printing plate precursor from a spray nozzle, a method in which a printing plate is immersed and transported in a liquid in a tank filled with a developer using a guide roll or the like, or a so-called single-use process method in which only a necessary amount of a substantially unused developer is supplied to each plate and is processed. In any of the methods, a rubbing mechanism such as a brush or a moulton roller is more preferably provided. For example, it is possible to use commercially available automatic developing machines (Clean Out Unit C85/C125, Clean-Out Unit+C85/120, FCF 85V, FCF 125V, FCF News (manufactured by Glunz & Jensen), AZURA CX85, AZURA CX125, AZURA CX150 (manufactured by AGFA GRAPHICS). In addition, it is also possible to use a device into which a laser-exposed portion and an automatic developing machine portion are integrally combined.

The details of components and the like of the developer that is used in the development step will be described below.

[pH]

The pH of the developer is preferably 2 to 11, more preferably 5 to 9, and still more preferably 7 to 9. From the viewpoint of developability or the dispersibility of the image-recording layer, it is advantageous to set the value of pH to be high; however, regarding a printing property, particularly, the suppression of stain, it is effective to set the value of pH to be low.

Here, the pH is a value that is measured at 25° C. using a pH meter (model No.: HM-31, manufactured by DKK-Toa Corporation).

[Surfactant]

The developer may contain a surfactant such as an anionic surfactant, a nonionic surfactant, a cationic surfactant, or an amphoteric surfactant.

From the viewpoint of a blanket stain property, the developer preferably includes at least one selected from the group consisting of an anionic surfactant and an amphoteric surfactant.

In addition, the developer preferably includes a nonionic surfactant and more preferably includes a nonionic surfactant and at least one selected from the group consisting of an anionic surfactant and an amphoteric surfactant.

As the anionic surfactant, a compound represented by Formula (I) is preferably exemplified.

$$R^1-Y^1-X^1 \quad (I)$$

In Formula (I), $R^1$ represents an alkyl group, a cycloalkyl group, an alkenyl group, an aralkyl group, or an aryl group which may have a substituent.

As the alkyl group, for example, an alkyl group having 1 to 20 carbon atoms is preferred, and, specifically, a methyl group, an ethyl group, a propyl group, an n-butyl group, a sec-butyl group, a hexyl group, a 2-ethylhexyl group, an octyl group, a decyl group, a dodecyl group, a hexadecyl group, a stearyl group, and the like can be preferably exemplified.

The cycloalkyl group may be a monocyclic cycloalkyl group or a polycyclic cycloalkyl group. As the monocyclic cycloalkyl group, a monocyclic cycloalkyl group having 3 to 8 carbon atoms is preferred, and a cyclopropyl group, a cyclopentyl group, a cyclohexyl group, or a cyclooctyl group is more preferred. As the polycyclic cycloalkyl group, for example, an adamantyl group, a norbornyl group, an isobornyl group, a camphanyl group, a dicyclopentyl group, an α-pinel group, a tricyclodecanyl group, and the like can be preferably exemplified.

As the alkenyl group, for example, an alkenyl group having 2 to 20 carbon atoms is preferred, and, specifically, a vinyl group, an allyl group, a butenyl group, a cyclohexenyl group, and the like can be preferably exemplified.

As the aralkyl group, for example, an aralkyl group having 7 to 12 carbon atoms is preferred, and, specifically, a benzyl group, a phenethyl group, a naphthylmethyl group, and the like can be preferably exemplified.

As the aryl group, for example, an aryl group having 6 to 15 carbon atoms is preferred, and, specifically, a phenyl group, a tolyl group, a dimethylphenyl group, a 2,4,6-trimethylphenyl group, a naphthyl group, an anthryl group, a 9,10-dimethoxyanthryl group, and the like can be preferably exemplified.

As the substituent, monovalent non-metal atomic groups excluding a hydrogen atom are used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, a sulfonic acid anion group, and the like.

As specific examples of the alkoxy group in the substituent, alkoxy groups preferably having 1 to 40 carbon atoms and more preferably having 1 to 20 carbon atoms such as a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group are exemplified. As the aryloxy group, aryloxy groups having 6 to 18 carbon atoms such as a phenoxy group, a tolyloxy group, a xylyloxy group, a mesityloxy group, a cumenyl oxy group, a methoxyphenyloxy group, an ethoxyphenyloxy group, a chlorophenyloxy group, a bromophenyloxy group, and a naphthyloxy group are exemplified. As the acyl group, acyl groups having 2 to 24 carbon atoms such as an acetyl group, a propanoyl group, a butanoyl group, a benzoyl group, and a naphthoyl group are exemplified. As the amide group, amide groups having 2 to 24 carbon atoms such as an acetamide group, a propionic acid amide group, a dodecanoic acid amide group, a palmitic acid amide group, a stearic acid amide group, a benzoic acid amide group, and a naphthoic acid amide group are exemplified. As the acyloxy group, acyloxy groups having 2 to 20 carbon atoms such as an acetoxy group, a propanoyloxy group, a benzoyloxy group, and a naphthoyloxy group are exemplified. As the ester group, ester groups having 1 to 24 carbon atoms such as a methyl ester group, an ethyl ester group, a propyl ester group, a hexyl ester group, an octyl ester group, a dodecyl ester group, and a stearyl ester group are exemplified. The substituent may be a substituent formed of a combination of two or more substituents described above.

$X^1$ represents a sulfonate group, a sulfuric acid monoester salt group, a carboxylate group, or a phosphate group.

$Y^1$ represents a single bond, —$C_nH_{2n}$—, —$C_{n-m}H_{2(n-m)}OC_mH_{2m}$—, —O—$(CH_2CH_2O)_n$—, —O—$(CH_2CH(CH_3)O)_n$—, —O—$(CH(CH_3)CH_2O)_n$—, —O—$(CH_2CH_2CH_2O)_n$—, —CO—NH—, or a divalent linking group formed of a combination of two or more thereof and satisfies n≥1 and n≥m≥0.

Among compounds represented by Formula (I), a compound represented by Formula (I-A) or (I-B) is preferred from the viewpoint of scratch stain resistance.

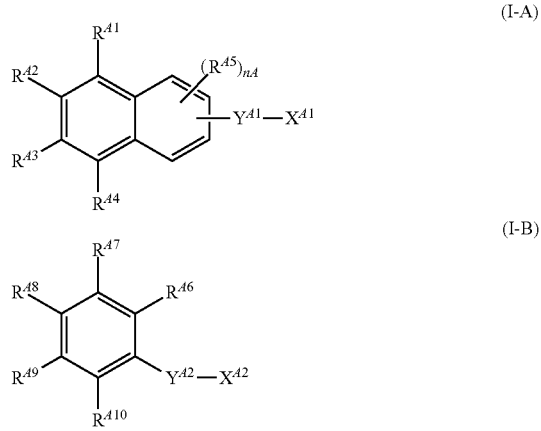

In Formula (I-A) and Formula (I-B), $R^{41}$ to $R^{410}$ each independently represent a hydrogen atom or an alkyl group, nA represents an integer of 1 to 3, $X^{41}$ and $X^{42}$ each independently represents a sulfonate group, a sulfuric acid monoester salt group, a carboxylate group, or a phosphate group, $Y^{41}$ and $Y^{42}$ each independently represents a single bond, —$C_nH_{2n}$—, —$C_{n-m}H_{2(n-m)}OC_mH_{2m}$—, —O—$(CH_2CH_2O)_n$—, —O—$(CH_2CH(CH_3)O)_n$—, —O—$(CH(CH_3)CH_2O)_n$—, —O—$(CH_2CH_2CH_2O)_n$—, —CO—NH—, or a divalent linking group formed of a combination of two or more thereof and satisfies n≥1 and n≥m≥0, and the total of the numbers of the carbon atoms in $R^{41}$ to $R^{45}$ or $R^{46}$ to $R^{410}$ and $Y^{41}$ or $Y^{42}$ is three or more.

In the compound represented by Formula (I-A) or Formula (I-B), the total number of carbon atoms in $R^{41}$ to $R^{45}$ and $Y^{14}$ or $R^{46}$ to $R^{410}$ and $Y^{42}$ is preferably 25 or less and more preferably 4 to 20. The structure of the above-described alkyl group may be linear or branched.

$X^{41}$ and $X^{42}$ in the compound represented by Formula (I-A) or Formula (I-B) are preferably a sulfonate group or a carboxylate group. In addition, the salt structure in $X^{41}$ and $X^{42}$ is preferably an alkali metal salt since the alkali metal salt has a favorable solubility particularly in water-based solvents. Among them, a sodium salt or a potassium salt is particularly preferred.

Regarding the compound represented by Formula (I-A) or Formula (I-B), it is possible to refer to the description of Paragraphs 0019 to 0037 of JP2007-206348A.

As the anionic surfactant, it is possible to preferably use compounds described in Paragraphs 0023 to 0028 of JP2006-065321A.

The amphoteric surfactant that is used in the developer is not particularly limited, and amine oxide-based surfactants such as alkyldimethylamine oxide, betaine-based surfactants such as alkyl betaine, aliphatic acid amidopropyl betaine, and alkyl imidazole, and amino acid-based surfactants such as sodium alkylamino aliphatic acid.

Particularly, alkyldimethylamine oxide that may have a substituent, alkylcarboxybetaine that may have a substituent, and alkyl sulfobetaine that may have a substituent are preferably used. As specific examples thereof, a compound represented by Formula (2) in Paragraph 0256 of JP2008-203359A, compounds represented by Formula (I), Formula (II), and Formula (VI) in Paragraphs 0028 of JP2008-276166A, and compounds described in Paragraphs 0022 to 0029 of JP2009-047927A can be exemplified.

As an amphoteric ionic surfactant that is used in the developer, a compound represented by General Formula (1) or a compound represented by General Formula (2) is preferred.

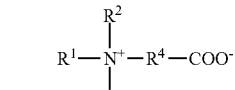

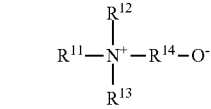

In General Formulae (1) and (2), $R^1$ and $R^{11}$ each independently represent an alkyl group having 8 to 20 carbon atoms or an alkyl group having a linking group having 8 to 20 carbon atoms in total.

$R^2$, $R^3$, $R^2$, and $R^{13}$ each independently represent a hydrogen atom or a group containing an alkyl group or an ethylene oxide structure.

$R^4$ and $R^{14}$ each independently represent a single bond or an alkylene group.

In addition, two groups of $R^1$, $R^2$, $R^3$, and $R^4$ may be bonded to each other to form a ring structure, and two groups of $R^{11}$, $R^{12}$, $R^{13}$, and $R^{14}$ may be bonded to each other to form a ring structure.

In the compound represented by General Formula (1) or the compound represented by General Formula (2), in a case in which the total number of carbon atoms becomes large, a hydrophobic portion becomes large, and the solubility in water-based developers degrades. In this case, the solubility is improved by mixing an organic solvent such as an alcohol that aids dissolution as a dissolution aid into water; however, in a case in which the total number of carbon atoms becomes too large, it is not possible to dissolve the surfactant in an appropriate mixing range. Therefore, the total of the numbers of carbon atoms in $R^1$ to $R^4$ or $R^{11}$ to $R^{14}$ is preferably 10 to 40 and more preferably 12 to 30.

The alkyl group having a linking group represented by $R^1$ or $R^{11}$ represents a structure in which a linking group is present between alkyl groups. That is, in a case in which the number of linking groups is one, the alkyl group can be represented by "-an alkylene group-a linking group-an alkyl group". As the linking group, an ester bond, a carbonyl bond, and an amide bond are exemplified. The number of the linking groups may be two or more, but is preferably one, and an amide bond is particularly preferred. The total number of carbon atoms in the alkylene group that bonds to the linking group is preferably 1 to 5. This alkylene group may be linear or branched, but is preferably a linear alkylene group. The number of carbon atoms in the alkyl group that bonds to the linking group is preferably 3 to 19, and the alkyl group may be linear or branched, but is preferably linear alkyl group.

In a case in which $R^2$ or $R^{12}$ is an alkyl group, the number of carbon atoms is preferably 1 to 5 and particularly preferably 1 to 3. The alkyl group may be any of linear or branched, but is preferably a linear alkyl group.

In a case in which $R^3$ or $R^{13}$ is an alkyl group, the number of carbon atoms is preferably 1 to 5 and particularly preferably 1 to 3. The alkyl group may be any of linear or branched, but is preferably a linear alkyl group.

As the group containing an ethylene oxide structure represented by $R^3$ or $R^{13}$, groups represented by —$R^a$(CH$_2$CH$_2$O)$_n$R$^b$ can be exemplified. Here, $R^a$ represents a single bond, an oxygen atom, or a divalent organic group (preferably having 10 or less carbon atoms), $R^b$ represents a hydrogen atom or an organic group (preferably having 10 or less carbon atoms), and n represents an integer of 1 to 10.

In a case in which $R^4$ or $R^{14}$ is an alkylene group, the number of carbon atoms is preferably 1 to 5 and particularly preferably 1 to 3. The alkylene group may be any of linear or branched, but is preferably a linear alkylene group.

The compound represented by General Formula (1) or the compound represented by General Formula (2) preferably has an amide bond and more preferably has an amide bond as the linking group as $R^1$ or $R^{11}$.

Representative examples of the compound represented by General Formula (1) or the compound represented by General Formula (2) will be illustrated below, but the present disclosure is not limited thereto.

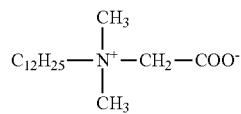

I-a)

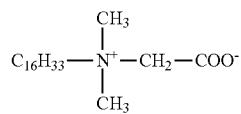

I-b)

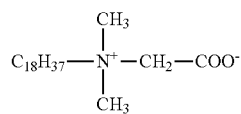

I-c)

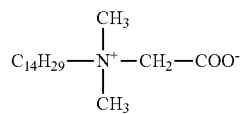

I-d)

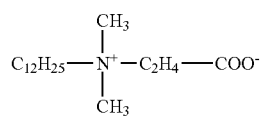

I-e)

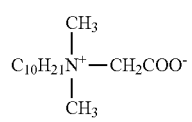

I-f)

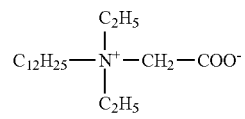

I-g)

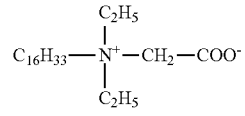

I-h)

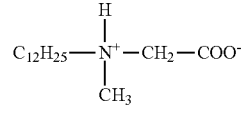

I-i)

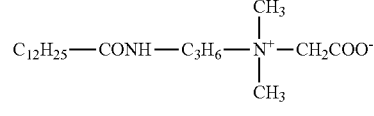

I-j)

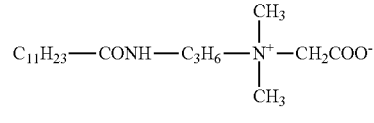

I-k)

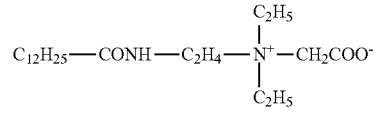

I-l)

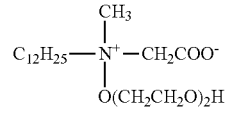

I-m)

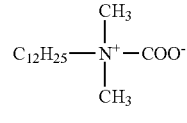

I-n)

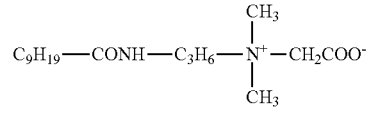

I-o)

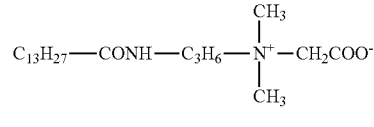

I-p)

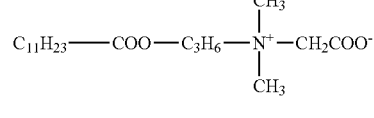

I-q)

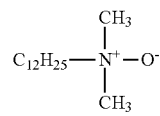

II-a)

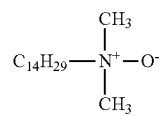

II-b)

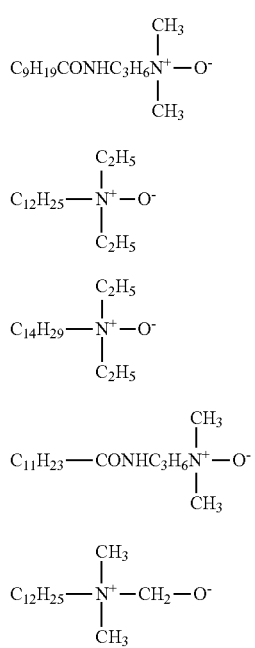

The compound represented by General Formula (1) or (2) can be synthesized using a well-known method. In addition, it is also possible to use commercially available compounds. As the commercially available products of the compound represented by General Formula (1), SOFTAZOLINE LPB, SOFTAZOLINE LPB-R, and BISTA MAP manufactured by Kawaken Fine Chemicals Co., Ltd., TAKESURF C-157L manufactured by Takemoto Oil & Fat Co., Ltd., and the like are exemplified. As the commercially available products of the compound represented by General Formula (2), SOFTAZOLINE LAO manufactured by Kawaken Fine Chemicals Co., Ltd., AMOGEN AOL manufactured by DKS Co., Ltd., and the like are exemplified.

In the developer, one amphoteric ionic surfactant may be used singly or two or more amphoteric ionic surfactants may be used in combination.

As nonionic surfactant, polyoxyethylene alkyl ethers, polyoxyethylene alkyl phenyl ethers, polyoxyethylene polystyryl phenyl ether, glycerin aliphatic acid partial esters, sorbitan aliphatic acid partial esters, pentaerythritol aliphatic acid partial esters, propylene glycol mono aliphatic acid ester, sucrose aliphatic acid partial ester, polyoxyethylene sorbitan aliphatic acid partial esters, polyoxyethylene sorbitol aliphatic acid partial esters, polyethylene glycol aliphatic acid esters, polyglycerin aliphatic acid partial esters, polyoxyethylene glycerin aliphatic acid partial esters, polyoxyethylene diglycerins, aliphatic acid diethanolamides, N,N-bis-2-hydroxyalkylamines, polyoxyethylene alkylamine, triethanolamine aliphatic acid ester, trialkylamine oxide, polyoxyethylene alkyl phenyl ethers, polyoxyethylene-polyoxypropylene blocked copolymers, and the like are exemplified.

In addition, acetylene glycol-based and acetylene alcohol-based oxyethylene adducts and fluorine-based and other surfactants can also be used in the same manner. Two or more surfactants described above can be jointly used.

As the nonionic surfactant, a nonionic aromatic ether-based surfactant represented by Formula (N1) is particularly preferably exemplified.

$$X^N-Y^N-O-(A^1)_{nB}-(A^2)_{mB}-H \quad (N1)$$

In the formula, $X^N$ represents an aromatic group that may have a substituent, $Y^N$ represents a single bond or an alkylene group having 1 to 10 carbon atoms, $A^1$ and $A^2$ are mutually different groups and are represented by any of —$CH_2CH_2O$— or —$CH_2CH(CH_3)O$—, nB and mB each independently represent an integer of 0 to 100; here, nB and mB are not zero at the same time, and, in a case in which any of nB or mB is zero, nB and mB are not one.

In the formula, as the aromatic group as $X^N$, a phenyl group, a naphthyl group, an anthranyl group, and the like are exemplified. These aromatic groups may have a substituent. As the substituent, organic groups having 1 to 100 carbon atoms are exemplified. Meanwhile, in the formula, in a case in which both A and B are present, the surfactant may be a random or blocked copolymer.

As specific examples of the organic group having 1 to 100 carbon atoms, aliphatic hydrocarbon groups and aromatic hydrocarbon groups which may be saturated or unsaturated and may be linear or branched, for example, an alkyl group, an alkenyl group, an alkynyl group, an aryl group, an aralkyl group, and the like, additionally, an alkoxy group, an aryloxy group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an acylamino group, an N-alkylacylamino group, an N-arylacylamino group, an acyl group, an alkoxycarbonylamino group, an alkoxycarbonyl group, an aryloxycarbonyl group, a carbamoyl group, an N-alkylcarbamoyl group, an N,N-dialkylcarbamoyl group, an N-arylcarbamoyl group an N,N-diarylcarbamoyl group, an N-alkyl-N-arylcarbamoyl group, a polyoxyalkylene chain, the above-described organic groups to which a polyoxyalkylene chain bonds, and the like. The alkyl group may be linear or branched.

In addition, as the nonionic surfactant, it is possible to preferably use compounds described in Paragraphs 0030 to 0040 of JP2006-065321A.

The cationic surfactant is not particularly limited, and well-known cationic surfactants in the related art can be used. For example, alkylamine salts, quaternary ammonium salts, alkylimidazolinium salts, polyoxyethylene alkylamine salts, polyethylene polyamine derivatives, and the like are exemplified.

The surfactant may be used singly or two or more surfactants may be jointly used.

The content of the surfactant is preferably 1% by mass to 25% by mass, more preferably 2% by mass to 20% by mass, still more preferably 3% by mass to 15% by mass, and particularly preferably 5% by mass to 10% by mass of the total mass of the developer. In a case in which the content of the surfactant is in the above-described range, the scratch stain resistance is superior, the dispersibility of development scum is excellent, and the ink-absorbing property of lithographic printing plates to be obtained is excellent.

[Water-Soluble Polymer Compound]

From the viewpoint of adjusting the viscosity of the developer and protecting the plate surface of a lithographic printing plate to be obtained, the developer may include a water-soluble polymer.

As a water-soluble polymer, the developer may contain a water-soluble polymer compound such as a soy polysaccharide, modified starch, gum arabic, dextrin, a fibrin derivative (for example, carboxymethyl cellulose, carboxyethyl cellulose, methyl cellulose, or the like) and a modified product thereof, pullulan, polyvinyl alcohol and a derivative thereof, polyvinyl pyrrolidone, polyacrylamide and an acrylamide copolymer, a vinyl methyl ether/maleic anhydride copolymer, a vinyl acetate/maleic anhydride copolymer, or a styrene/maleic anhydride copolymer.

As the soy polysaccharide, soy polysaccharides known in the related art can be used, and, for example, as commercially available products, there is SOYAFIBE (trade name, manufactured by Fuji Oil Co., Ltd.), and it is possible to use a variety of grades of soy polysaccharides. Soy polysaccharides that can be preferably used have a viscosity of a 10% by mass aqueous solution in a range of 10 mPa·s to 100 mPa·s.

As the modified starch, starch represented by Formula (III) is preferred. As the starch represented by Formula (III), any starch such as corn, potato, tapioca, rice, or wheat can be used. The starch can be modified using a method in which starch is decomposed using an acid, an enzyme, or the like to the number of glucose residues per molecule in a range of 5 to 30 and, furthermore, oxypropylene is added thereto in an alkali.

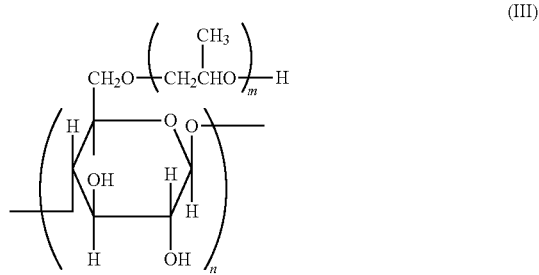

(III)

In the formula, the degree of etherification (degree of substitution) is in a range of 0.05 to 1.2 per glucose unit, n represents an integer of 3 to 30, and m represents an integer of 1 to 3.

Among water-soluble polymer compounds, soy polysaccharides, modified starch, gum Arabic, dextrin, carboxymethyl cellulose, polyvinyl alcohol, and the like are particularly preferred.

Two or more water-soluble polymer compounds can be jointly used.

In a case in which the developer includes a water-soluble polymer compound, the content of the water-soluble polymer compound is preferably 3% by mass or less and more preferably 1% by mass or less of the total mass of the developer. In the above-described aspect, the viscosity of the developer is appropriate, and it is possible to suppress the deposition of development scum or the like in a roller member such as an automatic developing machine.

[Other Additives]

The developer that is used in the present disclosure may contain, in addition to the above-described components, a wetting agent, a preservative, a chelate compound, a defoamer, an organic acid, an organic solvent, an inorganic acid, an inorganic salt, or the like.

As the wetting agent, ethylene glycol, propylene glycol, triethylene glycol, butylene glycol, hexylene glycol, diethylene glycol, dipropylene glycol, glycerin, trimethylolpropane, diglycerin, and the like are preferably used. The wetting agent may be used singly or two or more wetting agents may be jointly used. The content of the wetting agent is preferably 0.1% by mass to 5% by mass of the total mass of the developer.

As the preservative, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a derivative of pyridine, quinoline, guanidine, or the like, diazine, a triazole derivative, oxazole, an oxazine derivative, nitrobromo alcohol-based 2-bromo-2-nitropropane-1,3-diol, 1,1-dibromo-1-nitro-2-ethanol, 1,1-dibromo-1-nitro-2-propanol, or the like can be preferably used.

The amount of the preservative added needs to be an amount in which the preservative stably exhibits an effect with respect to bacteria, fungi, yeast, and the like and which varies depending on the kind of bacteria, fungi, and yeast and is preferably in a range of 0.01% by mass to 4% by mass of the total mass of the developer. In addition, two or more preservatives are preferably jointly used so as to be effective to a variety of fungi and bacteria.

As the chelate compound, for example, ethylenediaminetetraacetic acid, potassium salts thereof, and sodium salts thereof; diethylenetriaminepentaacetic acid, potassium salts thereof, and sodium salts thereof; triethylenetetraminehexaacetic acid, potassium salts thereof, and sodium salts thereof; hydroxyethylethylenediaminetriacetic acid, potassium salts thereof, and sodium salts thereof; nitrilotriacetic acid, and sodium salts thereof; 1-hydroxyethane-1,1-diphosphonic acid, potassium salts thereof, and sodium salts thereof; and organic phosphonic acids such as aminotri (methylene phosphonate), potassium salts thereof, and sodium salts thereof can be exemplified. Instead of sodium salts and potassium salts of chelating agents, salts of organic amines are also effective.

The chelating agent is preferably a chelating agent that is stably present in a process liquid composition and does not impair a printing property. The content of the chelating agent is preferably 0.001% by mass to 1.0% by mass of the total mass of the developer.

As the defoamer, it is possible to use an ordinary silicone-based self-emulsification-type, emulsification-type, or non-ionic compound having a hydrophilic-lipophilic balance (HLB) of 5 or less. A silicone defoamer is preferred.

Meanwhile, a silicone-based surfactant is regarded as the defoamer.

The content of the defoamer is preferably in a range of 0.001% by mass to 1.0% by mass of the total mass of the developer.

As the organic acid, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, organic phosphonic acid, and the like are exemplified. The organic acid can also be used in a form of an alkali metal salt or ammonium salt thereof. The content of the organic acid is preferably 0.01% by mass to 0.5% by mass of the total mass of the developer.

As the organic solvent, for example, aliphatic hydrocarbons (hexane, heptane, "ISOPAR E, H, G" (manufactured by Esso Chemical Co., Ltd.) and the like), aromatic hydrocarbons (toluene, xylene, and the like), halogenated hydrocarbons (methylene dichloride, ethylene dichloride, trichloroethylene, monochlorobenzene, and the like), polar solvents, and the like are exemplified.

As the polar solvents, alcohols (methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, methyl amyl alcohol, and the like), ketones (acetone, methyl ethyl ketone, ethyl butyl ketone, methyl isobutyl ketone, cyclohexanone, and the like), esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate, and the like), other polar solvents (triethyl phosphate, tricresyl phosphate, N-phenylethanolamine, N-phenyldiethanolamine, and the like), and the like are exemplified.

In a case in which the organic solvent is not soluble in water, it is also possible to make the organic solvent soluble in water using a surfactant or the like and then use the organic solvent, and, in a case in which the developer contains the organic solvent, from the viewpoint of safety and inflammability, the concentration of the solvent in the developer is preferably less than 40% by mass.

As the inorganic acid and the inorganic salt, phosphoric acid, metaphosphoric acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, nickel sulfate, and the like are exemplified. The content of the inorganic salt is preferably 0.01% by mass to 0.5% by mass of the total mass of the developer.

The developer is prepared by dissolving or dispersing the respective components described above in water as necessary. The concentration of the solid content of the developer is preferably 2% by mass to 25% by mass. As the developer, it is also possible to produce a concentrated liquid and, at the time of being used, dilute the concentrated liquid with water.

The developer is preferably an aqueous developer.

From the viewpoint of the dispersibility of development scum, the developer preferably contains an alcohol compound.

As the alcohol compound, methanol, ethanol, propanol, isopropanol, benzyl alcohol, and the like are exemplified. Among these, benzyl alcohol is preferred.

The content of the alcohol compound is preferably 0.01% by mass to 5% by mass, more preferably 0.1% by mass to 2% by mass, and particularly preferably 0.2% by mass to 1% by mass of the total mass of the developer from the viewpoint of the dispersibility of development scum.

<Printing Step>

The lithographic printing method according to an embodiment of the present disclosure includes a printing step of printing a recording medium by supplying printing ink to the lithographic printing plate developed in the on-machine development step or the development step.

The printing ink is not particularly limited, and a variety of well-known inks can be used as desired. In addition, as the printing ink, oil-based ink or ultraviolet-curable ink (UV ink) is preferably exemplified, and UV ink is more preferably exemplified.

In addition, in the printing step, dampening water may be supplied as necessary.

In addition, the printing step may be successively carried out after the on-machine development step without stopping the printer.

The recording medium is not particularly limited, and a well-known recording medium can be used as desired.

In the method for producing the lithographic printing plate from the lithographic printing plate precursor according to the embodiment of the present disclosure and the lithographic printing method according to the embodiment of the present disclosure, the full surface of the lithographic printing plate precursor may be heated as necessary before exposure, in the middle of exposure, or during a period of time from exposure to development. Such heating accelerates an image-forming reaction in the image-forming layer and generates an advantage of the improvement in sensitivity or printing resistance, the stabilization of sensitivity, or the like. Heating before development is preferably carried out in a mild condition of 150° C. or lower. In the above-described aspect, it is possible to prevent a problem of the curing of the non-image area. For heating after development, an extremely strong condition is preferably used, and a range of 100° C. to 500° C. is preferred. In the above-described range, a sufficient image-strengthening action is obtained, and it is possible to suppress a problem of the deterioration of the support or the thermal decomposition of the image area.

(Polymer Particle)

A polymer particle according to an embodiment of the present disclosure includes an addition polymerization-type resin having a hydrophilic structure and a crosslinking structure.

The polymer particle according to the embodiment of the present disclosure is identical to the polymer particle that is contained in the image-recording layer of the above-described lithographic printing plate precursor, and a preferred aspect thereof is also identical thereto.

(Composition)

A composition according to an embodiment of the present disclosure includes the polymer particle according to the embodiment of the present disclosure.

In addition, the composition according to the embodiment of the present disclosure preferably further includes an infrared absorber, a polymerization initiator, and a polymerizable compound. In the above-described aspect, the composition can be preferably used as a photosensitive composition and can be preferably used to form the image-recording layer in the lithographic printing plate precursor according to the embodiment of the present disclosure.

The infrared absorber, the polymerizable compound, and the polymerization initiator that are included in the composition according to the embodiment of the present disclosure are respectively identical to the infrared absorber, the polymerizable compound, and the polymerization initiator that are included in the image-recording layer of the above-described lithographic printing plate precursor.

In addition, the composition according to the embodiment of the present disclosure may further contain at least one selected from the group consisting of the binder polymer, the radical production aid, the chain transfer agent, the additional polymer particle, the low-molecular-weight hydrophilic compound, the sensitization agent, the acid color developing agent, and a well-known solvent.

The contents of the respective components included in the composition according to the embodiment of the present disclosure correspond to the contents of the respective components included in the image-recording layer of the above-described lithographic printing plate precursor read as the amounts of solid contents in the composition.

In the case of using the composition according to the embodiment of the present disclosure, it is possible to preferably obtain lithographic printing plate precursors.

EXAMPLES

Hereinafter, the present disclosure will be described in detail using examples, but the present disclosure is not limited thereto. Meanwhile, in the present examples, unless particularly otherwise described, "%" and "parts" respectively refer to "% by mass" and "parts by mass". Meanwhile, for polymer compounds, unless particularly otherwise described, the molecular weight refers to the weight-average molecular weight (Mw), and the ratio of a constituent repeating unit is the molar percentage. In addition, the weight-average molecular weight (Mw) is a value measured as a polystyrene equivalent value using the gel permeation chromatography (GPC) method. In addition, unless particularly otherwise described, the average particle diameter refers to the volume-average particle diameter.

Meanwhile, polymer particles G-1 to G-21 used in the examples are respectively the same as the above-described polymer particles G-1 to G-21.

<Synthesis of Polymer Particle G-1>

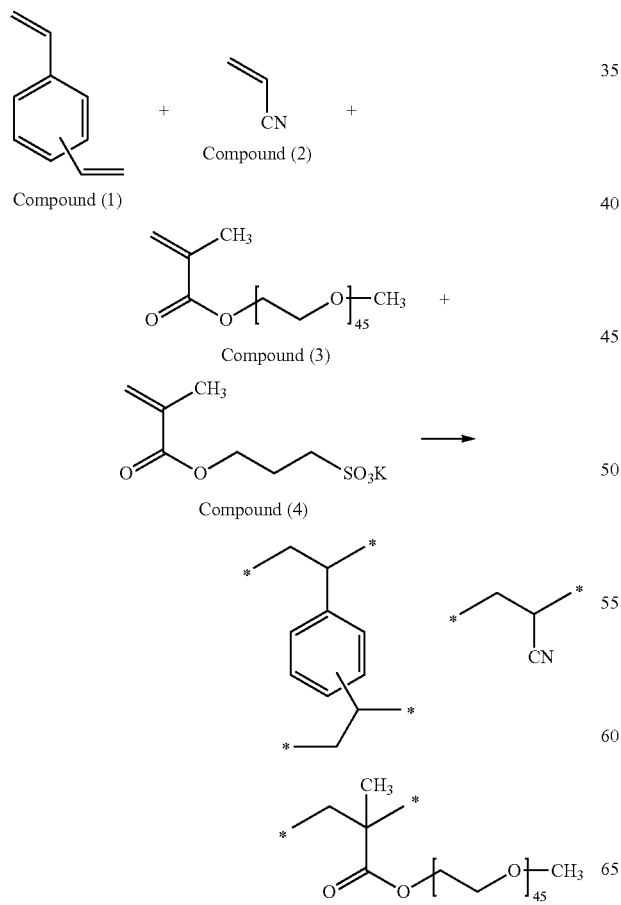

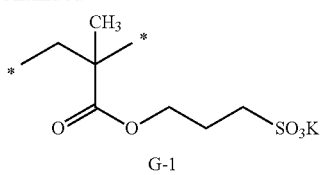

G-1

A compound (1) (10.8 g), a compound (2) (33.0 g), a compound (3) (10.0 g), a compound (4) (2.0 g), and distilled water (950 g) were added to a three-neck flask, stirred in a nitrogen atmosphere, and heated to 70° C. Next, potassium persulfate (1.9 g) was added thereto and stirred for five hours. After that, the components were heated to 95° C. and stirred for two hours. A reaction liquid was cooled to room temperature (25° C., which shall apply below), thereby obtaining a dispersion liquid (solid content: 5%) of a polymer particle G-1. The average particle diameter of the polymer particle G-1 was 180 nm.

<Syntheses of Polymer Particles G-2 to 21 and G'-1, 2, and 4>

Polymer particles G-2 to 21 and G'-1, 2, and 4 were also synthesized in the same manner using the same method as in the synthesis of the polymer particle G-1 except for the fact that the monomers serving as raw materials and the amounts of the monomers used were changed.

Meanwhile, the polymer particles G-2 to 21 were particles having the structures illustrated above, and the polymer particles G'-1 and 2 were particles having structures illustrated below. In addition, the average particle diameter of the polymer particle G'-1 was 180 nm.

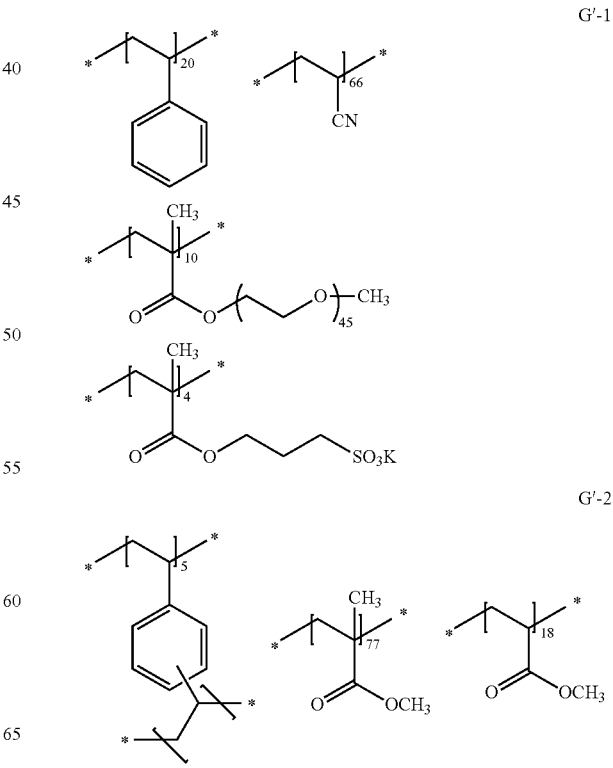

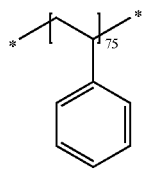
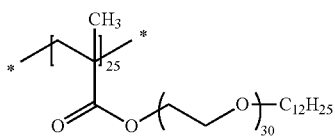

Particle diameter = 100 nm

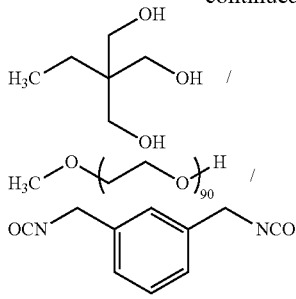
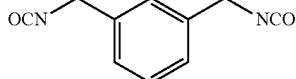

<Synthesis of Polymer Particle G'-3>

As oil-phase components, isophorone diisocyanate (4 g), trimethyloipropane (6 molar equivalent), and xylene diisocyanate (18 molar equivalent) were added, and an adduct obtained by adding methyl single-terminated polyoxyethylene (1 molar equivalent; meanwhile, the number of times of repetition of an oxyethylene unit was 90) to the above-described components (manufactured by Mitsui Chemicals Inc.; 50% by mass ethyl acetate solution) (2 g), pentaerythritol triacrylate (manufactured by Nippon Kayaku Co., Ltd., SR444) (3.15 g), and a surfactant PIONINE A-41C (manufactured by Takemoto Oil & Fat Co., Ltd.) (0.1 g) were dissolved in ethyl acetate (17 g). As a water-phase component, a 4% by mass aqueous solution of polyvinyl alcohol (PVA-205 manufactured by Kuraray Co., Ltd.) (40 g) was prepared. The oil-phase components and the water-phase component were mixed together and emulsified using a homogenizer at 12,000 rpm for 10 minutes. The obtained emulsified substance was added to a mixed aqueous solution of distilled water (25 g) and U-CAT SA102 (1,8-diazabicyclo[5.4.0]undeca-7-ene octylate, manufactured by San-Apro Ltd.) (0.2 g), stirred at room temperature for 30 minutes, and then left to stand at 45° C. for 24 hours. A micro gel liquid obtained as described above was diluted using distilled water so that the concentration of the solid content reached 15% by mass and was regarded as a polymer particle G'-3. The average particle diameter of the polymer particle G'-3 was 260 nm.

Meanwhile, the polymer particle G'-3 is a urethane resin for which the following compound is polycondensed.

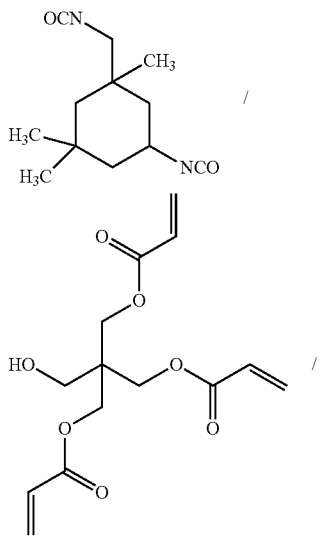

<Evaluation of Dispersion Stability of Polymer Particle>

The dispersion status of a solid content of a mixed solution obtained by adding the obtained dispersion liquid of the polymer particle (1 mL) to individual solvents (methyl ethyl ketone (MEK)/1-methoxy-2-propanol (MFG)=50/50% by mass and distilled water) (100 mL), stirring the mixture for 10 minutes or longer, and then leaving the mixed solution to stand at 20° C. for one hour was visually evaluated. The evaluation indexes of dispersibility are as described below. A is the highest evaluation, the evaluation becomes worse in an order of A, B, C, and D, and D is the lowest evaluation.

A: A state in which there is no precipitate and dispersibility is favorable.

B: A state in which there is a small amount of a precipitate, but the precipitate can be easily re-dispersed.

C: A state in which there is a large amount of a precipitate, but the precipitate can be re-dispersed.

D: A state in which there is a precipitate or an adhered substance and the precipitate or the adhered substance cannot be re-dispersed.

TABLE 1

| | Evaluation of dispersion stability | |
|---|---|---|
| Polymer particle | MEK/MFG = 50/50% by mass | Distilled water |
| G-1 | A | A |
| G-2 | A | A |
| G-3 | A | C |
| G-4 | A | A |
| G-5 | A | A |
| G-6 | C | A |
| G-7 | B | C |
| G-8 | A | B |
| G-9 | A | B |
| G-10 | A | B |
| G-11 | A | B |
| G-12 | A | A |
| G-13 | C | B |
| G-14 | B | A |
| G-15 | A | B |
| G-16 | B | C |
| G-17 | C | B |
| G-18 | A | A |
| G-19 | A | B |
| G-20 | A | C |
| G-21 | C | B |
| G'-1 | A | A |
| G'-2 | D | D |
| G'-3 | A | C |
| G'-4 | D | C |

<Production of Support 1>

In order to remove rolling oil on the surface of a 0.3 mm-thick aluminum plate (material JIS A 1050), a defatting process was carried out thereon using a 10% by mass aqueous solution of sodium aluminate at 50° C. for 30 seconds, and then the surface of the aluminum plate was grained using three implanted nylon brushes having a hair diameter of 0.3 mm and a suspension of pumice having a median diameter of 25 μm and water (specific gravity: 1.1 g/cm$^3$) and well washed with water. The aluminum plate was etched by being immersed in a 25% by mass aqueous solution of sodium hydroxide at 45° C. for nine seconds, was washed with water, then, was further immersed in a 20% by mass aqueous solution of nitric acid at 60° C. for 20 seconds, and was washed with water. The etched amount of the grained surface was approximately 3 g/m$^2$.

Next, an electrochemical roughening process was continuously carried out thereon using an alternating current voltage of 60 Hz. An electrolytic solution was a 1% by mass aqueous solution of nitric acid (including 0.5% by mass of aluminum ions.), and the liquid temperature was 50° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As an auxiliary anode, ferrite was used. The current density was 30 A/dm$^2$ in terms of the peak value of the current, and 5% of the current coming from the power supply was divided into the auxiliary anode. Regarding the quantity of electricity during nitric acid electrolysis, the quantity of electricity was 175 C/dm$^2$ in a case in which the aluminum plate served as the positive electrode. After that, the plate was washed with water by means of spraying.

Subsequently, an electrochemical roughening process was carried out thereon using the same method as nitric acid electrolysis in a 0.5% by mass aqueous solution of hydrochloric acid (including 0.5% by mass of aluminum ions.) and an electrolytic solution having a liquid temperature of 50° C. under a condition of the quantity of electricity of 50 C/dm$^2$ in a case in which the aluminum plate served as the positive electrode, and then, the plate was washed with water by means of spraying.

Next, 2.5 g/m$^2$ of a direct current anodized film was formed on the aluminum plate at a current density of 15 A/dm$^2$ using a 15% by mass aqueous solution of sulfuric acid (including 0.5% by mass of aluminum ions.) having a liquid temperature of 54° C. as an electrolytic solution and then washed with water and dried. The average pore diameter of the surface layer of the anodized film (surface average pore diameter) was 10 nm.

The pore diameter of the surface layer of the anodized film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition process or the like for imparting conductive properties, 50 pores were randomly extracted, and the average value was obtained. The standard error was ±10% or less.

After that, in order to ensure the hydrophilicity of a non-image area, a silicate process was carried out by dipping the support in a 2.5% by mass aqueous solution of No. 3 sodium silicate at 50° C. for seven seconds, and the support was washed with water by means of spraying, thereby producing a support 1. The attached amount of Si was 11 mg/m$^2$.

<Preparation of Coating Fluid for Undercoat Layer>
Polymer (UC-1) [the following structure]: 0.18 parts
Hydroxyethyl iminodiacetic acid: 0.10 parts
Water: 61.4 parts

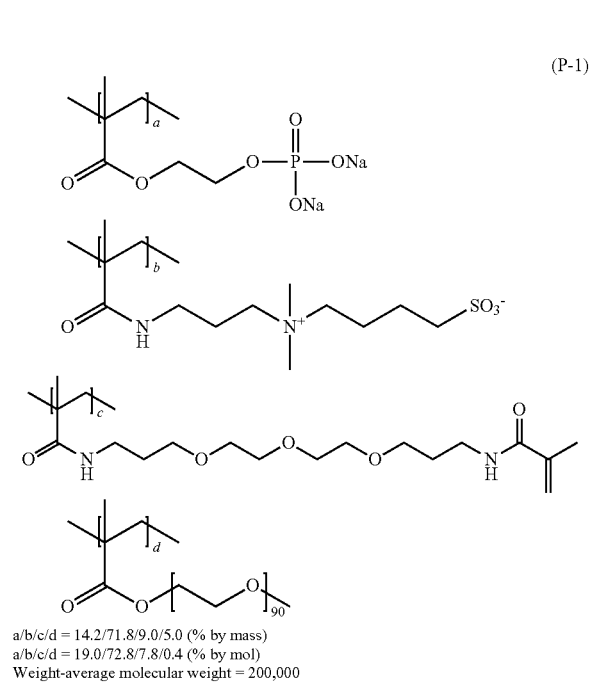

a/b/c/d = 14.2/71.8/9.0/5.0 (% by mass)
a/b/c/d = 19.0/72.8/7.8/0.4 (% by mol)
Weight-average molecular weight = 200,000

<Preparation of Coating Fluid for Protective Layer>
Inorganic lamellar compound dispersion liquid (1) [illustrated below]
1.5 parts
Six percent by mass aqueous solution of polyvinyl alcohol (CKS50 manufactured by The Nippon Synthetic Chemical Industry Co., Ltd., sulfonic acid-modified, degree of saponification: 99% by mol or higher, degree of polymerization: 300) 0.55 parts
Six percent by mass aqueous solution of polyvinyl alcohol (PVA-405 manufactured by Kuraray Co., Ltd., degree of saponification: 81.5 mol %, degree of polymerization: 500)
0.03 parts
One percent by mass aqueous solution of a surfactant (polyoxyethylene lauryl ether, EMALEX 710, manufactured by Nihon Emulsion Co., Ltd.) 0.86 parts
Ion exchange water 6.0 parts
A method for preparing the inorganic lamellar compound dispersion liquid (1) using the coating fluid for a protective layer will be described below.

—Preparation of Inorganic Lamellar Compound Dispersion Liquid (1)—

Synthetic mica (SOMASIF ME-100 manufactured by Co-op Chemical Co., Ltd.) (6.4 g) was added to ion exchange water (193.6 g) and dispersed using a homogenizer until the average particle diameter (laser scattering method) reached 3 μm. The aspect ratio of the obtained dispersed particle was 100 or higher.

<Preparation of Coating Fluid for Image-Recording Layer>

Individual components were added according to the amounts used shown in Table 2, a solvent was added thereto so that the concentration of the solid content reached 7.0% by mass, and the components were mixed together. The amounts (parts) of individual materials added in Table 2 or 3 are the amounts of solid contents.

Meanwhile, a coating fluid for an image-recording layer including a polymer particle was prepared by mixing and stirring a photosensitive liquid containing components shown in Table 2 or Table 3 other than the polymer particle in a mixed state and a polymer particle dispersion liquid immediately before the application so as to obtain a composition shown in Table 2 or Table 3.

An expression such as "M-4/M-5 146/78" in Table 2 or Table 3 indicates that 146 parts of a compound M-4 and 78 parts by a compound M-5 are included.

Examples 1 to 21 and Comparative Examples 1 to 4

<Production of Lithographic Printing Plate Precursors>

Lithographic printing plate precursors of Examples 1 to 21 and Comparative Examples 1 to 4 were respectively produced using the following method.

The coating fluid for an undercoat layer having the above-described composition was applied onto the support 1 so that the dried coating amount reached 20 mg/m², thereby forming an undercoat layer. Each coating fluid for an image-recording layer shown in Table 2 or Table 3 was applied onto the undercoat layer by means of bar coating and dried in an oven at 120° C. for 40 seconds, thereby forming an image-recording layer having a dried coating amount of 1.0 g/m².

The coating fluid for an image-recording layer was prepared by mixing and stirring the polymer particle immediately before the application.

As necessary, the coating fluid for a protective layer having the above-described composition was applied onto the image-recording layer by means of bar coating and dried in an oven at 120° C. for 60 seconds, thereby forming a protective layer having a dried coating amount of 0.15 g/m².

Examples in which the protective layer was formed have an expression of "Present" in the "Protective layer" column in Table 2 or Table 3.

<Evaluation of Lithographic Printing Plate Precursor>

The lithographic printing plate precursors produced as described above were exposed (to an equivalent irradiation energy of 110 mJ/cm²) using Magnus 800 Quantum equipped with an infrared semiconductor laser manufactured by Kodak Japan Ltd. under conditions of an output of 27 W, an external surface drum rotation speed of 450 rpm, and a resolution of 2,400 dpi (dots per inch, 1 inch is equal to 2.54 cm). Exposed images were provided with a solid image and an amplitude modulation screen (AM screen) 3% halftone dot chart.

(1) On-Machine Developability

The obtained exposed precursor was attached to a cylinder of a medium octavo paper-size printer SX-74 manufactured by Heidelberger Druckmaschinen AG without being developed. To the present printer, a 100 L-capacity dampening water circulation tank having a non-woven fabric filter and a temperature control device was connected. Dampening water (80 L) containing 2.0% of dampening water S-Z1 (manufactured by Fujifilm Corporation) was prepared in a circulation device, T&K UV OFS K-HS black GE-M (manufactured by T&K TOKA Co., Ltd.) was used as printing ink, dampening water and ink were supplied using a standard automatic printing start method, and then printing was carried out on 500 pieces of TOKUBISHI art paper (76.5 kg) at a printing rate of 10,000 pieces per hour.

The number of pieces of printing paper required until a state in which the ink was no longer transferred to a non-image area was formed was measured as on-machine development. The measurement results are shown in Table 2 and Table 3. In Table 3, an expression of "100 pieces or more" indicates that development was not possible at a point in time where the $100^{th}$ printing paper was used.

(2) Printing Resistance

After the on-machine developability were evaluated, printing was further continued. As the number of pieces of printed paper increased, the image area gradually wore, and thus the ink density on printed matters decreased. The number of pieces of paper printed until the value of the halftone dot area ratio of AM screen 3% halftone dots on a printed matter measured using a gretag density meter (manufactured by GretagMacbeth) decreased to be 1% lower than the measurement value obtained from the $500^{th}$ piece of printed paper was used as the number of pieces of completely printed paper to evaluate the printing resistance. The printing resistance was evaluated using relative printing resistance for which the value obtained in a case in which the number of pieces of printed paper reached 50,000 was considered as 100. As the numerical value increase, the printing resistance becomes more favorable. The evaluation results are shown in Table 2 and Table 3. In Table 3, an expression of "Cannot be evaluated" indicates that the on-machine development of the lithographic printing plate precursor was not possible and the evaluation of the printing resistance was not possible.

Relative printing resistance=(number of pieces of printed paper of subject lithographic printing plate precursor)/50,000×100

(3) On-Machine Development Scum Suppression Property

After printing was carried out in the evaluation of the printing resistance as described above, the attachment status of the removed gas on a form dampening roller was evaluated at the same time. The indexes are as described below. The evaluation results are shown in Table 2 or Table 3.

A: No gas is observed on the form dampening roller.
B: Gas is slightly observed on the form dampening roller.
C: Gas is significantly observed on the form dampening roller.

TABLE 2

| | Coating fluid for image-recording layer | | | | | | | |
|---|---|---|---|---|---|---|---|---|
| | Polymer particle (parts) | Binder polymer (parts) | Polymerizable compound (parts) | Polymerization initiator (parts) | Infrared absorber (parts) | Radical production aid (parts) | Acid color-developing agent (parts) | Hydrophilic compound (parts) |
| Example 1 | G-1 468 | B-1 179 | M-4/M-5 146/78 | I-1 132 | K-3 58 | R-1 57 | H-1 58 | T-1/T-3 20/30 |
| Example 2 | G-2 453 | B-1 156 | M-1/M-2 123/101 | I-1 135 | K-1 50 | R-1 49 | H-3 55 | T-1 20 |
| Example 3 | G-3 453 | B-1 156 | M-1/M-2 123/101 | I-1 135 | K-1 50 | R-1 49 | H-3 55 | T-1 20 |

TABLE 2-continued

| | | | | | | | | |
|---|---|---|---|---|---|---|---|---|
| Example 4 | G-4 556 | B-1 181 | M-2/M-3/M-4 77/75/69 | I-1 125 | K-1 53 | R-1 51 | H-1 50 | T-1/T-3 15/30 |
| Example 5 | G-5 556 | B-1 181 | M-2/M-3/M-4 77/75/69 | I-1 125 | K-1 53 | R-1 51 | H-1 50 | T-1/T-3 15/30 |
| Example 6 | G-6 556 | B-1 181 | M-2/M-3/M-4 77/75/69 | I-1 125 | K-1 53 | R-1 51 | H-1 50 | T-1/T-3 15/30 |
| Example 7 | G-7 350 | — 0 | M-3/M-4/M-5 94/41/96 | I-2 58 | K-2 18 | R-1 87 | H-3 48 | T-3 75 |
| Example 8 | G-8 489 | B-1 163 | M-1/M-5 88/103 | I-3 125 | K-3 49 | R-1 60 | H-2 65 | T-1/T-2/T-3 10/10/10 |
| Example 9 | G-9 489 | B-1 163 | M-1/M-5 88/103 | I-3 125 | K-3 49 | R-1 60 | H-2 65 | T-1/T-2/T-3 10/10/10 |
| Example 10 | G-10 489 | B-1 163 | M-1/M-5 88/103 | I-3 125 | K-3 49 | R-1 60 | H-2 65 | T-1/T-2/T-3 10/10/10 |
| Example 11 | G-11 489 | B-1 163 | M-1/M-5 88/103 | I-3 125 | K-3 49 | R-1 60 | H-2 65 | T-1/T-2/T-3 10/10/10 |
| Example 12 | G-12 386 | B-1 151 | M-1/M-4/M-5 68/120/36 | I-2 201 | K-1 21 | R-1 5 | H-4 41 | T-1/T-3 10/30 |
| Example 13 | G-13 241 | B-1 213 | M-1 213 | I-1 151 | K-1/K-2 25/25 | R-1 9 | H-1 33 | T-1/T-3 10/25 |
| Example 14 | G-14 190 | B-1 165 | M-2 253 | I-2 178 | K-2 89 | — 0 | H-1/H-2 23/24 | T-1/T-3 20/20 |
| Example 15 | G-15 669 | B-1 112 | M-3 196 | I-1/I-2 51/53 | K-3 15 | R-1 11 | H-4 23 | T-2 5 |

| | Coating fluid for image-recording layer | | | | Evaluation results | | |
|---|---|---|---|---|---|---|---|
| | Sensitization agent (parts) | Surfactant (parts) | Solvent (mass ratio) | Protective layer | On-machine developability (number of pieces) | Printing resistance | On-machine development scum suppression property |
| Example 1 | — 0 | W-1 4 | S-1/S-2/S-3 60/30/10 | Absent | 11 | 90 | A |
| Example 2 | C-1/C-2/C-3 25/23/30 | W-1 4 | S-1/S-2/S-3 50/40/10 | Present | 11 | 87 | A |
| Example 3 | C-1/C-2/C-3 25/23/30 | W-1 4 | S-1/S-2/S-3 50/40/10 | Present | 15 | 79 | B |
| Example 4 | C-1/C-3 27/27 | W-1 4 | S-1/S-2/S-3 55/30/15 | Present | 11 | 85 | A |
| Example 5 | C-1/C-3 27/27 | W-1 4 | S-1/S-2/S-3 55/30/15 | Present | 14 | 81 | A |
| Example 6 | C-1/C-3 27/27 | W-1 4 | S-1/S-2/S-3 55/30/15 | Present | 18 | 77 | B |
| Example 7 | — 0 | — 0 | S-4/S-5 80/20 | Absent | 12 | 78 | B |
| Example 8 | C-1/C-2/C-3 15/13/25 | W-1 4 | S-1/S-2/S-3 70/20/10 | Present | 13 | 88 | A |
| Example 9 | C-1/C-2/C-3 15/13/25 | W-1 4 | S-1/S-2/S-3 70/20/10 | Present | 13 | 83 | A |
| Example 10 | C-1/C-2/C-3 15/13/25 | W-1 4 | S-1/S-2/S-3 70/20/10 | Present | 13 | 80 | A |
| Example 11 | C-1/C-2/C-3 15/13/25 | W-1 4 | S-1/S-2/S-3 70/20/10 | Present | 13 | 76 | A |
| Example 12 | C-1/C-2/C-3 5/5/5 | W-1 3 | S-1/S-2/S-3 40/40/20 | Absent | 11 | 73 | A |
| Example 13 | — 0 | W-1 2 | S-1/S-2/S-3 40/30/30 | Present | 15 | 86 | B |
| Example 14 | C-1/C-2/C-3 1/1/1 | W-1 5 | S-1/S-2 80/20 | Absent | 11 | 72 | A |
| Example 15 | C-1/C-2/C-3 5/5/20 | W-1 6 | S-1/S-2/S-3 80/10/10 | Absent | 12 | 82 | A |

TABLE 3

| | Coating fluid for image-recording layer | | | | | | | |
|---|---|---|---|---|---|---|---|---|
| | Polymer particle (parts) | Binder polymer (parts) | Polymerizable compound (parts) | Polymerization initiator (parts) | Infrared absorber (parts) | Radical production aid (parts) | Acid color-developing agent (parts) | Hydrophilic compound (parts) |
| Example 16 | G-16 742 | B-1 98 | M-4 140 | I-1 133 | K-2/K-3 51/53 | R-1 20 | H-2 18 | T-1/T-2/T-3 5/5/5 |
| Example 17 | G-17 480 | B-1 123 | M-2/M-3 88/88 | I-2 141 | K-2 20 | R-1 17 | H-1/H-3 51/53 | T-2/T-3 45/45 |

TABLE 3-continued

| | | | | | | | | |
|---|---|---|---|---|---|---|---|---|
| Example 18 | G-18 | B-1 | M-5 | I-1/I-3 | K-1 | R-1 | H-2/H-3 | T-3 |
| | 520 | 256 | 98 | 22/101 | 23 | 33 | 11/13 | 20 |
| Example 19 | G-19 | B-1 | M-3/M-4 | I-1 | K-1 | R-1 | H-3 | — |
| | 563 | 169 | 75/126 | 89 | 68 | 41 | 98 | 0 |
| Example 20 | G-20 | B-1 | M-2/M-4 | I-2/I-3 | K-1/K-3 | R-1 | — | T-1/T-2 |
| | 360 | 153 | 66/138 | 121 | 12/13 | 3 | 0 | 5/30 |
| Example 21 | G-21 | B-1 | M-1/M-2/M-3 | I-1 | K-3 | R-1 | H-4 | T-3 |
| | 458 | 181 | 67/67/67 | 163 | 22 | 12 | 60 | 25 |
| Comparative Example 1 | G'-1 468 | B-1 179 | M-4/M-5 146/78 | I-1 132 | K-3 58 | R-1 57 | H-1 58 | T-1/T-3 20/30 |
| Comparative Example 2 | G'-2 669 | B-1 112 | M-3 196 | I-1/I-2 51/53 | K-3 15 | R-1 11 | H-4 23 | T-2 5 |
| Comparative Example 3 | G'-3 350 | — 0 | M-3/M-4/M-5 94/41/96 | I-2 58 | K-2 18 | R-1 87 | H-3 48 | T-3 75 |
| Comparative Example 4 | G'-4 386 | B-1 151 | M-1/M-4/M-5 68/120/36 | I-2 201 | K-1 21 | R-1 5 | H-4 41 | T-1/T-3 10/30 |

| | Coating fluid for image-recording layer | | | | Evaluation results | | |
|---|---|---|---|---|---|---|---|
| | Sensitization agent (parts) | Surfactant (parts) | Solvent (mass ratio) | Protective layer | On-machine developability (number of pieces) | Printing resistance | On-machine development scum suppression property |
| Example 16 | C-1/C-2/C-3 25/15/30 | W-1 4 | S-1/S-2/S-3 70/15/15 | Absent | 12 | 81 | B |
| Example 17 | C-1 50.0 | — 0 | S-1/S-2/S-3 65/20/15 | Present | 13 | 84 | B |
| Example 18 | C-2 10.0 | W-1 4 | S-1/S-2/S-3 60/30/10 | Absent | 14 | 82 | A |
| Example 19 | C-3 25.0 | W-1 4 | S-1/S-2/S-3 60/30/10 | Present | 17 | 88 | A |
| Example 20 | C-1/C-2 15/15 | W-1 4 | S-1/S-2/S-3 50/20/30 | Present | 12 | 85 | B |
| Example 21 | C-2/C-3 35/40 | W-1 4 | S-1/S-2 60/40 | Present | 11 | 83 | B |
| Comparative Example 1 | — 0 | W-1 4 | S-1/S-2/S-3 60/30/10 | Absent | 25 | 40 | A |
| Comparative Example 2 | C-1/C-2/C-3 5/5/20 | W-1 6 | S-1/S-2/S-3 80/10/10 | Absent | 100 pieces or more | Cannot be evaluated | C |
| Comparative Example 3 | — 0 | — 0 | S-4/S-5 80/20 | Absent | 30 | 50 | B |
| Comparative Example 4 | C-1/C-2/C-3 5/5/5 | W-1 3 | S-1/S-2/S-3 40/40/20 | Absent | 35 | 30 | C |

From the results of Table 2 and Table 3, it is clear that the lithographic printing plate precursor according to the embodiment of the present disclosure is superior to the lithographic printing plate precursors of the comparative examples in terms of the printing resistance even in the case of using ultraviolet-curable ink. Furthermore, it is found that the lithographic printing plate precursor according to the embodiment of the present disclosure is favorable in both on-machine developability and the on-machine development scum suppression property.

In addition, the details of the respective compounds shown in Table 2 and Table 3 other than the compounds described above will be described below.

[Binder Polymer]

B-1: A compound having the following structure

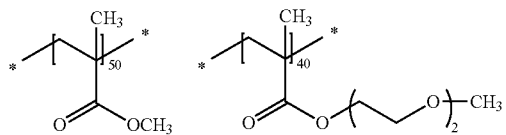

B-1

-continued

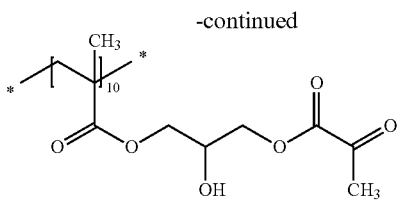

Mw = 70,000

In the formulae, the contents (suffixes on the lower right side of parentheses) of individual constituent units represent mass ratios, and a suffix on the lower right side of the parenthesis of the ethyleneoxy structure represents the number of times of repetition.

[Polymerizable Compound]

M-1: Tris(acryloyloxyethyl)isocyanurate, NK ester A-9300, manufactured by Shin-Nakamura Chemical Co., Ltd.

M-2: Dipentaerythritol pentaacrylate, SR-399, manufactured by Sartomer Japan Inc.

M-3: Dipentaerythritol hexaacrylate, A-DPH, manufactured by Shin-Nakamura Chemical Co., Ltd.

M-4: Dipentaerythritol pentaacrylate hexamethylene diisocyanate urethane prepolymer, UA-510H, manufactured by Kyoeisha Chemical Co., Ltd.

M-5: Ethoxylated pentaerythritol tetaracrylate, ATM-4E, manufactured by Shin-Nakamura Chemical Co., Ltd.

[Polymerization Initiator]
I-1 to I-3: Compounds having the following structures

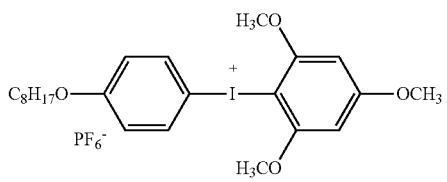

I-1

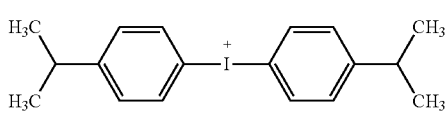

I-2

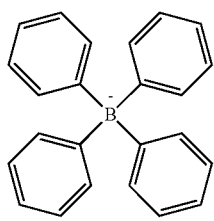

I-3

In the structures, TsO⁻ represents a tosylate anion.
[Infrared Absorber]
K-1 to K-3: Compounds having the following structure

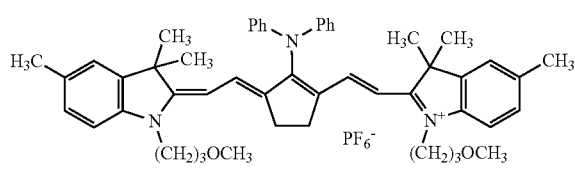

K-1

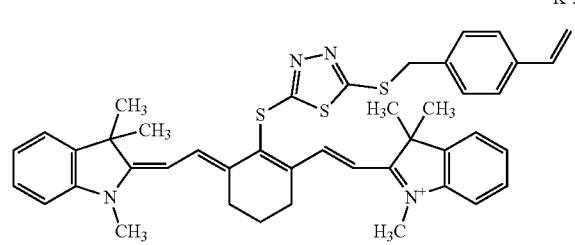

K-2

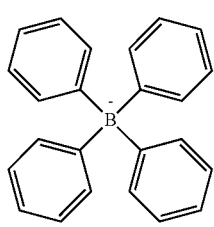

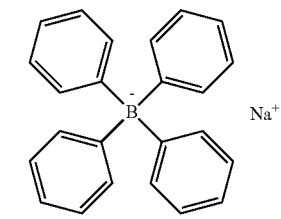

K-3

In the structures, Ph represents a phenyl group.
[Radical Production Aid]
R-1: A compound having the following structure

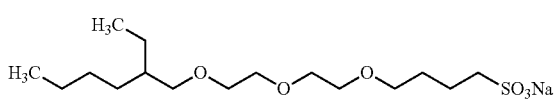

R-1

[Acid Color-Developing Agent]
H-1: S-205 (manufactured by Fukui Yamada Chemical Co., Ltd.)
H-2: GN-169 (manufactured by Yamamoto Chemicals Inc.)
H-3: Black-XV (manufactured by Yamamoto Chemicals Inc.)
H-4: Red-40 (manufactured by Yamamoto Chemicals Inc.)
(Hydrophilic Compound)
T-1: Tris(2-hydroxyethyl) isocyanurate
T-2: A compound having the following structure
T-3: Hydroxypropyl cellulose, Klucel M, manufactured by Hercules Incorporated

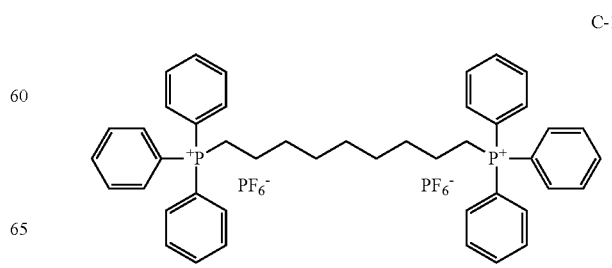

T-2

(Sensitization Agent)
C-1: A compound having the following structure
C-2: Benzyldimethyloctylammonium.PF₆ salt
C-3: A compound having the following structure

C-1

-continued

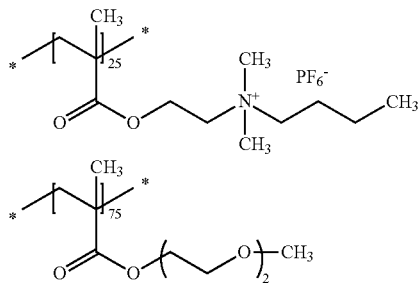

C-3

[Surfactant]
W-1: A compound having the following structure

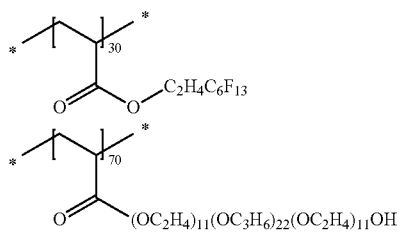

W-1

Mw = 13,000

In the structures, suffixes on the lower right side of parentheses of individual constituent units are content ratios (mass ratios).
[Solvent]
S-1: 2-Butanone (MEK)
S-2: 1-Methoxy-2-propanol (MFG)
S-3: Methanol
S-4: 1-Propanol
S-5: Distilled water Examples 22 to 41 and Comparative Examples 5 to 8

<Production of Support 2>

On a 0.3 mm-thick aluminum plate (material: JIS A 1050), individual processes of (a) to (i) below were continuously carried out, thereby carrying out a surface treatment. Meanwhile, after each process and water washing, liquid was drained using a nip roller.

(a) Alkali Etching Process

On the aluminum plate, an etching process was carried out by means of spraying using an aqueous solution having a sodium hydroxide concentration of 2.6% by mass, an aluminum ion concentration of 6.5% by mass, and a temperature of 70° C., thereby dissolving 6 g/m² of the aluminum plate. After that, the plate was washed with water by means of spraying.

(b) Desmut Process

On the aluminum plate, a desmut process was carried out by means of spraying using an aqueous solution having a temperature of 30° C. and a nitric acid concentration of 1% by mass (including 0.5% by mass of aluminum ions.) and then the plate was washed with water by means of spraying. As the nitric acid aqueous solution used in the desmut process, a waste liquid of a step of carrying out an electrochemical roughening process in a nitric acid aqueous solution using an alternating current was used.

(c) Electrochemical Roughening Process

An electrochemical roughening process was continuously carried out using an alternating current voltage of 60 Hz. An electrolytic solution was a 10.5 g/L aqueous solution of nitric acid (including 5 g/L of aluminum ions and 0.007% by mass of ammonium ions), and the liquid temperature was 50° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As the auxiliary anode, ferrite was used. The current density was 30 A/dm² in terms of the peak value of the current, and the quantity of electricity was 220 C/dm² in terms of the sum of the quantities of electricity in a case in which the aluminum plate was the positive electrode. Five percent of the current coming from the power supply was divided into the auxiliary anode. After that, the plate was washed with water by means of spraying.

(d) Alkali Etching Process

On the aluminum plate, an etching process was carried out at 32° C. by spraying an aqueous solution having a sodium hydroxide concentration of 26% by mass, an aluminum ion concentration of 6.5% by mass, 0.25 g/m² of the aluminum plate was dissolved, a smut component including, as a main body, aluminum hydroxide generated at the time of the electrochemical roughening process was removed, and, additionally, the edge portion of the generated pit was dissolved to smoothen the edge portion. After that, the plate was washed with water by means of spraying.

(e) Desmut Process

A desmut process was carried out by spraying an aqueous solution having a sulfuric acid concentration of 15% by mass of a temperature of 30° C. (including 4.5% by mass of aluminum ions) and then the plate was washed with water by means of spraying. As the nitric acid aqueous solution used in the desmut process, the waste liquid of the step of carrying out the electrochemical roughening process in the nitric acid aqueous solution using an alternating current was used.

(f) Electrochemical Roughening Process

An electrochemical roughening process was continuously carried out using an alternating current voltage of 60 Hz. An electrolytic solution was a 2.5 g/L aqueous solution of hydrochloric acid (including 5 g/L of aluminum ions), and the temperature was 35° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As the auxiliary anode, ferrite was used. The current density was 25 A/dm² in terms of the peak value of the current, and the quantity of electricity was 50 C/dm² in terms of the sum of the quantities of electricity in a case in which the aluminum plate was the positive electrode. After that, the plate was washed with water by means of spraying.

(g) Alkali Etching Process

On the aluminum plate, an etching process was carried out at 32° C. by spraying an aqueous solution having a sodium hydroxide concentration of 26% by mass, an aluminum ion concentration of 6.5% by mass, 0.1 g/m² of the aluminum plate was dissolved, a smut component including, as a main body, aluminum hydroxide generated at the time of the electrochemical roughening process was removed, and, additionally, the edge portion of the generated pit was dissolved to smoothen the edge portion. After that, the plate was washed with water by means of spraying.

(h) Anodization Process 2.5 g/m$^2$ of a direct current anodized film was formed on the aluminum plate at a current density of 15 A/dm$^2$ using a 15% by mass aqueous solution of sulfuric acid (including 0.5% by mass of aluminum ions) as an electrolytic solution, washed with water, and dried. The average pore diameter of the surface layer of the anodized film (surface-average pore diameter) was 10 nm.

The pore diameter of the surface layer of the anodized film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition process or the like for imparting conductive properties, 50 pores were randomly extracted, and the average value was obtained. The standard deviation error was ±10% or less.

(i) Hydrophilization Process

After that, in order to ensure the hydrophilicity of a non-image area, a silicate process was carried out by dipping the aluminum plate in a 2.5% by mass aqueous solution of No. 3 sodium silicate at 50° C. for seven seconds, and the aluminum plate was washed with water by means of spraying, thereby producing a support 2. The attached amount of Si was 11 mg/m2.

As a coating fluid for an undercoat layer and a coating fluid for a protective layer, the above-described coating fluid for an undercoat layer and the above-described coating fluid for a protective layer were respectively used.

<Preparation of Coating Fluid for Image-Recording Layer>

Individual components were added according to the amounts used shown in Table 4, a solvent was added thereto so that the concentration of the solid content reached 7.0% by mass, and the components were mixed together. The amounts (parts) of individual materials added in Table 4 are the amounts of solid contents.

Meanwhile, a coating fluid for an image-recording layer including a polymer particle was prepared by mixing and stirring a photosensitive liquid containing components shown in Table 4 other than the polymer particle in a mixed state and a polymer particle dispersion liquid immediately before the application so as to obtain a composition shown in Table 4.

An expression such as "M-4/M-5 146/78" in Table 4 indicates that 146 parts of a compound M-4 and 78 parts by a compound M-5 are included.

<Production of Lithographic Printing Plate Precursors>

Lithographic printing plate precursors of Examples 22 to 41 and Comparative Examples 5 to 8 were respectively produced using the following method.

The coating fluid for an undercoat layer having the above-described composition was applied onto the support 2 so that the dried coating amount reached 20 mg/m$^2$, thereby forming an undercoat layer. Each coating fluid for an image-recording layer shown in Table 4 was applied onto the undercoat layer by means of bar coating and dried in an oven at 120° C. for 40 seconds, thereby forming an image-recording layer having a dried coating amount of 1.0 g/m$^2$.

The coating fluid for the image-recording layer was prepared by mixing and stirring the polymer particle immediately before the application.

As necessary, the coating fluid for a protective layer having the above-described composition was applied onto the image-recording layer by means of bar coating and dried in an oven at 120° C. for 60 seconds, thereby forming a protective layer having a dried coating amount of 0.15 g/m$^2$.

Examples in which the protective layer was formed have an expression of "Present" in the "Protective layer" column in Table 4.

<Evaluation of Lithographic Printing Plate Precursors>

The lithographic printing plate precursors produced as described above were exposed (to an equivalent irradiation energy of 110 mJ/cm$^2$) using Magnus 800 Quantum equipped with an infrared semiconductor laser manufactured by Kodak Japan Ltd. under conditions of an output of 27 W, an external surface drum rotation speed of 450 rpm, and a resolution of 2,400 dpi (dots per inch, 1 inch is equal to 2.54 cm). Exposed images were provided with a solid image and an amplitude modulation screen (AM screen) 3% halftone dot chart.

(1) Developability

[Development Process]

A development process was carried out on the exposed lithographic printing plates using Clean Out Unit+C85 manufactured by Glunz & Jensen at a transportation rate of 60 cm/min and 25° C., thereby producing lithographic printing plates. In the development process, a developer having the following composition was used. This developer is a developer capable of carrying out the removal of the protective layer, development, and gum pulling with a single liquid.

<Developer>

PELEX NBL (sodium alkyl naphthalene sulfonate, anionic surfactant manufactured by KAO Corporation):
7.8 parts by mass NEWCOL B13 (polyoxyethylene aryl ether, nonionic surfactant manufactured by Nippon Nyukazai Co., Ltd.): 2.0 parts by mass SURFYNOL 2502 (manufactured by Air Products and Chemicals, Inc.):
0.6 parts by mass Benzyl alcohol (manufactured by Wako Pure Chemical Corporation):
0.8 parts by mass Sodium gluconate (manufactured by Fuso Chemical Co., Ltd.):
3.0 parts by mass Sodium hydrogen phosphate (manufactured by Wako Pure Chemical Corporation):
0.3 parts by mass Sodium hydrogen carbonate (manufactured by Wako Pure Chemical Corporation):
0.3 parts by mass Defoamer (SILCOLAPSE 432 manufactured by Bluester Silicones):
0.01 parts by mass Water: 85.49 parts by mass (pH: 8.6)

The concentration in a non-exposed portion after the development process was measured. Regarding the measurement of the concentration, the cyan concentration was measured using a spectrophotometer (SpectroEye manufactured by X-Rite, Incorporated). The difference (AD) between the obtained value of the cyan concentration and the value of the cyan concentration of the support 2 on which the application was not carried out was computed, and the developability was evaluated as A to C. As AD decreases, the area of the image-recording layer remaining in the non-image area after the development process becomes smaller, and the developability is more favorable.

A: $\Delta D \leq 0.01$
B: $0.01 < \Delta \leq 50.03$
C: $0.03 < \Delta D$ (2) Printing Resistance The lithographic printing plate obtained by the development process was attached to a cylinder of a medium octavo paper-size printer SX-74 manufactured by Heidelberger Druckmaschinen AG without being developed. To the present printer, a 100 L-capacity dampening water circulation tank having a non-woven fabric filter and a temperature control device was connected. Dampening water (80 L) containing 2.0% of dampening water S-Z1 (manufactured by Fujifilm Corporation) was prepared in a circulation device, T&K UV OFS K-HS black GE-M (manufactured by T&K TOKA Co., Ltd.) was used as printing ink, dampening water and ink were supplied using a standard automatic printing start method, and then printing was carried out on 500 pieces of TOKUBISHI art paper (76.5 kg) at a printing rate of 10,000 pieces per hour. As the number of pieces of printed paper increased, the image area gradually wore, and thus the ink density on printed matters decreased. The number of pieces of paper printed until the value of the halftone dot area ratio of AM screen 3% halftone dots on a printed matter measured using a gretag density meter (manufactured by GretagMacbeth) decreased to be 1% lower than the measurement value obtained from the $500^{th}$ piece of printed paper was used as the number of pieces of completely printed paper to evaluate the printing resistance. The printing resistance was evaluated using relative printing resistance for which the value obtained in a case in which the number of pieces of printed paper reached 50,000 was considered as 100. As the numerical value increase, the printing resistance becomes more favorable. The evaluation results are shown in Table 4. In Table 4, an expression of "Cannot be evaluated" indicates that the development of the lithographic printing plate precursor was not possible and the evaluation of the printing resistance was not possible.

Relative printing resistance=(number of pieces of printed paper of subject lithographic printing plate precursor)/50,000×100

TABLE 4

| | | | Coating fluid for image-recording layer | | | | |
|---|---|---|---|---|---|---|---|
| | Polymer particle (parts) | Binder polymer (parts) | Polymerizable compound (parts) | Polymerization initiator (parts) | Infrared absorber (parts) | Radical production aid (parts) | Coloring agent (parts) |
| Example 22 | G-1 468 | B-1 179 | M-4/M-5 146/78 | I-1 132 | K-3 58 | R-1 57 | S-1 20 |
| Example 23 | G-2 453 | B-1 156 | M-1/64-2 123/101 | I-1 135 | K-1 50 | R-1 49 | S-1 20 |
| Example 24 | G-3 453 | B-1 156 | M-1/M-2 123/101 | I-1 135 | K-1 50 | R-1 49 | S-1 20 |
| Example 25 | G-4 556 | B-1 181 | M-2/M-3/M-4 77/75/69 | I-1 125 | K-1 53 | R-1 51 | S-1 20 |
| Example 26 | G-5 556 | B-1 181 | M-2/M-3/M-4 77/75/69 | I-1 125 | K-1 53 | R-1 51 | S-1 20 |
| Example 27 | G-6 556 | B-1 181 | M-2/M-3/M-4 77/75/69 | I-1 125 | K-1 53 | R-1 51 | S-1 20 |
| Example 28 | G-7 350 | — 0 | M-3/M-4/M-5 94/41/96 | I-2 58 | K-2 18 | R-1 87 | S-1 20 |
| Example 29 | G-8 489 | B-1 163 | M-1/M-5 88/103 | I-3 125 | K-3 49 | R-1 60 | S-1 20 |
| Example 30 | G-9 489 | B-1 163 | M-1/M-5 88/103 | I-3 125 | K-3 49 | R-1 60 | S-1 20 |
| Example 31 | G-10 489 | B-1 163 | M-1/M-5 88/103 | I-3 125 | K-3 49 | R-1 60 | S-1 20 |
| Example 32 | G-11 489 | B-1 163 | M-1/M-5 88/103 | I-3 125 | K-3 49 | R-1 60 | S-1 20 |
| Example 33 | G-12 386 | B-1 151 | M-1/M-4/M-5 68/120/36 | I-2 201 | K-1 21 | R-1 5 | S-1 20 |
| Example 34 | G-13 241 | B-1 213 | M-1 213 | I-1 151 | K-1/K-2 25/25 | R-1 9 | S-1 20 |
| Example 35 | G-14 190 | B-1 165 | M-2 253 | I-2 178 | K-2 89 | — 0.0 | S-1 20 |
| Example 36 | G-15 669 | B-1 112 | M-3 196 | I-1/I-2 51/53 | K-3 15 | R-1 11 | S-1 20 |
| Example 37 | G-16 742 | B-1 98 | M-4 140 | I-1 133 | K-2/K-3 51/53 | R-1 20 | S-1 20 |
| Example 38 | G-17 480 | B-1 123 | M-2/M-3 88/88 | I-2 141 | K-2 20 | R-1 17 | S-1 20 |
| Example 39 | G-18 520 | B-1 256 | M-5 98 | I-1/I-3 22/101 | K-1 23 | R-1 33 | S-1 20 |
| Example 40 | G-19 563 | B-1 169 | M-3/M-4 75/126 | I-1 89 | K-1 68 | R-1 41 | S-1 20 |
| Example 41 | G-21 458 | B-1 181 | M-1/M-2/M-3 67/67/67 | I-1 163 | K-3 22 | R-1 12 | S-1 20 |
| Comparative Example 5 | G'-1 468 | B-1 179 | M-1/M-5 146/78 | I-1 132 | K-3 58 | R-1 57 | S-1 20 |
| Comparative | G'-2 | B-1 | M-3 | I-1/I-2 | K-3 | R-1 | S-1 |

TABLE 4-continued

| | | | | | | | |
|---|---|---|---|---|---|---|---|
| Example 6 | 669 | 112 | 196 | 51/53 | 15 | 11 | 20 |
| Comparative Example 7 | G'-3 350 | — 0 | M-3/M-4/M-5 94/41/96 | I-2 58 | K-2 18 | R-1 87 | S-1 20 |
| Comparative Example 8 | G'-4 386 | B-1 151 | M-1/M-4/M-5 68/120/36 | I-2 201 | K-1 21 | R-1 5 | S-1 20 |

| | Coating fluid for image-recording layer | | | | | Evaluation results | |
|---|---|---|---|---|---|---|---|
| | Hydrophilic compound (parts) | Sensitization agent (parts) | Surfactant (parts) | Solvent (mass ratio) | Protective layer | Developability | Printing resistance |
| Example 22 | T-1/T-3 20/30 | — 0 | W-1 4 | S-1/S-2/S-3 60/30/10 | Absent | A | 85 |
| Example 23 | T-1 20 | C-1/C-2/C-3 25/23/30 | W-1 4 | S-1/S-2/S-3 50/40/10 | Present | A | 82 |
| Example 24 | T-1 20 | C-1/C-2/C-3 25/23/30 | W-1 4 | S-1/S-2/S-3 50/40/10 | Present | A | 74 |
| Example 25 | T-1/T-3 15/30 | C-1/C-3 27/27 | W-1 4 | S-1/S-2/S-3 55/30/15 | Present | A | 80 |
| Example 26 | T-1/T-3 15/30 | C-1/C-3 27/27 | W-1 4 | S-1/S-2/S-3 55/30/15 | Present | A | 76 |
| Example 27 | T-1/T-3 15/30 | C-1/C-3 27/27 | W-1 4 | S-1/S-2/S-3 55/30/15 | Present | A | 72 |
| Example 28 | T-3 75 | — 0 | — 0 | S-4/S-5 80/20 | Absent | A | 73 |
| Example 29 | T-1/T-2/T-3 10/10/10 | C-1/C-2/C-3 15/13/25 | W-1 4 | S-1/S-2/S-3 70/20/10 | Present | A | 83 |
| Example 30 | T-1/T-2/T-3 10/10/10 | C-1/C-2/C-3 15/13/25 | W-1 4 | S-1/S-2/S-3 70/20/10 | Present | A | 78 |
| Example 31 | T-1/T-2/T-3 10/10/10 | C-1/C-2/C-3 15/13/25 | W-1 4 | S-1/S-2/S-3 70/20/10 | Present | A | 75 |
| Example 32 | T-1/T-2/T-3 10/10/10 | C-1/C-2/C-3 15/13/25 | W-1 4 | S-1/S-2/S-3 70/20/10 | Present | A | 71 |
| Example 33 | T-1/T-3 10/30 | C-1/C-2/C-3 5/5/5 | W-1 3 | S-1/S-2/S-3 40/40/20 | Absent | A | 68 |
| Example 34 | T-1/T-3 10/25 | — 0 | W-1 2 | S-1/S-2/S-3 40/30/30 | Present | A | 81 |
| Example 35 | T-1/T-3 20/20 | C-1/C-2/C-3 1/1/1 | W-1 5 | S-1/S-3 80/20 | Absent | A | 67 |
| Example 36 | T-2 5 | C-1/C-2/C-3 5/5/20 | W-1 6 | S-1/S-2/S-3 80/10/10 | Absent | A | 77 |
| Example 37 | T-1/T-2/T-3 5/5/5 | C-1/C-2/C-3 20/15/30 | W-1 4 | S-1/S-2/S-3 70/15/15 | Absent | A | 76 |
| Example 38 | T-2/T-3 45/45 | C-1 50.0 | — 0 | S-1/S-2/S-3 65/20/15 | Present | A | 79 |
| Example 39 | T-3 20 | C-2 10.0 | W-1 4 | S-1/S-2/S-3 60/30/10 | Absent | A | 77 |
| Example 40 | — 0 | C-3 25.0 | W-1 4 | S-1/S-2/S-3 60/30/10 | Present | A | 83 |
| Example 41 | T-3 25 | C-2/C-3 35/40 | W-1 4 | S-1/S-2 60/40 | Present | A | 78 |
| Comparative Example 5 | T-1/T-3 20/30 | — 0 | W-1 4 | S-1/S-2/S-3 60/30/10 | Absent | A | 35 |
| Comparative Example 6 | T-2 5 | C-1/C-2/C-3 5/5/5 | W-1 6 | S-1/S-2/S-3 80/10/10 | Absent | C | Cannot be evaluated |
| Comparative Example 7 | T-3 75 | — 0 | — 0 | S-4/S-5 80/20 | Absent | B | 45 |
| Comparative Example 8 | T-1/T-3 10/30 | C-1/C-2/C-3 5/5/5 | W-1 3 | S-1/S-2/S-3 40/40/20 | Absent | B | 25 |

From the results of Table 4, it is clear that the lithographic printing plate precursor according to the embodiment of the present disclosure is superior to the lithographic printing plate precursors of the comparative examples in terms of the printing resistance even in the case of using ultraviolet-curable ink. Furthermore, it is found that the lithographic printing plate precursor according to the embodiment of the present disclosure is favorable in terms of developability.

In addition, the details of the respective compounds shown in Table 4 other than the compounds described above will be described below.

[Coloring Agent]

S-1 (the Following Structure)

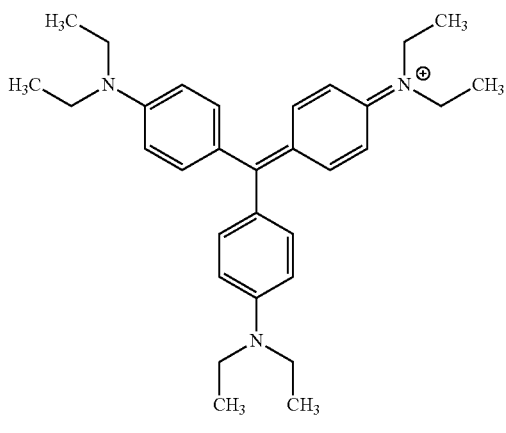

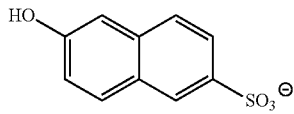

The disclosure of JP2017-108002 filed on May 31, 2017 and the disclosure of JP2017-210126 filed on Oct. 31, 2017 are all incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

What is claimed is:

1. A lithographic printing plate precursor comprising:
   an image-recording layer on a hydrophilic support,
   wherein the image-recording layer includes a polymer particle including an addition polymerization resin having a hydrophilic structure and a crosslinking structure, an infrared absorber, a polymerization initiator, a polymerizable compound, and a radical production aid,
   the crosslinking structure is a constituent unit formed by the polymerization of a polyfunctional ethylenically unsaturated compound, and
   the addition polymerization resin has a constituent unit represented by Formula A-4 as a constituent unit having the hydrophilic structure,

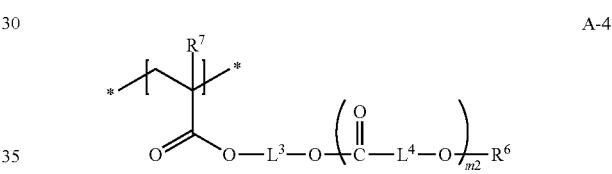

in Formula A-4, $L^3$ represents an alkylene group having 2 to 10 carbon atoms, $L^4$ represents an alkylene group having 1 to 10 carbon atoms, $R^6$ represents a hydrogen atom, an alkyl group, or an aryl group, $R^7$ represents a hydrogen atom or a methyl group, m2 represents an integer of 2 to 20, and * represents a bonding position with other structures.

2. The lithographic printing plate precursor according to claim 1,
   wherein the crosslinking structure includes at least one constituent unit selected from the group consisting of constituent units represented by BR-1 to BR-16,

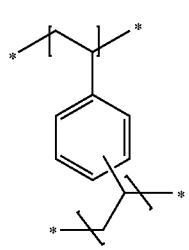

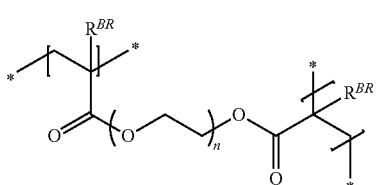

-continued
BR-3
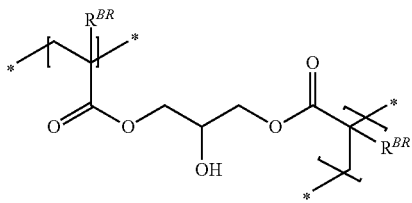
BR-4
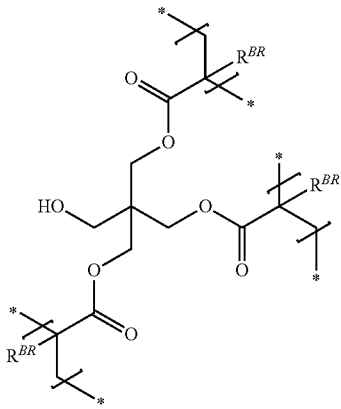
BR-5
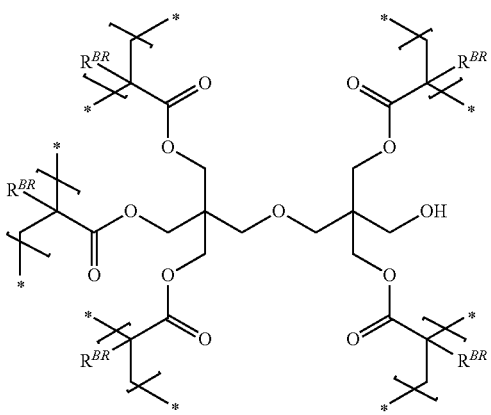
BR-6
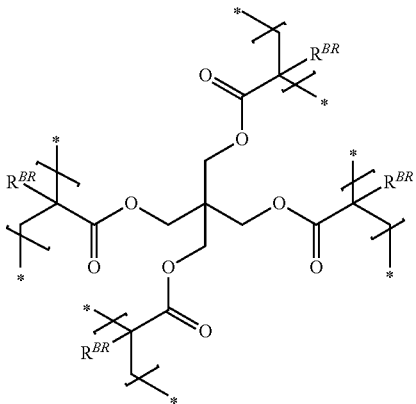
BR-7
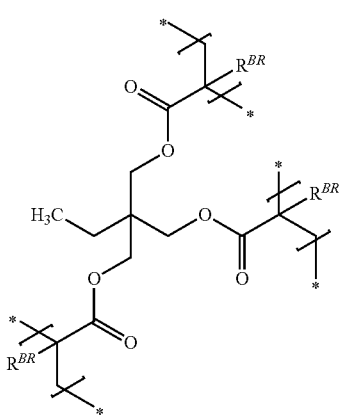
BR-8
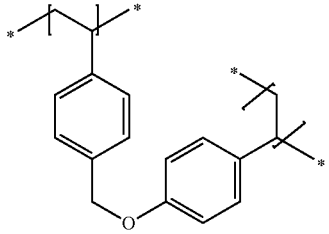
BR-9
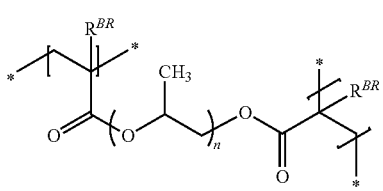
BR-10
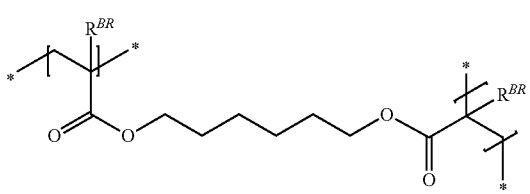

-continued
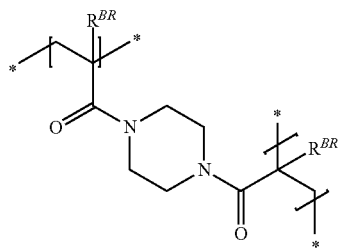
BR-11
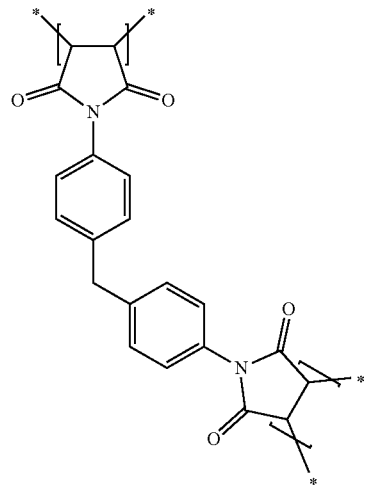
BR-12
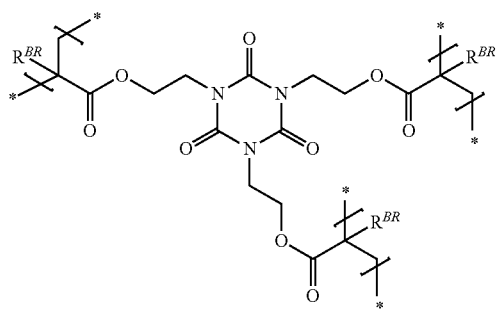
BR-13
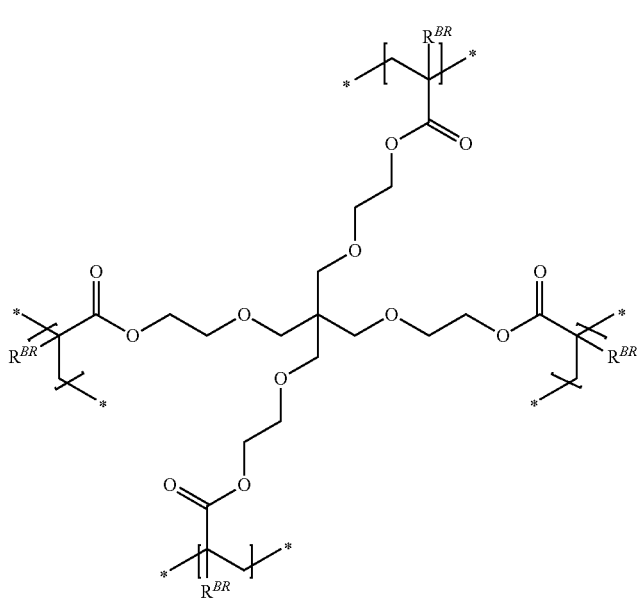
BR-14

-continued

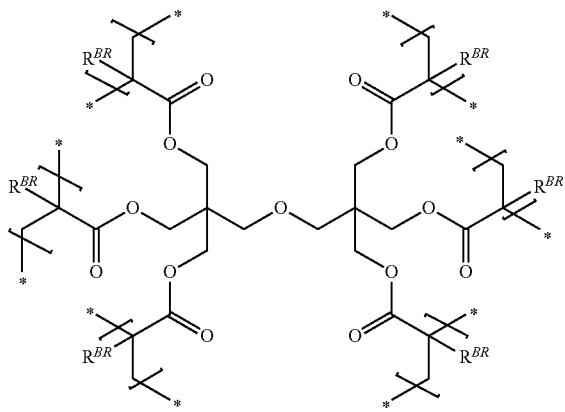
BR-15

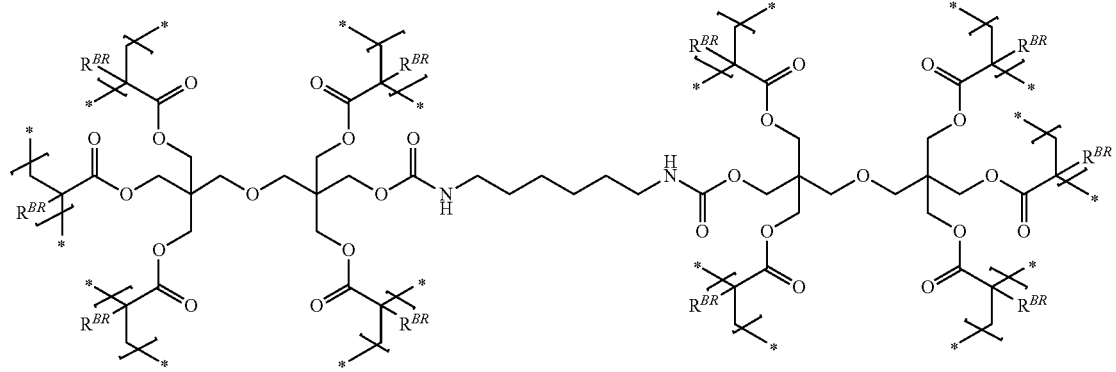
BR-16 in the structure, $R^{BR}$ each independently represent a hydrogen atom or a methyl group, n represents an integer of 1 to 20, and * represents a bonding position with other structures.

3. The lithographic printing plate precursor according to claim 1,
wherein the image-recording layer further includes a binder polymer.

4. The lithographic printing plate precursor according to claim 1, further comprising:
a protective layer on the image-recording layer.

5. The lithographic printing plate precursor according to claim 4,
wherein the protective layer includes an inorganic lamellar compound.

6. The lithographic printing plate precursor according to claim 1,
wherein a non-exposed portion of the image-recording layer can be removed by at least any of dampening water or printing ink.

7. A method for producing a lithographic printing plate comprising:
exposing the lithographic printing plate precursor according to claim 1 in an image shape and forming an exposed portion and a non-exposed portion; and
removing the non-exposed portion by supplying at least one of printing ink or dampening water.

8. A method for producing a lithographic printing plate comprising:
exposing the lithographic printing plate precursor according to claim 1 in an image shape and forming an exposed portion and a non-exposed portion; and
removing the non-exposed portion by supplying a developer having a pH of 2 or higher and 11 or lower.

9. The lithographic printing plate precursor according to claim 1, wherein the crosslinking structure is a difunctional to quinquedecafunctional branched unit.

10. A lithographic printing plate precursor comprising:
an image-recording layer on a hydrophilic support,
wherein the image-recording layer includes a polymer particle including an addition polymerization resin having a hydrophilic structure and a crosslinking structure, an infrared absorber, a polymerization initiator, a polymerizable compound, and a radical production aid,
the crosslinking structure is a constituent unit formed by the polymerization of a polyfunctional ethylenically unsaturated compound,
the addition polymerization resin has a constituent unit represented by Formula A-3 or Formula A-4 as a constituent unit having the hydrophilic structure,

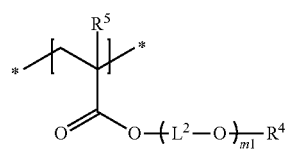
A-3

A-4

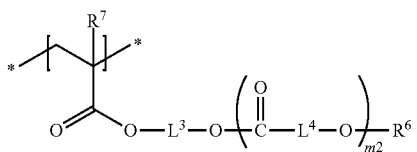

in Formula A-3 and Formula A-4, $L^2$ represents an ethylene group or a propylene group, $L^3$ represents an alkylene group having 2 to 10 carbon atoms, $L^4$ represents an alkylene group having 1 to 10 carbon atoms, $R^4$ and $R^6$ each independently represents a hydrogen atom, an alkyl group, or an aryl group, $R^5$ and $R^7$ each independently represents a hydrogen atom or a methyl group, m1 represents an integer of 2 to 200, m2 represents an integer of 2 to 20, and * represents a bonding position with other structures, and the crosslinking structure includes at least one constituent unit selected from the group consisting of constituent units represented by BR-1 to BR-16,

BR-1

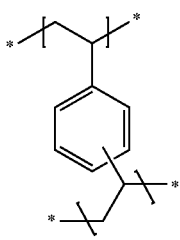

BR-2

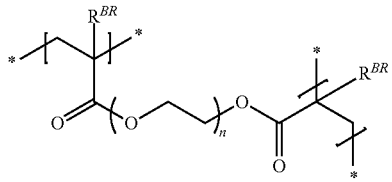

BR-3

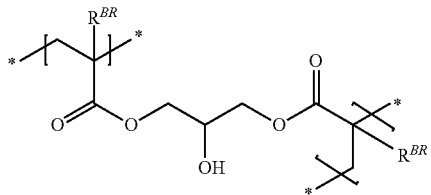

BR-4

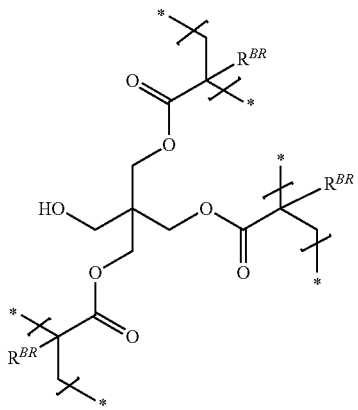

-continued
BR-5
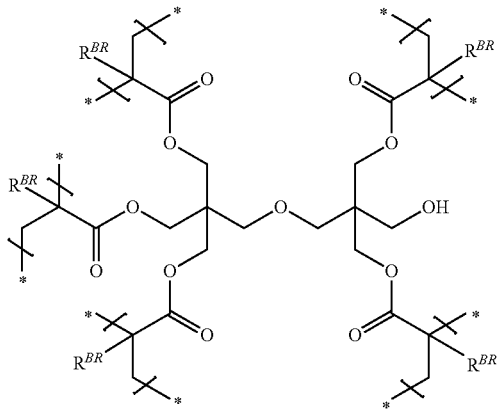
BR-6
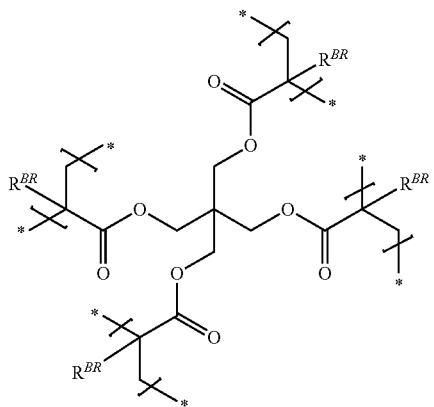
BR-7
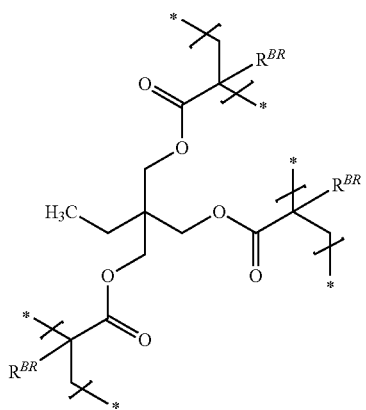
BR-8
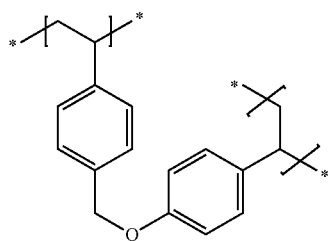

-continued
BR-9
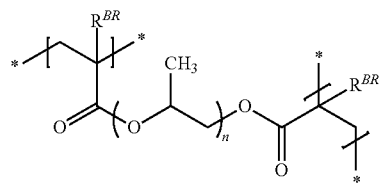
BR-10
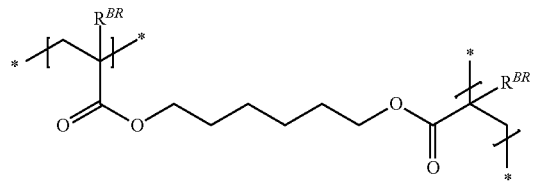
Br-11
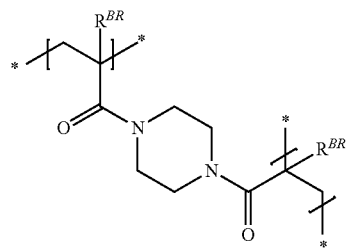
Br-12
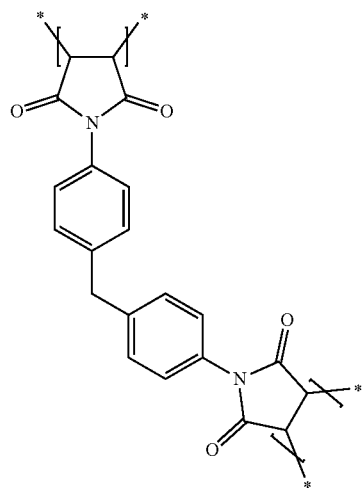
Br-13
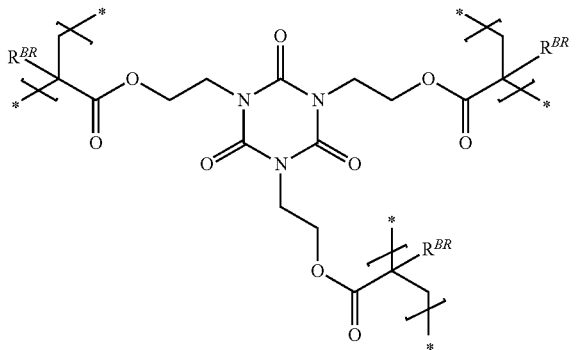

-continued

Br-14

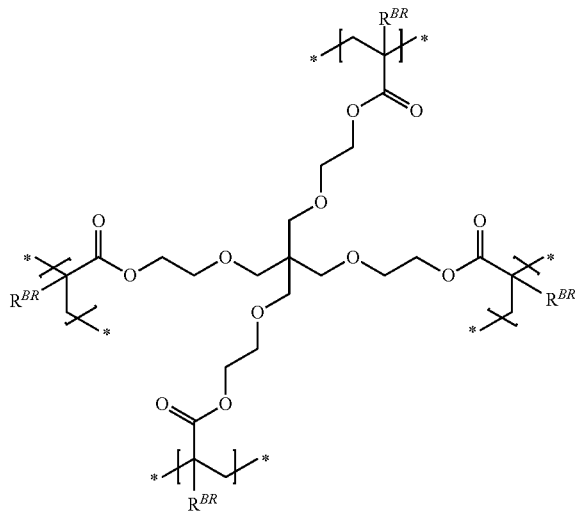

Br-15

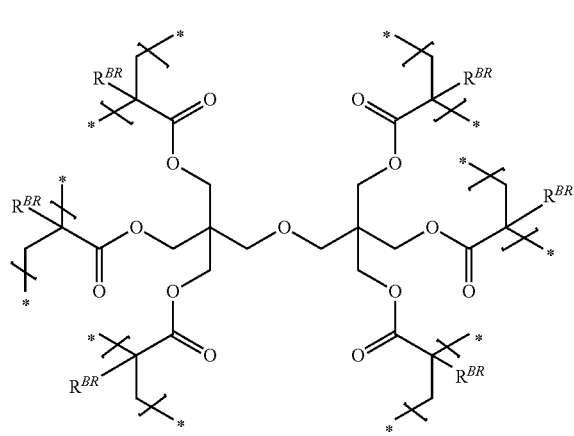

BR-16

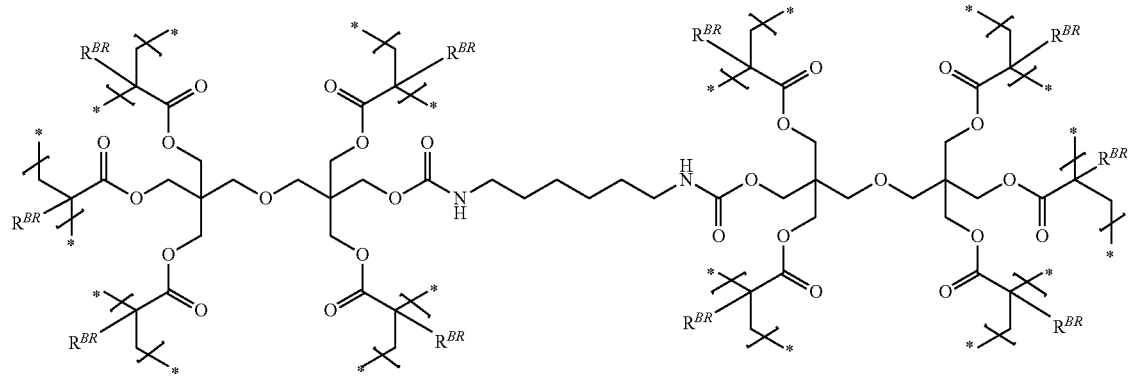

in BR-1 to BR-16, $R^{BR}$ each independently represent a hydrogen atom or a methyl group, n represents an integer of 1 to 20, and * represents a bonding position with other structures.

11. The lithographic printing plate precursor according to claim 10, wherein the image-recording layer further includes a binder polymer.

12. The lithographic printing plate precursor according to claim 10, further comprising:
a protective layer on the image-recording layer.

13. The lithographic printing plate precursor according to claim 12, wherein the protective layer includes an inorganic lamellar compound.

14. The lithographic printing plate precursor according to claim 10, wherein a non-exposed portion of the image-recording layer can be removed by at least any of dampening water or printing ink.

15. A method for producing a lithographic printing plate comprising:
- exposing the lithographic printing plate precursor according to claim 10 in an image shape and forming an exposed portion and a non-exposed portion; and
- removing the non-exposed portion by supplying at least one of printing ink or dampening water.

16. A method for producing a lithographic printing plate comprising:
- exposing the lithographic printing plate precursor according to claim 10 in an image shape and forming an exposed portion and a non-exposed portion; and
- removing the non-exposed portion by supplying a developer having a pH of 2 or higher and 11 or lower.

* * * * *